(12) United States Patent
Ikeda et al.

(10) Patent No.: US 7,898,339 B2
(45) Date of Patent: Mar. 1, 2011

(54) AMPLIFIER CIRCUIT

(75) Inventors: Masato Ikeda, Tokyo (JP); Tokio Miyashita, Kanagawa-ken (JP)

(73) Assignees: Kabushiki Kaisha Nihon Micronics, Tokyo (JP); NES Co., Ltd, Saitama-ken (JP)

( * ) Notice: Subject to any disclaimer, the term of this patent is extended or adjusted under 35 U.S.C. 154(b) by 68 days.

(21) Appl. No.: 12/465,974

(22) Filed: May 14, 2009

(65) Prior Publication Data

US 2009/0295480 A1  Dec. 3, 2009

(30) Foreign Application Priority Data

May 28, 2008 (JP) ................................ 2008-140088

(51) Int. Cl.
*H03F 3/04* (2006.01)
(52) U.S. Cl. ........................................ 330/296; 330/285
(58) Field of Classification Search .................. 330/285, 330/296, 311, 310, 150, 98
See application file for complete search history.

(56) References Cited

U.S. PATENT DOCUMENTS

| | | | | |
|---|---|---|---|---|
| 7,151,410 B2 * | 12/2006 | Franck et al. | ................. | 330/264 |
| 7,541,875 B2 * | 6/2009 | Taylor et al. | ................. | 330/311 |
| 7,551,036 B2 * | 6/2009 | Berroth et al. | ................ | 330/311 |
| 7,629,851 B2 * | 12/2009 | Tsurumaki et al. | ........... | 330/285 |

FOREIGN PATENT DOCUMENTS

JP  2007-248202  9/2007

* cited by examiner

*Primary Examiner* — Henry K Choe
(74) *Attorney, Agent, or Firm* — Turocy & Watson, LLP

(57) ABSTRACT

An amplifier circuit with favorable linearity is provided. An amplifier of the present invention is provided with an amplifier MOS transistor, a diode-connected transistor block for negative feedback source impedance constituted by series-parallel connection of the limited number (including 0) of the diode-connected MOS transistors and connected to a source side of the amplifier MOS transistor, and a diode-connected transistor block for load constituted by series-parallel connection of the limited number of the diode-connected MOS transistors and connected to a drain side of the amplifier MOS transistor. A voltage gain is configured to be determined by a ratio of the sum of source impedance of the amplifier MOS transistor and the impedance of the diode-connected transistor block for negative feedback source impedance to the impedance of the diode-connected transistor block for load.

7 Claims, 33 Drawing Sheets

FULL-WAVE RECTIFIER CIRCUIT $Vdd - Vop = Vdd - Von$
$= Vb1o - Vee$
$Vip1 - Vo1 = Vin1 - Vo1$
$= Vb1 - Vb1o$

AMPLIFIER CIRCUIT

CROSS-REFERENCE TO RELATED APPLICATION

This application claims, under 35 USC 119, priority of Japanese Application No. 2008-140088 filed May 28, 2008.

BACKGROUND OF THE INVENTION

1. Technical Field

The present invention relates to an amplifier circuit that can be applied to a sensor circuit on a sensor substrate used for inspection of a substrate for display such as a glass substrate of a liquid crystal display panel, for example.

2. Description of the Related Art

Background Art

The substrate for display is, for example, a multiple-piece glass substrate provided with a plurality of substrate regions for display, each of which is divided into a liquid crystal display panel, on one face. As shown in FIG. 39, each substrate region 10 for display has a large number of pixel regions (that is, cell regions) provided with a pixel electrode 12 in a rectangular shape and a switching element 14 connected to the pixel electrode 12 in a matrix state.

Each pixel electrode 12 is a thin-film state electrode parallel with the substrate 10 for display and has a rectangular plane shape having substantially the same size as that of a corresponding pixel region, for example. Each switching element 14 is a field effect thin film transistor (TFT) having a source electrode, a drain electrode and a gate electrode, for example, and the drain electrode (or the source electrode) is connected to the corresponding pixel electrode 12. The gate electrode of the switching element 14 aligned in the X direction is connected to a common gate wiring 16, while the source electrode (or the drain electrode) of the switching element 14 aligned in the Y direction is connected to a common wiring 18.

By turning on the switching elements 14 of the applicable row by voltage control of the gate wiring 16 and applying a high-frequency signal for test to the wiring 18 so as to charge and discharge the pixel electrode 12 of the applicable row and the like, disconnection of the switching element 14, the gate wiring 16, and the wiring 18 can be detected. The pixel electrodes 12 are arranged adjacently in 7168 pieces in (one row of) the X direction, for example, and inspection for disconnection and the like is conducted for each row. One row in the X direction has a length of 25 cm and some, for example.

Japanese Patent Laid-Open No. 2007-248202 describes a method of inspection by opposing a sensor substrate to a row of the pixel electrode 12 to be inspected in a non-contact manner.

On the sensor substrate, sensor electrodes to be opposed to the pixel electrodes 12 on a one-on-one manner are aligned with a pitch similar to the array of the pixel electrodes 12 in the X direction. At an approximate distance where the pixel electrode 12 and the corresponding sensor electrode are electromagnetically coupled, the sensor substrate is brought close to the row of the pixel electrode 12 to be inspected, a signal radiated from the pixel electrode 12 (the above-mentioned high-frequency signal for test) is picked up by the sensor electrode and amplified through an amplifier circuit for sensing (See FIG. 8 in Japanese Patent Laid-Open No. 2007-248202) and then, presence of the signal and the like is checked by a tester portion for inspection.

By intermittently and relatively moving the substrate for display and the sensor substrate, each row of the pixel electrodes 12 is sequentially inspected.

For example, since the pixel electrodes 12 are arranged adjacently in 7168 pieces for the length of 25 cm and some as mentioned above, it is necessary to install 7168 pieces of the amplifier circuits for sensing formed on the sensor substrate for the length of only 25 cm and some, for example. Therefore, it is practical that the amplifier circuit for sensing is constituted by SOG (polysilicon), and it is required that the amplifier circuit has high input impedance since it has a micro capacitor coupling input, amplification characteristics (gain, output bias and the like) are not varied even in the case of a power supply voltage drop due to characteristic variation of the element or a long power supply line resistance of 25 cm and some since a large number can be arranged adjacently, and an actual circuit area when being made into an IC is small and the like, and use of a source grounding amplifier circuit as shown in FIG. 40 in each amplifier circuit has been examined, for example.

In FIG. 40, a grounded-source amplifier circuit 20 is configured such that a source resistance for negative feedback Rs is connected between a source of an amplifier MOS transistor M1 connecting the gate to an input terminal Vi of the grounded-source amplifier circuit 20 and a negative power supply Vee, a load resistance RL is connected between a drain of the MOS transistor M1 and a positive power supply Vdd, and a drain connection end of the amplifier MOS transistor M1 of the load resistance RL is constituted as an output terminal Vo of the grounded-source amplifier circuit 20. An input terminal Vi of the grounded-source amplifier circuit 20 is connected to an output Vso of a signal source 22. FIG. 40 shows a signal source 22 in an equivalent circuit, regarding a signal picked up by the above-mentioned sensor electrode as a signal from the signal source 22. The signal source 22 is configured such that an input direct-current bias power supply Vidc and an input alternating current signal source Vs are connected in series, and one end of the series circuit is connected to a ground, while the other end is made as the signal source output Vso. Any of the positive power supply Vdd, the negative power supply Vee, and the input direct-current bias power supply Vidc of the signal source 22 may be connected to OV (that is, the ground).

In the grounded-source amplifier circuit 20, since the gate of the MOS transistor M1 is the input terminal Vi of the grounded-source amplifier circuit 20, an electric current does not flow into the input terminal Vi.

On the other hand, a direct current with a value obtained by dividing a difference of direct-current potential between the input terminal Vi and the negative power supply Vee by the sum of a direct-current source resistance of the MOS transistor M1 and the source resistance for negative feedback Rs flows into the source and the drain of the MOS transistor M1, and an alternating current (signal current) with a value obtained by dividing a voltage of the input alternating current signal source Vs by the sum of an alternating current source impedance of the MOS transistor M1 and the source resistance for negative feedback Rs flows into the source and the drain of the MOS transistor M1.

Then, the product of the drain alternating current (output signal current) and the load resistance RL becomes an output voltage.

As mentioned above, a voltage gain A when the input impedance of a subsequent-stage circuit connected to the output Vo of the grounded-source amplifier circuit 20 is infinite is expressed by an expression (1), supposing that the alternating source impedance of the MOS transistor M1 is RM1s:

$$A = RL/(RM1s + Rs) \quad (1)$$

In the case of RM1s≈Rs, a variation of the source impedance RM1s of the amplifier MOS transistor M1 directly leads to a variation in the gain.

Here, if RM1s is sufficiently smaller than Rs, an expression (2) is true, but RM1s can not be ignored in general and is handled by the expression (1).

$$A \approx RL/Rs \quad (2)$$

SUMMARY OF INVENTION

Technical Problem

However, since the source impedance RM1s of the amplifier MOS transistor M1 and the resistances Rs, RL are changed independently, the voltage gain expressed by the expression (1) of the related art grounded-source amplifier 20 varies even if a resistance ratio in the circuits aligned by making them into an IC and the like.

Also, supposing that an operating current is I, the source impedance RM1s of the amplifier MOS transistor M1 is changed by 1/√I, and the load resistance RL and the source resistance for negative feedback Rs are changed by 1/I. Therefore, in order to allow the source impedance RM1s to be ignored so as to determine the voltage gain by a ratio between the load resistance RL and the source resistance for negative feedback Rs, the operating current I should be made small.

If the operating current I is made small and the load resistance RL and the source resistance for negative feedback Rs are made large, a time constant of the resistances Rs, RL and a capacity between the drain and the gate of the amplifier MOS transistor Ml becomes large, and a high frequency characteristic as the amplifier circuit is deteriorated Also, a large resistance increases a chip area when being made into an IC.

Therefore, realization of an amplifier circuit that is operated by an operating current that can ensure a high frequency characteristic of the amplifier circuit, in which a variation in the source impedance of the transistor for amplification (variation in threshold voltage of the transistor for amplification) does not affect the variation of the voltage gain and which has a favorable linearity is in demand.

The sensor substrate requires parallel connection of a large number of related art grounded-source amplifier circuits 20 between the same power supply lines. In this case, a power supply voltage of the grounded-source amplifier circuit 20 located at a position away from a power supply electrode by the current of the power supply line and the resistance of the power supply line drops, and the voltage gain of the grounded-source amplifier circuit 20 at such a position is fluctuated.

Therefore, realization of an amplifier circuit whose voltage gain is not changed even if such power supply voltage drop occurs and which has a favorable linearity is in demand.

An existing SOG process does not have a resistance creation process, and if the grounded-source amplifier circuit 20 including a resistance element is to be applied to an amplifier circuit for sensing, there is a need to add a resistance creation process, which increases the numbers of masks and processes as well as a cost.

Therefore, realization of an amplifier circuit which can be constituted not using a resistance element and has a favorable linearity is in demand.

Solution to Problem

An amplifier circuit of a first aspect of the present invention comprises: (1) an amplifier unipolar transistor having a gate as an input terminal of the amplifier circuit; (2) a diode-connected transistor block for negative feedback source impedance connected to a source side of the amplifier unipolar transistor, constituted by series-parallel connection of the limited number (including 0 piece) of the diode-connected unipolar transistors in which a gate and a drain are connected to each other so as to make between the drain and the source into a diode; (3) a diode-connected transistor block for load connected to the drain side of the amplifier unipolar transistor constituted by series-parallel connection of the limited number of the diode-connected unipolar transistors in which the gate and drain are connected to each other so as to make between the drain and the source into a diode; and (4) a voltage output terminal connected to the drain side end of the amplifier unipolar transistor of the diode-connected transistor block for load, (5) configured such that the voltage gain is determined by a ratio between impedance of the sum of the source impedance of the amplifier unipolar transistor and the impedance of the diode-connected transistor block for negative feedback source impedance and the impedance of the diode-connected transistor block for load.

An amplifier circuit of a second aspect of the present invention comprises: (1) first and second differential amplifier unipolar transistors having one of gates as a positive-phase input terminal of the amplifier circuit and the other gate as a negative-phase input terminal of the amplifier circuit; (2) an absorbing constant current source making a source current sum of the first and second differential amplifier unipolar transistors as constant current; (3) first and second diode-connected transistor blocks for negative feedback source impedance connected to source sides of the first and second differential amplifier unipolar transistors, constituted by series-parallel connection of the limited number (including 0 piece) of the diode-connected transistors in which a gate and a drain are connected to each other so as to make between the drain and the source into a diode; (4) first and second diode-connected transistor blocks for load connected to drain sides of the first and second differential amplifier unipolar transistors, constituted by series-parallel connection of the limited number of the diode-connected transistors in which a gate and a drain are connected to each other so as to make between the drain and the source into a diode; and (5) a positive-phase output terminal as one of drain side ends of the first and second differential amplifier unipolar transistors of the first and second diode-connected transistor blocks for load and a negative-phase output terminal as the other, configured such that (6) the voltage gain is determined by a ratio between impedance of each sum of each source impedance of the first and second differential amplifier unipolar transistors and each impedance of the first and second diode-connected transistor blocks for negative feedback source impedance and each impedance of the first and second diode-connected transistor blocks for load.

An amplifier circuit of a third aspect of the present invention comprises: (1) a differential amplification portion having (1-1) first and second differential amplifier unipolar transistors having one of gates as a positive-phase input terminal of the amplifier circuit and the other gate as a negative-phase input terminal of the amplifier circuit; (1-2) first and second source resistances for negative feedback connected to source sides of the first and second differential amplifier unipolar transistors; (1-3) first and second load resistances connected to drain sides of the first and second differential amplifier unipolar transistors; and (1-4) a positive-phase output terminal as one of the drain side ends of the first and second differential amplifier unipolar transistors and a negative-phase output terminal as the other in the first and second load resistances; (2) an addition circuit having first and second source follower unipolar transistors whose gates are connected to each of the positive-phase output terminal and the negative-phase output terminal; (3) an absorbing constant current source which makes a source current sum of the first and second differential amplifier unipolar transistors a constant current; and (4) a power-supply level shift diode-connected transistor which shifts a power supply level to the differential amplification portion, wherein (5) a function to compensate an output direct current bias voltage to a variation of a threshold voltage of the unipolar transistor of the differential amplification portion and the addition circuit is added to the absorbing constant current source and the power-supply level shift diode-connected transistor.

Advantageous Effects of Invention

According to the present invention, a high input impedance is ensured, and a variation in the amplification gain of the amplifier circuit and a variation in the output direct-current bias voltage due to a variation in the threshold value of the unipolar transistor and a power-supply line resistance supply voltage drop can be reduced, and an actual circuit area can be made small when it is made into an IC.

DESCRIPTION OF THE REFERRED EMBODIMENTS (A) First Embodiment

A first embodiment of an amplifier circuit according to the present invention will be described referring to the attached drawings. The amplifier circuit of the first embodiment is a grounded-source amplifier circuit and can be applied to a sensor circuit on the above-mentioned sensor substrate, for example.

(A-1) Configuration of the First Embodiment

Figure 1:
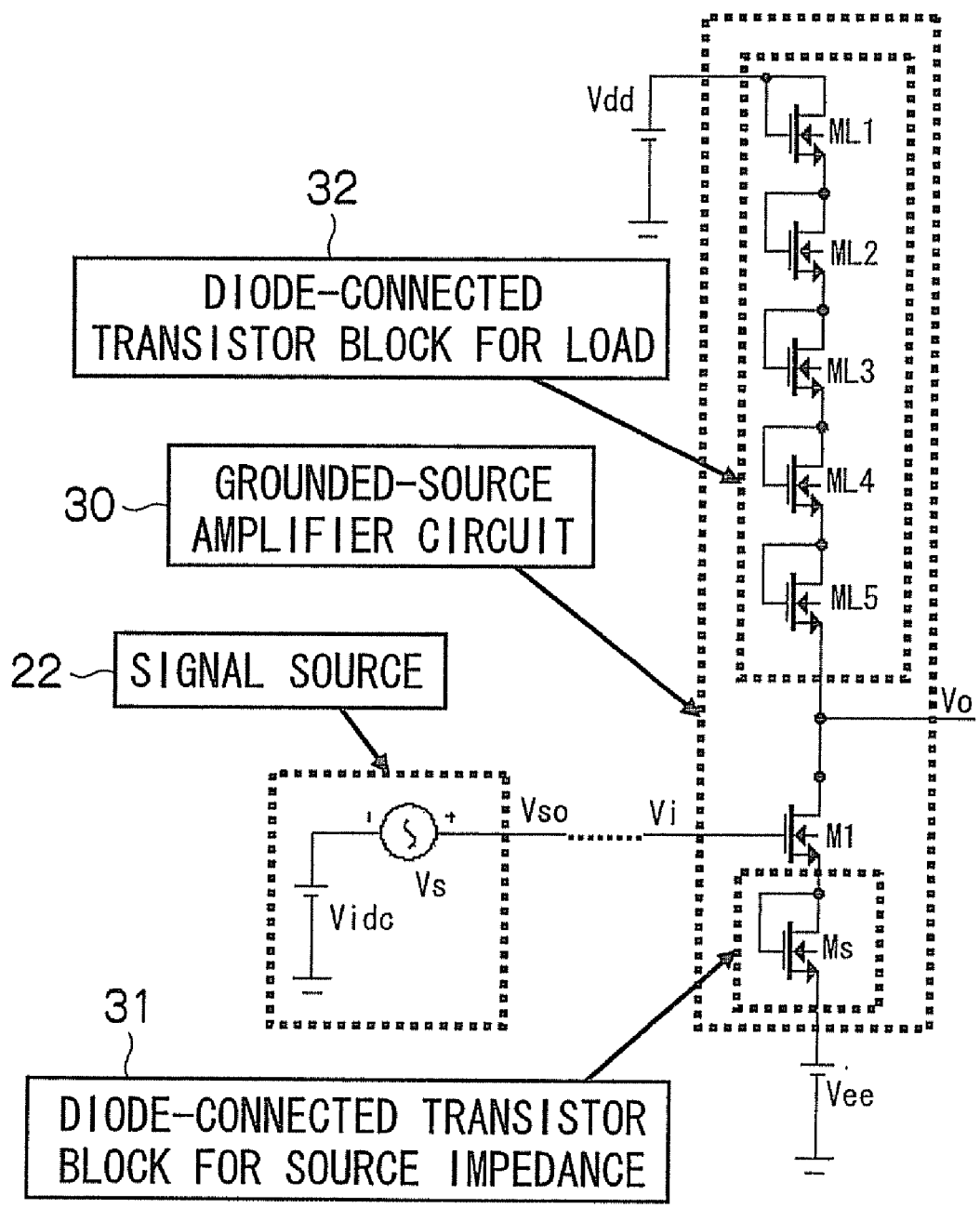
FIG. 1 is a circuit diagram illustrating a configuration of a grounded-source amplifier circuit according to a first embodiment.

FIG. 1 is a circuit diagram illustrating a configuration of the grounded-source amplifier circuit according to the first embodiment, and the same or corresponding reference numerals are given to the same or corresponding portions in the described drawings.

In FIG. 1, a grounded-source amplifier circuit 30 of the first embodiment has an amplifier MOS transistor M1, a diode-connected transistor block for negative feedback source impedance (hereinafter referred to as diode-connected transistor block for source impedance) 31, and a diode-connected transistor block for load 32.

Figure 40:
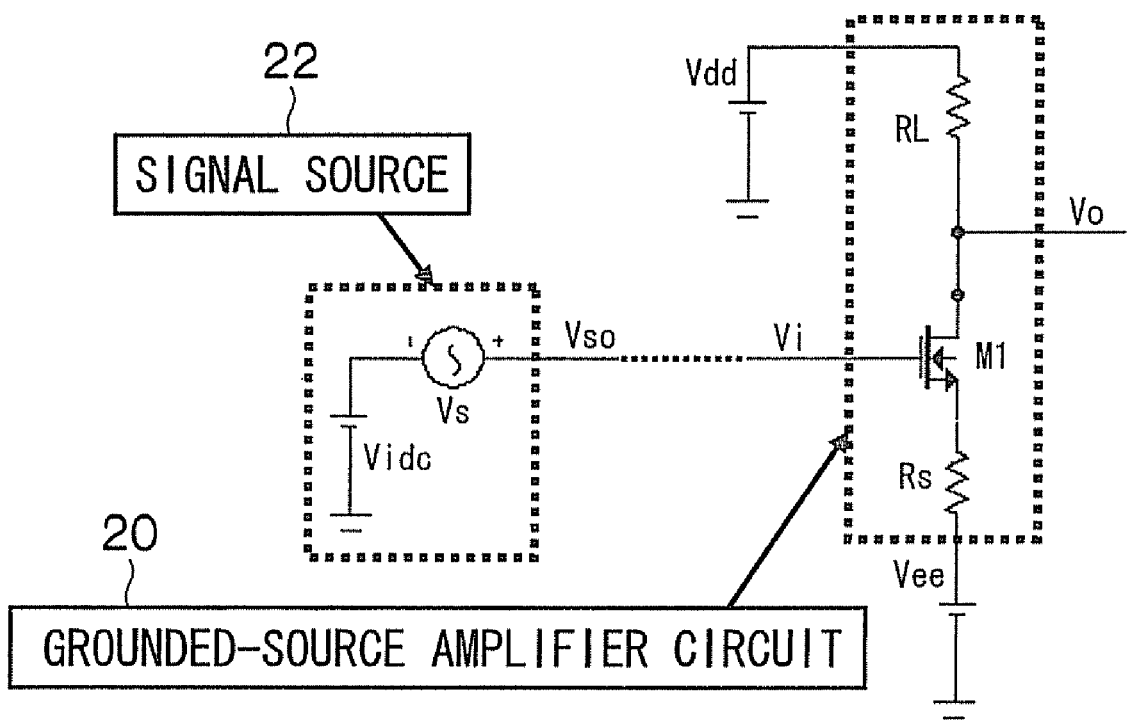
FIG. 40 is a circuit diagram illustrating a configuration of a related art grounded-source amplifier circuit.

The diode-connected transistor block for source impedance 31 is provided instead of source resistance for negative feedback Rs in a related art grounded-source amplifier circuit (See FIG. 40). The diode-connected transistor block for source impedance 31 has the limited number (including 0 pieces) of the diode-connected transistors connected in series in which a gate and the drain are connected so as to make between a drain and a source into a diode. In FIG. 1, only one diode-connected transistor is shown, but in the case of two or more, they may be connected in series or may be connected in parallel or moreover, a plurality of series circuits are formed and the series circuits may be connected in parallel or still more, a plurality of parallel circuits are formed and the parallel circuits may be connected in series, and a connecting method of a plurality of diode-connected transistors is arbitrary, and such an arbitrary connecting method is called "series-parallel connection" in this description.

The diode-connected transistor block for load 32 is provided instead of a load resistance RL in the related art grounded-source amplifier circuit (See FIG. 40). The diode-connected transistor block for load 32 is constituted by series-parallel connection of the limited number of the diode-connected transistors in which the gate and the drain are connected so as to make between the drain and the source into a diode.

FIG. 1 shows, as the diode-connected transistor block for source impedance 31, one diode-connected transistor Ms is connected between the source of the amplifier MOS transistor M1 and a negative power supply Vee and shows, as the diode-connected transistor block for load 32, five diode-connected transistors ML1 to ML5 connected in series between the drain of the amplifier MOS transistor M1 and a positive power supply Vdd.

A drain connection end of the amplifier MOS transistor M1 of the diode-connected transistor block for load 32 is made as an output terminal Vo of the grounded-source amplifier circuit of the first embodiment.

(A-2) Operation of the First Embodiment

In the grounded-source amplifier circuit 30 of the first embodiment, the diode-connected transistor block for source impedance 31 is provided instead of the source resistance for negative feedback Rs in the related art grounded-source amplifier circuit (See FIG. 40), and the diode-connected transistor block for load 32 is provided instead of the load resistance RL in the related art grounded-source amplifier circuit, and since a basic operation of the grounded-source amplifier circuit 30 of the first embodiment is similar to the operation of the related art grounded-source amplifier circuit, the description will be omitted.

Gain characteristics can be calculated by replacing the source resistance for negative feedback Rs in the above-mentioned expression (1) by the impedance of the diode-connected transistor block for negative feedback source impedance 31 and by replacing the load resistance RL by the impedance of the diode-connected transistor block for load 32.

With regard to a voltage gain A at infinite input resistance of a subsequent-stage circuit connected to the output of the grounded-source amplifier circuit 30 of the first embodiment, an expression (3) is obtained by replacing parameters in the above-mentioned expression (1), supposing that the source impedance of the amplifier MOS transistor M1 is RM1s, the impedance of one diode-connected transistor in the diode-connected transistor block for source impedance 31 is RMs, the number of series-connected transistors in the diode-connected transistor block for source impedance 31 is m (=1), the impedance of one diode-connected transistor in the diode-connected transistor block for load 32 is RML, and the number of series-connected transistors in the diode-connected transistor block for load 32 is n (=5).

$$A = RML \times n / (RM1s + RMs \times m) \quad (3)$$

Here, if a gate width and a gate length of the amplifier MOS transistor M1 and the transistors (Ms, ML1 to ML5) constituting the diode-connected transistor block for source impedance 31 and the diode-connected transistor block for load 32 are made the same, the result is RML=RMs≈RM1s, and an expression (4) is obtained from the expression (3):

$$A \approx n/(1+m) \quad (4)$$

It is known from the expression (4) that the voltage gain A becomes larger than 1 and generates a voltage amplification operation when n>(1+m). If the diode-connected transistor block for source impedance 31 and the diode-connected transistor block for load 32 are constituted by series circuits of the diode-connected transistor, respectively, it is known that the voltage gain A can be regulated by selection of the numbers of series-connected pieces m, n.

Under a condition that each of the above-mentioned transistor sizes is the same, a ratio of a potential difference between the positive power supply Vdd and a direct current bias voltage of the output Vo of the grounded-source amplifier circuit 30 to the potential difference between an input direct current bias power supply Vidc included in an input voltage Vi of the grounded-source amplifier circuit 30 and the negative power supply Vee becomes the same as the expression (4), and if the voltage of the input direct current bias power supply Vidc is not fluctuated, the direct current bias voltage of the output Vo of the grounded-source amplifier circuit is not fluctuated even if a threshold voltage Vt of the MOS transistor (Ms, ML1 to ML5) is fluctuated.

In general, supposing that the gate width of the MOS transistor is W, the gate length is L, a voltage between the gate and the source is Vgs, and the threshold voltage is Vt and a proportional constant k is put, a drain current I in saturated operation is expressed by an expression (5) (**2 stands for second power).

$$I \approx (kW/L) \times (Vgs - Vt)^{**}2 \quad (5)$$

By partially differentiating the expression (5) with respect to Vgs, a transfer conductance Gm is acquired. An inverse number of the transfer conductance Gm is source impedance.

Supposing that the gate width of the amplifier MOS transistor M1 is Ws1, the gate length is Ls1 and a new proportional constant K is put, the source impedance RM1s of the amplifier MOS transistor M1 is expressed by an expression (6).

$$RM1s \approx (K/\sqrt{I}) \times \sqrt{(Ls1/Ws1)} \qquad (6)$$

If the gate and drain of the amplifier MOS transistor M1 are connected so as to be made into a diode, a value calculated by the expression (6) becomes a diode impedance.

Similarly, the diode impedance RMs of the MOS transistor Ms in the diode-connected transistor block for source impedance 31 is expressed by an expression (7), supposing that the gate width of this MOS transistor Ms is Ws and the gate length is Ls. Also, similarly, the diode impedance RML of the transistors ML1 to ML5 in the diode-connected transistor block for load 32 is expressed by an expression (8), supposing that the gate width of each of the MOS transistors ML1 to ML5 is WL and the gate length is LL.

$$RMs \approx (K/\sqrt{I}) \times \sqrt{(Ls/Ws)} \qquad (7)$$

$$RML \approx (K/\sqrt{I}) \times \sqrt{(LL/WL)} \qquad (8)$$

By assigning the results of the expressions (6) to (8) to the expression (3), the term of $(K/\sqrt{I})$ disappears and an expression (9) is obtained, and it is known that the gain A is not affected by the threshold voltage Vt or bias current of each MOS transistor but becomes a ratio between the gate size and the number of each MOS transistor.

$$A = n \times \sqrt{(LL/WL)} / (\sqrt{(Ls1/Ws1)} + m \times \sqrt{(Ls/Ws)}) \qquad (9)$$

For example, in the case of an reverse-phase output amplifier using an op amp, a negative feedback resistance for determining a gain lowers the input impedance as an amplifier circuit, but in the grounded-source amplifier circuit 30 of the first embodiment, since the input impedance is a gate input impedance of the MOS transistor M1, the input impedance as the amplifier circuit can be maintained at a high impedance.

Since the above-mentioned diode impedance is a value at saturated operation of each MOS transistor, the expressions (3) to (9) hold all the time at each moment of an alternating current signal input operation within an operation range that can be regarded that each MOS transistor is in the saturated operation, and linearity is ensured and waveform distortion does not occur.

Also, if the diode voltage of the diode-connected transistor block for source impedance 31 and the diode-connected transistor block for load 32 is taken large, a fluctuation of an operating current I to the fluctuation of the threshold voltage Vt of each MOS transistor becomes small, and an output voltage range in which the above linearity is ensured is expanded.

Moreover, the size of each MOS transistor is made equal so that the gain A is determined by the expression (4), a ratio of the potential difference between the voltage of the direct current bias power supply Vidc included in the input signal source and the negative power supply Vee to the potential difference between the positive power supply Vdd and the direct current bias of the output voltage Vo becomes equal, and even if the threshold voltage Vt of the transistor is fluctuated, the direct current bias of the output voltage Vo is not fluctuated.

In the case of application to the above-mentioned sensor substrate, only an alternating signal is taken into the input terminal Vi in the form of micro capacity coupling from the sensor, a direct current bias is supplied from the positive input direct current bias power supply Vidc to the input terminal Vi through a high resistance (MOS resistance, for example) for operation (a format in FIG. 27, which will be described, is applied, for example).

(A-3) Effect of the First Embodiment

According to the grounded-source amplifier circuit 30 of the first embodiment, the following effects (a) to (i) can be exerted.

(a) The gain is not affected by the threshold voltage Vt or MOS transistor operating current of each MOS transistor, and a grounded-source amplifier circuit determined by a ratio between the gate size and the number of transistors of each MOS transistor can be realized.

If the grounded-source amplifier circuit is applied to an amplifier circuit for sensing formed on the sensor substrate on which 7168 pieces are provided adjacently in the length of only 25 cm or some, for example, even if the grounded-source amplifier circuit is produced in the same process of making it into IC, there is a fear that the threshold voltage Vt of the MOS transistor might be slightly different depending on a position on the sensor substrate. However, since the gain is not affected by the threshold voltage Vt of each MOS transistor and the like, the gains of the amplifier circuits for sensing provided adjacently can be aligned.

(b) Since the input impedance is a gate input impedance of the MOS transistor, the input impedance as the amplifier circuit can be maintained at high impedance.

(c) Though the diode impedance is used, the linearity is ensured and waveform distortion does not occur within an operation range that can be regarded that each MOS transistor is in the saturated operation.

(d) If the structures of the MOS transistors for load and for source impedance are aligned, a ratio between the load impedance and the source-side impedance is not changed from a low frequency to a high frequency, and a flat gain characteristic can be obtained from the low frequency to the high frequency.

(e) Since a loop negative feedback circuit from output to input such as an op amp circuit is not needed, there is no fear of oscillation.

(f) Since the loop negative feedback circuit from output to input is not needed, a bias voltage of an input portion and a bias voltage of an output portion can be set to free values.

(g) Since the circuit is constituted by a single N-type (or P-type) MOS transistor and a resistance element is not used therein, a transistor producing process and a resistance producing process of either of the P-type (or N-type) are not needed when it is made into IC, and manufacturing costs and delivery periods can be reduced.

(h) Since a resistance element requiring an area larger than that of the MOS transistor is not used, the area can be made small (size reduction) as compared with a related art grounded-source amplifier circuit using the resistance element when it is made into IC.

(i) By making the gate width and the gate length of the amplifier MOS transistor M1 and the transistor constituting the diode-connected transistor block for source impedance 31 and the diode-connected transistor block for load 32 equal to each other and by setting a fixed value (no fluctuation) to the positive power supply Vdd, the input direct current bias power supply Vidc included in the input voltage Vi of the grounded-source amplifier circuit 30, and the negative power supply Vee, a grounded-source amplifier circuit in which the direct current bias voltage of the output Vo is not fluctuated can be realized even if the threshold voltage Vt of the MOS transistor is fluctuated.

Figure 2:
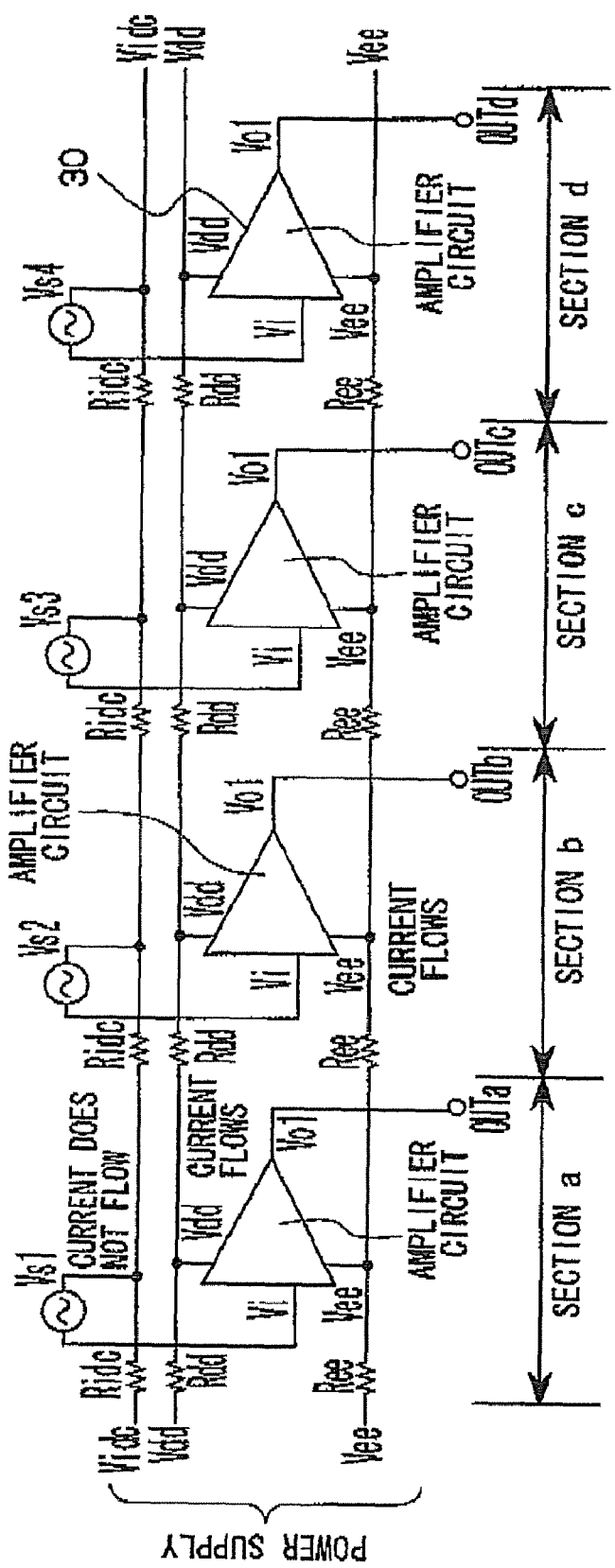
FIG. 2 is a block diagram illustrating a case in which the grounded-source amplifier circuit according to the first embodiment is connected in multiple stages.

If the grounded-source amplifier circuit 30 of the first embodiment configured such that a ratio of the potential difference between the positive power supply terminal and the output terminal Vo of each grounded-source amplifier circuit 30 to the potential difference between the input terminal Vi and the negative power supply terminal is determined by a ratio between the number of transistors of each transistor block and the size thereof is, as schematically shown in FIG. 2, connected in multi stages in parallel between a positive power supply Vdd line and a negative power supply Vee line, and a ratio between a power supply line resistance from the positive power supply terminal of each grounded-source amplifier circuit 30 to the positive power supply Vdd connection terminal and the power supply line resistance from the negative power supply terminal of each grounded-source amplifier circuit 30 to the negative power supply Vee connection terminal is made to match the ratio between the above-mentioned number of transistors of the transistor block and the size thereof (the ratio of power supply line length/power supply line width is made to match), since a current flowing to the drain of the MOS transistor M1 of the grounded-source amplifier circuit (current from the positive power supply Vdd) is equal to the current flowing to the source (current flowing to the negative power supply Vee), a ratio between the power supply line voltage drop from the positive power supply Vdd connection terminal to the positive power supply terminal of each grounded-source amplifier circuit 30 and the power supply line voltage drop from the negative power supply terminal of each grounded-source amplifier circuit 30 to the negative power supply Vee connection terminal becomes equal to the above-mentioned ratio between the number of transistors and the size, and as a result, a ratio between the voltage drop from the positive power supply Vdd connection terminal to the output terminal Vo of each grounded-source amplifier circuit 30 and the voltage drop from the input terminal Vi of each grounded-source amplifier circuit 30 (connected to the positive input direct current bias power supply Vidc) to the negative power supply Vee connection terminal becomes equal to the above-mentioned ratio of the number of transistors and the size. Since the input terminal Vi is a gate of the MOS transistor M1 and the direct current bias current does not flow through a positive input direct current bias power supply Vidc supply source line, the potential of the input terminal vi of the each grounded-source amplifier circuit 30 connected to the power supply line is constant and as a result, the potential of the output terminal Vo of each grounded-source amplifier circuit 30 is kept constant.

By connecting a power supply capacity between an appropriate position of each power supply line intermediate portion and a ground so that each power supply line resistance does not affect the alternating current gain, the voltage gain and the output bias voltage are aligned.

(B) Second Embodiment

A second embodiment of the amplifier circuit according to the present invention will be described below referring to the attached drawings. The amplifier circuit of the second embodiment is also a grounded-source amplifier circuit.

Figure 3:
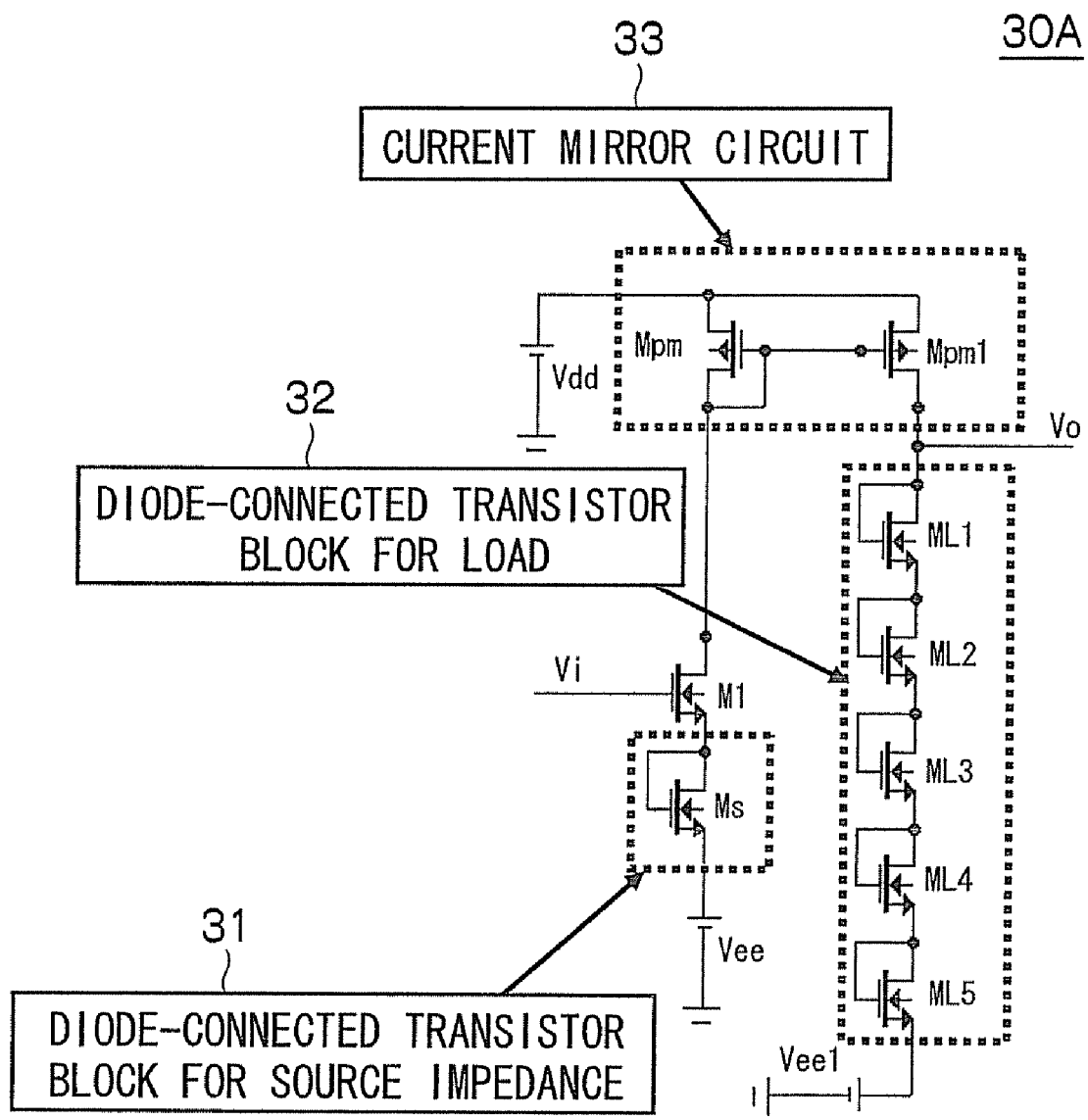
FIG. 3 is a circuit diagram illustrating a configuration of a grounded-source amplifier circuit according to a second embodiment.

FIG. 3 is a circuit diagram illustrating a configuration of the grounded-source amplifier circuit according to the second embodiment, and the same or corresponding reference numerals are given to the same or corresponding portions in the described drawings.

In FIG. 3, a grounded-source amplifier circuit 30A according to the second embodiment is configured such that connection of the drain of the amplifier MOS transistor M1 in the grounded-source amplifier circuit 30 according to the above-mentioned first embodiment with the output terminal Vo and the connection with the diode-connected transistor block for load 32 are cancelled, a P-channel current mirror circuit 33 for connecting a common terminal to the positive power supply Vdd is added, the drain of the amplifier MOS transistor M1 is connected to an input of the current mirror circuit 33, the diode-connected transistor block for load 32 is connected between the output of the current mirror circuit 33 and a second negative power supply Vee1, and a connection end of the diode-connected transistor block for load 32 to the current mirror circuit 33 is made as the output terminal Vo of the grounded-source amplifier circuit 30A.

A specific configuration of the P-channel current mirror circuit 33 is arbitrary, but FIG. 3 shows an example. The current mirror circuit 33 is configured such that each source of a P-channel current mirror current reference MOS transistor Mpm and a P-channel current mirror current output MOS transistor Mpm1 are connected to be made as a common terminal, a drain and a gate of the P-channel current mirror current reference MOS transistor Mpm are connected to be made as an input terminal of the P-channel current mirror circuit 33, and the drain of the P-channel current mirror current output MOS transistor Mpm1 having the gate connected to the input terminal thereof is made as an output terminal of the current mirror circuit 33.

In the grounded-source amplifier circuit 30A according to the second embodiment, a drain output current of the amplifier MOS transistor M1 is folded back in a direction of the second negative power supply Vee1 in the current mirror circuit 33 so as to change a direct current bias potential of the output terminal Vo of the grounded-source amplifier circuit 30A and also to reverse polarity of an alternating current signal of the output terminal Vo.

In the grounded-source amplifier circuit 30A according to the second embodiment, current amplification is possible by the P-channel current mirror circuit 33, and supposing that a current multiplication is k, the diode impedance RML of each of the MOS transistors ML1 to ML5 in the diode-connected transistor block for load 32 becomes $1/\sqrt{k}$, and with the current multiplication k, the gain A becomes $\sqrt{k}$ times. That is, the gain A of the grounded-source amplifier circuit 30A according to the second embodiment can be expressed not by the above-mentioned expression (9) but by an expression (10).

$$A = \sqrt{k} \times n \times \sqrt{(LL/WL)} / (\sqrt{(Ls1/Ws1)} + m \times \sqrt{(Ls/Ws)}) \quad (10)$$

With the grounded-source amplifier circuit 30A according to the second embodiment, too, the effect similar to that of the grounded-source amplifier circuit 30 according to the first embodiment can be exerted.

(C) Third Embodiment

A third embodiment of the amplifier circuit according to the present invention will be described below referring to the attached drawings.

Figure 4:
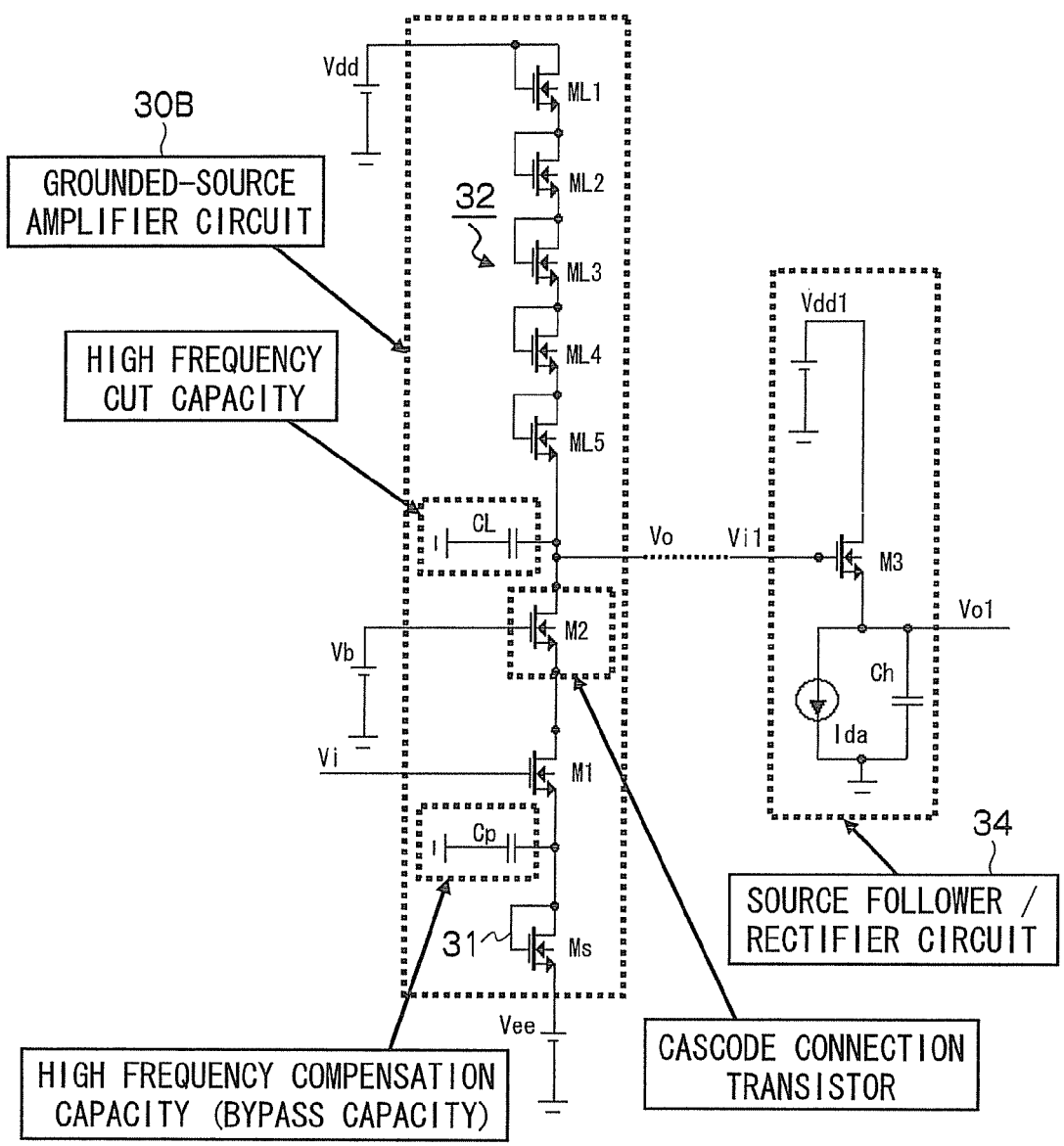
FIG. 4 is a circuit diagram illustrating a configuration of an amplifier circuit according to a third embodiment.

FIG. 4 a circuit diagram illustrating a configuration of the amplifier circuit according to the third embodiment, and the same or corresponding reference numerals are given to the same or corresponding portions in the described drawings.

In FIG. 4, in the amplifier circuit of the third embodiment, a source follower/rectifier circuit 34 functioning as a source follower circuit or a rectifier circuit is added to a grounded-source amplifier circuit 30B. The source follower/rectifier circuit 34 functioning as a source follower circuit or a rectifier circuit may be added to the grounded-source amplifier circuit 30 of the first embodiment or the grounded-source amplifier circuit 30A of the second embodiment.

The grounded-source amplifier circuit 30B of the third embodiment has the following difference from the grounded-source amplifier circuit 30 of the first embodiment.

In the grounded-source amplifier circuit 30B of the third embodiment, the connection in the grounded-source amplifier circuit 30 of the first embodiment between the drain of the amplifier MOS transistor M1 and the output terminal Vo is cancelled, the output terminal Vo is connected to the drain of a cascade (Cascode=Cascade Triode) connection MOS transistor M2, the gate of the cascode connection MOS transistor M2 is connected to a cascode gate bias power supply Vb and the source of the cascode connection MOS transistor M2 is connected to the drain of the amplifier MOS transistor M1, a high frequency compensation capacity element (hereinafter referred to as high frequency compensation capacity) Cp (including capacity 0) is connected between the source and the ground of the amplifier MOS transistor M1, and the high frequency cut capacity element (hereinafter referred to as high frequency cut capacity) CL (including capacity 0) is connected between the output terminal Vo and the ground.

Here, the high frequency compensation capacity Cp may be connected to a terminal of any of the diode-connected transistors in the diode-connected transistor block for source impedance 31 other than the above-mentioned connection points, and similarly, the high frequency cut capacity CL may be connected to a terminal of any of the diode-connected transistors in the diode-connected transistor block for load 32. The high frequency compensation characteristics and high frequency cut characteristics are changed depending on the connection position and capacity value of the capacity.

An operation of the grounded-source amplifier circuit 30B of the third embodiment is basically the same as that of the grounded-source amplifier circuit 30 of the first embodiment. However, in the grounded-source amplifier circuit 30B of the third embodiment, since the impedance for the diode-connected transistor block for load 32 side from the drain of the amplifier MOS transistor M1 becomes the source impedance of the cascode MOS transistor M2, by setting the source impedance smaller than the impedance RML×n of the diode-connected transistor block for load 32, deterioration of the high frequency characteristics due to the mirror capacity effect of the amplifier MOS transistor M1 can be improved.

If the mirror capacity effect of the amplifier MOS transistor M1 does not matter, the cascode MOS transistor M2 does not have to be added. The cascode MOS transistor M2 may be added to the grounded-source amplifier circuit 30 of the first embodiment or the grounded-source amplifier circuit 30A of the second embodiment mentioned above.

In the grounded-source amplifier circuit 30B of the third embodiment, in a frequency region above a time constant by the high frequency compensation capacity Cp and the impedance RMs×m of the diode-connected transistor block for source impedance 31, an alternating current impedance connected to the source side of the amplifier MOS transistor M1 is lowered and a voltage gain is increased. By setting the time constant appropriately, the gain drop on the high frequency side can be compensated.

Here, by setting such that the impedance RMs×m of the diode-connected transistor block for source impedance 31 is sufficiently larger than the source impedance RM1s of the amplifier MOS transistor M1, an expression (11) holds at a frequency not more than a time constant determined by Cp and RMs×m, and an expression (12) holds at a frequency not less than the time constant determined by Cp and RM1s, and by setting the time constant determined by Cp and RMs×m in the vicinity of a 1/f noise region, the 1/f noise can be reduced.

$$A \approx RML \times n / RMs \times m \quad (11)$$

$$A \approx RML \times n / RM1s \quad (12)$$

Also, since a lowpass filter (LPF) is constituted by the high frequency cut capacity CL and the impedance RML×n of the diode-connected transistor block for load 32, by setting the time constant appropriately, an unnecessary high frequency component (noise) can be eliminated.

If the high frequency compensation is not needed, the high frequency compensation capacity Cp may be omitted, and if the high frequency cut is not needed, the high frequency cut capacity CL may be omitted. To the grounded-source amplifier circuit 30 of the first embodiment or the grounded-source amplifier circuit 30A of the second embodiment mentioned above, the high frequency compensation capacity Cp or the high frequency cut capacity CL may be added.

Also, in order to reduce a fluctuation of the direct current bias current I with respect to the fluctuation of the threshold value Vt of the MOS transistor, the number m of MOS transistors in the diode-connected transistor block for source impedance 31 may be increased, and the voltage between the input direct current bias power supply Vidc included in the input voltage Vi of the grounded-source amplifier circuit 30B and the negative power supply Vee may be increased in response to the increase of the number m of MOS transistors.

Since increase of the number m of MOS transistors in the diode-connected transistor block for source impedance 31 lowers the gain, by setting the high frequency compensation capacity Cp at a capacity value to become sufficiently low impedance in a passing signal region and by positioning the connection position of the capacity in the diode-connected transistor block for source impedance 31 where the gain can be ensured, the fluctuation of the direct current bias current I with respect to the fluctuation of the threshold voltage Vt of the MOS transistor can be restrained and the gain can be ensured.

The input terminal Vi1 of the source follower/rectifier circuit 34 is connected to the output Vo of the grounded-source amplifier circuit 30B of the third embodiment.

The source follower/rectifier circuit 34 functioning as a source follower circuit or rectifier circuit is configured such that the drain of a source follower MOS transistor M3 connecting the gate to the input terminal Vi1 of the source follower/rectifier circuit 34 is connected to the second positive power supply Vdd1, a source follower load constant current source Ida and a voltage holding capacity element (hereinafter referred to as voltage holding capacity) Ch are connected in parallel between the source and the ground of the source follower MOS transistor M3, and the source of the source follower MOS transistor M3 is made as the output Vo1 of the source follower/rectifier circuit 34. Either of the values of the source follower load constant current source Ida and the voltage holding capacity Ch may be set to 0. Also, the source follower load constant current source Ida may be replaced by a solid resistance.

The source follower/rectifier circuit 34 operates as a voltage buffer circuit (source follower circuit) with high input impedance and low output impedance when the constant current Ida flown by the source follower load constant current source Ida is sufficiently large and the voltage holding capacity Ch is sufficiently small and the circuit also has a level shift circuit function for shifting a direct current potential.

On the contrary, if the constant current Ida flown by the source follower load constant current source Ida is sufficiently small and the voltage holding capacity Ch is sufficiently large, the circuit becomes a peak hold circuit with high input impedance.

By selecting the magnitude of the constant current Ida flown by the source follower load constant current source Ida and a capacity value of the voltage holding capacity Ch appropriately, the output Vo1 of the source follower/rectifier circuit 34 begins to follow an envelope of an amplitude peak value of an alternating current signal of a signal source (grounded-source amplifier circuit 30B of the third embodiment), it operates similarly to a detector circuit of an AM modulated signal.

According to the amplifier circuit according to the third embodiment, the effect similar to that of the amplifier circuit according to the first embodiment (grounded-source amplifier circuit 30) can be exerted. According to the amplifier circuit according to the third embodiment, the following effects (a) to (e) can be further exerted.

(1) Since the cascode MOS transistor M2 is provided, deterioration of the high frequency characteristics can be improved.

(b) Since the high frequency compensation capacity Cp is provided, the gain drop on the high frequency side can be compensated.

(c) Since the high frequency cut capacity CL is provided, an unnecessary high frequency component (noise) can be eliminated.

(d) By increasing the number m of the MOS transistors in the diode-connected transistor block for source impedance 31, by setting the high frequency compensation capacity Cp to a capacity value to become sufficiently low impedance in a passing signal region, and by positioning the connection position of the capacity in the diode-connected transistor block for source impedance 31 where the gain can be ensured, the fluctuation of the direct current bias current I with respect to the fluctuation of the threshold voltage Vt of the MOS transistor can be restrained and the gain can be ensured.

(e) By providing the source follower/rectifier circuit 34, a signal waveform to a tester portion and the like can be selected appropriately.

(D) Fourth Embodiment

Subsequently, a fourth embodiment of the amplifier circuit according to the present invention will be described referring to the attached drawings. The amplifier circuit of the fourth embodiment is a transistor differential amplifier circuit (hereinafter simply referred to as a differential amplifier circuit).

(D-1) Configuration of the Fourth Embodiment

Figure 5:
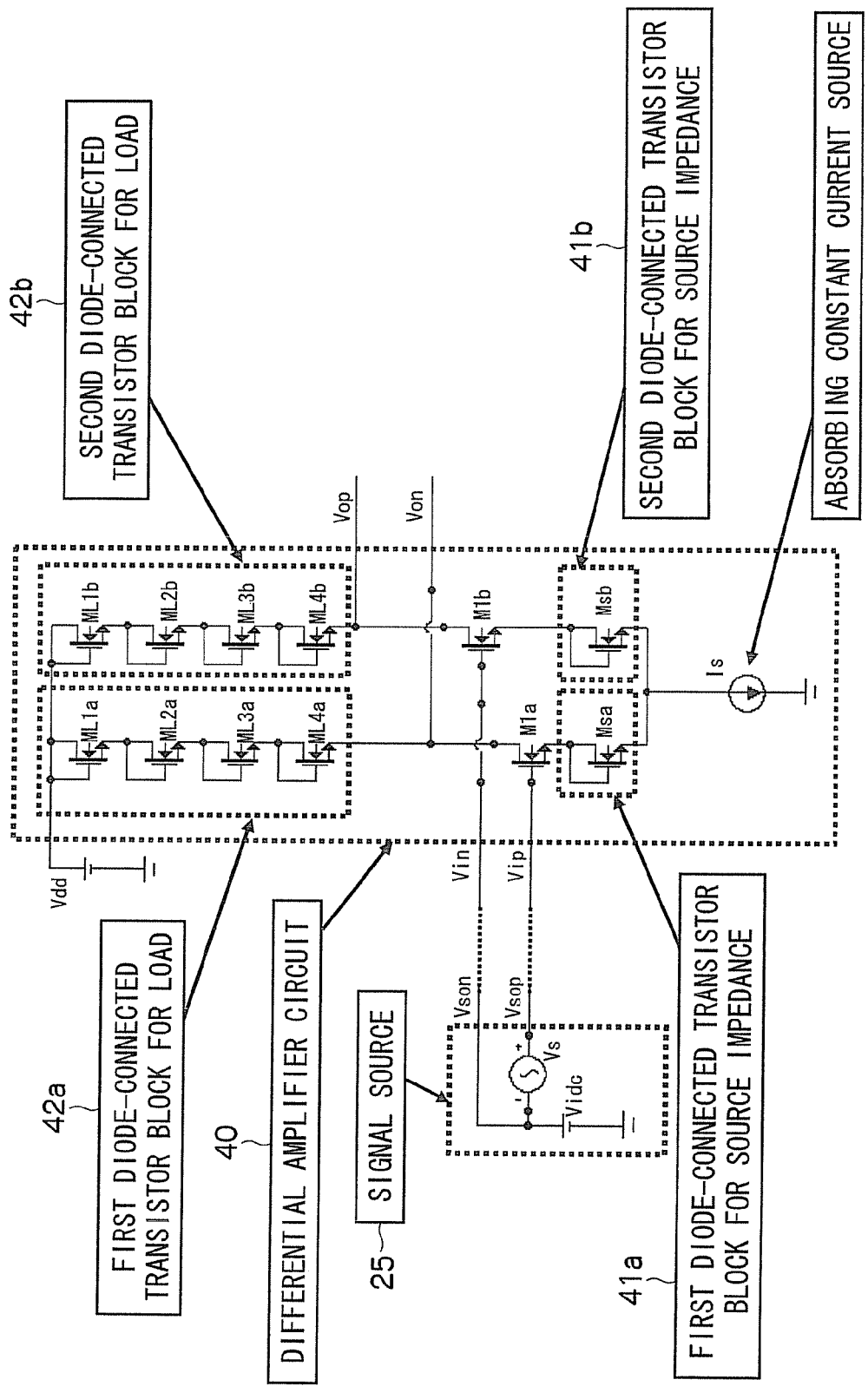
FIG. 5 is a circuit diagram illustrating a configuration of a differential amplifier circuit according to a fourth embodiment.

FIG. 5 is a circuit diagram illustrating a configuration of the differential amplifier circuit according to the fourth embodiment, and the same or corresponding reference numerals are given to the same or corresponding portions in the described drawings.

In FIG. 5, in a differential amplifier circuit 40 of the fourth embodiment, an unbalanced signal is inputted from an unbalanced type differential signal source 25. FIG. 5 shows the signal source 25 in an equivalent circuit.

In the signal source 25, the input direct current bias power supply Vidc is connected in series with the input alternating current signal source Vs and one end is connected to the ground, while the other end is made as a positive output Vsop of the signal source 25, and the output of the input direct current bias power supply Vidc is made as a negative output Vson of the signal source 25.

The differential amplifier circuit 40 of the fourth embodiment is constituted so that a first diode-connected transistor block for source impedance 41a is connected between a source of a first differential amplifier MOS transistor M1a having a gate to be a positive-phase input terminal Vip of the differential amplifier circuit 40 and an absorbing constant current source Is, a first diode-connected transistor block for load 42a is connected between a drain of the first differential amplifier MOS transistor M1a and the positive power supply Vdd, a second diode-connected transistor block for source impedance 41b is connected between a source of a second differential amplifier MOS transistor M1b having a gate to be a negative input terminal Vin of the differential amplifier circuit 40 and an absorbing constant current source Is, a second diode-connected transistor block for load 42b is connected between the drain of the second differential amplifier MOS transistor M1b and the positive power supply Vdd, a (drain) connection end of the first differential amplifier MOS transistor M1a of the first diode-connected transistor block for load 42a is made as a negative-phase output terminal Von of the differential amplifier circuit 40, and a (drain) connection end of the second differential amplifier MOS transistor M1b of the second diode-connected transistor block for load 42b is made as a positive-phase output terminal Vop of the differential amplifier circuit 40.

The first and second diode-connected transistor block for source impedance 41a and 41b are constituted by series-parallel connection of the limited number (including 0 piece) of the diode-connected transistors in which a gate and a drain are connected to each other so as to make between the drain and the source into a diode, respectively. In the example in FIG. 5, the first and second diode-connected transistor blocks for source impedance 41a and 41b are constituted by a single diode-connected MOS transistor Msa, Msb, respectively.

The first and second diode-connected transistor blocks for load 42a and 42b are constituted by series-parallel connection of the limited number of the diode-connected transistors in which a gate and a drain are connected to each other so as to make between the drain and the source into a diode, respectively. In the example in FIG. 5, the first and second diode-connected transistor blocks for load 42a and 42b are constituted by series connection of four diode-connected MOS transistors ML1a to ML4a, ML1b to ML4b, respectively.

(D-2) Operation of the Fourth Embodiment

In FIG. 5, since the input terminals Vip and Vin of the differential amplifier circuit 40 are gates of the first and second differential amplifier MOS transistors M1a and M1b, the current does not flow through the input terminals Vip, Vin.

Through the first and second diode-connected transistor blocks for source impedance 41a and 41b, the current flows according to the differential input voltage applied between the input terminals Vip and Vin but since the connection point of the first and second diode-connected transistor blocks for source impedance 41a and 41b is connected to the absorbing constant current source Is, a potential of the connection point (absorbing constant current source Is connection terminal) is appropriately changed, and an operation goes such that the sum of the currents flowing through the first and second diode-connected transistor blocks for source impedance 41a and 41b becomes equal to the constant current value Is flown by the absorbing constant current source Is all the time.

That is, for an increase (decrease) of the current flowing through the first diode-connected transistor block for source impedance 41a, the current flowing through the second diode-connected transistor block for source impedance 41b is decreased (increased) in operation, and through the first and second diode-connected transistor blocks for source impedance 41a and 41b, a differential current according to a differential voltage of the input terminals Vip and Vin flows.

Through the first diode-connected transistor block for load 42a, a current equal to the current of the first diode-connected transistor block for source impedance 41a flows, while through the second diode-connected transistor block for load 42b, a current equal to the current of the second diode-connected transistor block for source impedance 41b flows, by which a differential output voltage is generated between the positive-phase output terminal Vop and the negative-phase output terminal Von.

With regard to an operating bias current of the first and second differential amplifier MOS transistors M1a and M1b of the differential amplifier circuit 40, the sum of the operating bias currents of the MOS transistors M1a and M1b becomes the constant current value Is flown by the absorbing constant current source Is regardless of the input direct current bias power supply Vidc.

The differential voltage gain A if the load resistance on the rear stage side of the differential amplifier circuit 40 is infinite can be considered similarly to the grounded-source amplifier circuit 30 of the first embodiment, and it can be expressed by an expression (13), supposing that the source impedances of the first and second differential amplifier MOS transistors M1a and M1b are RM1sa and RM1sb, respectively, the impedances per diode-connected transistor in the first and second diode-connected transistor blocks for source impedance 41a, 41b are RMsa, RMsb, the numbers of series connected transistors in the first and second diode-connected transistor blocks for source impedance 41a, 41b are ma, mb, the impedances per diode-connected transistor in the first and second diode-connected transistor blocks for load 42a, 42b are RMLa, RMLb, and the numbers of series connected transistors in the first and second diode-connected transistor blocks for load 42a, 42b are na, nb. However, the expression (13) shows a case in which the first and second differential amplifier MOS transistors M1s and M1b have the similar configurations such as RM1sa=RM1sb=RM1s, the first and second diode-connected transistor block for source impedance 41a and 41b have the similar configurations such as RMsa=RMsb=Rms, ma=mb=m, and the first and second diode-connected transistor blocks for load 42a and 42b have the similar configurations such as RMLa=RMLb=RML, na=nb=n.

$$A = RML \times n/(RM1s + RMs \times m) \quad (13)$$

Similarly to the case of the first embodiment, if the shapes of the MOS transistors constituting the differential amplifier circuit 40 are aligned, it is RML=RM1s≈RMs, and the expression (13) can be deformed to an expression (14), and it is voltage amplification operation when n>(1+m).

$$A \approx n/(1+m) \quad (14)$$

Similarly to the case of the first embodiment, the first and second source impedances RM1sa and RM1sb of the first and second amplifier MOS transistors M1a and M1b can be expressed by an expression (15), supposing that the gate width of the first and second amplifier MOS transistors M1a and M1b is Ws1 and the gate length is Ls1, and a new proportional constant K is put.

$$RM1s \approx (K/\sqrt{I}) \times \sqrt{(Ls1/Ws1)} \quad (15)$$

By connecting the gate and drain to have a diode, a value calculated by the expression (15) is diode impedance.

Similarly, the diode impedance RMs of the transistors Msa and Msb in the first and second diode-connected transistor blocks for source impedance 41a, 41b is expressed by an expression (16), supposing that the gate width of the transistor Ms is Ws and the gate length is Ls, and the diode impedance RML of the transistors ML1a to ML4a and ML1b to ML4b in the first and second diode-connected transistor blocks for load 42a, 42b is expressed by an expression (17), supposing that the gate width of the transistors ML1a to ML4a and ML1b to ML4b is WL and the gate length is LL.

$$RMs \approx (K/\sqrt{I}) \times \sqrt{(Ls/Ws)} \quad (16)$$

$$RML \approx (K/\sqrt{I}) \times \sqrt{(LL/WL)} \quad (17)$$

By assigning the results of the expressions (15) to (17) in the expression (13), the term of $(K/\sqrt{(I)})$ disappears and an expression (18) is obtained, and it is known that the gain A is not affected by the threshold voltage Vt or bias current of each MOS transistor but becomes a ratio between the gate size and the number of each MOS transistor.

$$A = n \times \sqrt{(LL/WL)}/(\sqrt{(Ls1/Ws1)} + m \times \sqrt{(Ls/Ws)}) \quad (18)$$

In the case of an reverse-phase output amplifier using an op amp, a negative feedback resistance for determining a gain lowers the input impedance as an amplifier circuit, but in the differential amplifier circuit 40 of the fourth embodiment, since the input impedance is a gate input impedance of the MOS transistor, the input impedance as the amplifier circuit can be maintained at a high impedance.

Since the expressions (13) to (18) hold all the time similarly to the first embodiment within an operation range that can be regarded that each MOS transistor is in the saturated operation, linearity is ensured and waveform distortion does not occur.

Figure 6:
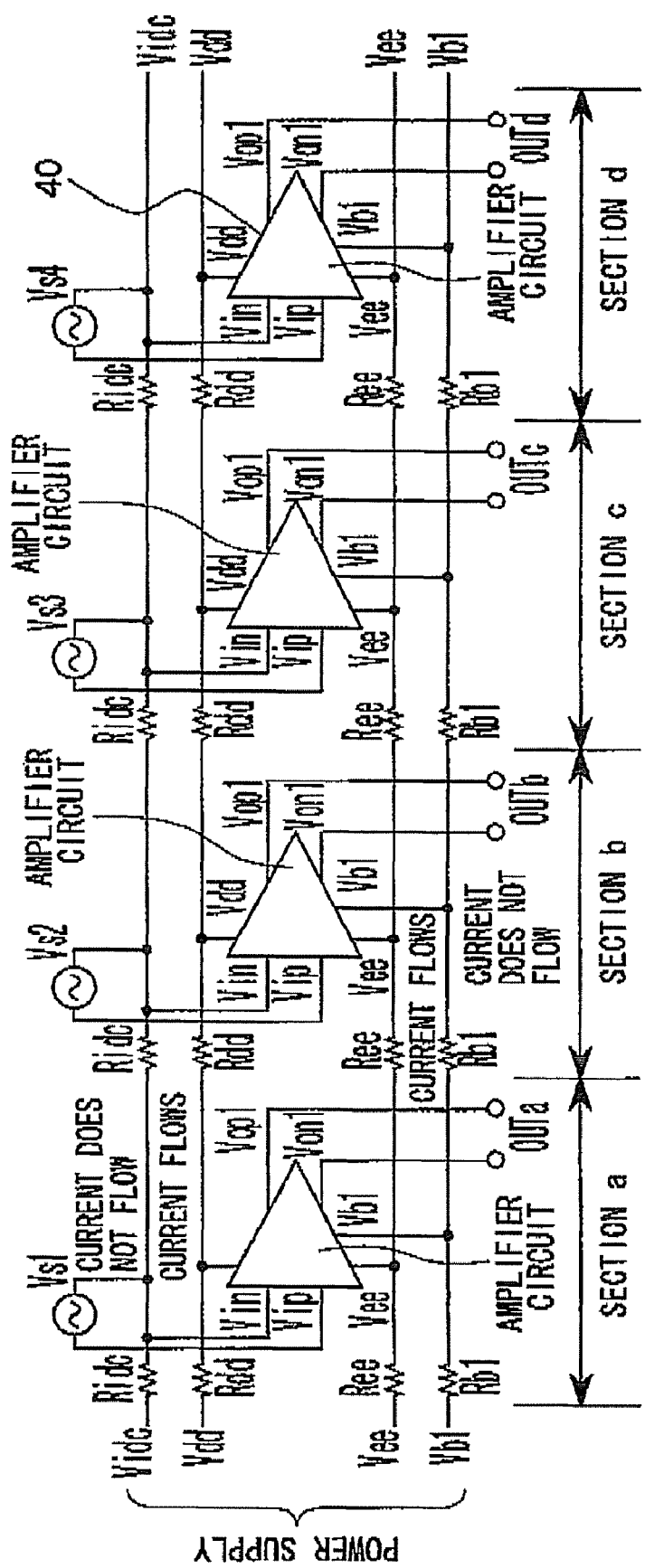
FIG. 6 is a block diagram illustrating a case in which the differential amplifier circuit of the fourth embodiment is connected in multiple stages.

Since the gain is not affected by the threshold voltage Vt of each MOS transistor or the bias current but becomes a function only of the gate size and the number of MOS transistors, the differential amplifier circuit 40 is connected in multi stages in parallel between the power supply lines as shown in a schematic diagram of FIG. 6, and even if the voltage drop by the power supply line current and the power supply line resistance lowers the power supply voltage of the amplifier circuit 40 far from the power supply terminal and reduces the power supply current, an even voltage gain of all the differential amplifier circuits 40 in multi stages can be obtained.

In the case of parallel connection in multi stages between the power supply lines, the point that the even voltage gain can be obtained even if the power supply voltage is lowered and the power supply current is reduced also applies to the grounded-source amplifier circuits 30, 30A, 30B of the first to third embodiments (See the expression (9)), in the case of the fourth embodiment, the influence of the direct current bias by the differential amplification operation can be eliminated, and more even voltage gain can be achieved.

As mentioned above, in the sensor substrate used for an inspection of a substrate for display, as shown in FIG. 6, it is required that a large number of amplifier circuits are connected in parallel between the same power supply lines.

In the differential amplifier circuit 40 of the fourth embodiment, the operating currents of the first and second differential amplifier MOS transistors are determined not by the voltage of the input direct current bias power supply VidC but by the absorbing constant current source Is, and even if the threshold voltage Vt of the transistor is fluctuated, the operating current I of the first and second amplifier MOS transistors M1 and M2 does not fluctuate, and achievement of both a high gain and high stability of the operating current is facilitated.

Also, as shown in FIG. 6, if the amplifier circuits are connected in multi stages in parallel between the power supply lines, with the grounded-source amplifier circuits 30, 30A, 30B of the first to third embodiments, when an output amplitude becomes large, a ripple of a circuit current becomes large, and that might become to a ripple (which leads to a power supply line noise) in the power supply current of the positive power supply Vdd and the direct current source bias power supply Vidc, but with the differential amplifier circuit 40 of the fourth embodiment, it is offset by the positive-phase load current and the negative-phase load current, the power supply current ripple is made small, and occurrence of the power supply line noise is reduced.

In the case of application to the above-mentioned sensor substrate, since only the alternating current signal is taken in by a micro capacity coupling sensor to the positive-phase or negative-phase input terminal Vip or Vin, a direct current bias is supplied to the positive-phase or negative-phase input terminal into which the alternating current signal is taken in through the high resistance (MOS resistance, for example) from the positive input direct current bias power supply Vidc, while the input terminal on the side into which the alternating current signal is not taken is directly connected to the positive input direct current bias power supply Vidc for operation (the format of FIGS. 28 to 31, which will be described later, is applied, for example).

(D-3) Effects of the Fourth Embodiment

According to the differential amplifier circuit 40 of the fourth embodiment, the following effects (a) to (k) can be exerted.

(a) The gain is not affected by the threshold voltage Vt of each MOS transistor or the bias current, and a differential amplifier circuit determined by a ratio between the gate size and the number of transistors of each MOS transistor can be realized.

If the differential amplifier circuit is applied to an amplifier circuit for sensing formed on the sensor substrate on which 7168 pieces are provided adjacently in the length of only 25 cm or some, for example, even if the differential amplifier circuit is produced in the same process of making it into IC, there is a fear that the threshold voltage Vt of the MOS transistor might be slightly different depending on a position on the sensor substrate. However, since the gain is not affected by the threshold voltage Vt of each MOS transistor and the like, the gains of the amplifiers for sensing provided adjacently can be aligned.

(b) In the case of the reverse-phase output amplifier using an op amp, the negative feedback resistance for determining gain lowers the input impedance as the amplifier circuit, but in the amplifier circuit of the fourth embodiment, since the input impedance is the gate input impedance of the MOS transistor, the input impedance as the amplifier circuit can be kept at a high impedance.

(c) Though the diode impedance is used, the linearity is ensured and waveform distortion does not occur within an operation range that can be regarded that each MOS transistor is in the saturated operation.

(d) If the structures of the MOS transistors for load and for source impedance are aligned, a ratio between the load impedance and the source-side impedance is not changed from a low frequency to a high frequency, and a flat gain characteristic can be obtained from the low frequency to the high frequency.

(e) Since a loop negative feedback circuit from output to input such as an op amp circuit is not needed, there is no fear of oscillation.

(f) Since the loop negative feedback circuit from output to input is not needed, a bias voltage of an input portion and a bias voltage of an output portion can be set to free values.

(g) Since the circuit can be constituted by a single N-type (or P-type) transistor and a resistance element is not used therein, a transistor producing process and a resistance producing process of either of the P-type (or N-type) are not needed when it is made into IC, and manufacturing costs and delivery periods can be reduced.

(h) Since a resistance element requiring an area larger than that of the transistor is not used, the area can be made small (size reduction) as compared with a conventional amplifier circuit using the resistance element when it is made into IC.

(i) Since the operating current I of the first and second differential amplifier MOS transistors is determined not by the voltage of the input direct current bias power supply Vidc but by the absorbing constant current source Is, achievement of both a high gain and high stability of the operating current is facilitated without being affected by the fluctuation of the threshold voltage Vt of the transistor.

(j) Being offset by the positive-phase load current and the negative-phase load current, the power supply current ripple is made small, and occurrence of the power supply line noise is reduced.

(k) If the differential amplifier circuits are connected in multi stages in parallel between the power supply lines and even if the power supply voltage of the differential amplifier circuit far from the power supply terminal is lowered by the power supply line current and the power supply line resistance, stable voltage gain can be obtained for the differential amplifier circuits of each stage.

(E) Fifth Embodiment

Subsequently, a fifth embodiment of the amplifier circuit according to the present invention will be described referring to the attached drawings. The amplifier circuit of the fifth embodiment is also a differential amplifier circuit.

Figure 7:
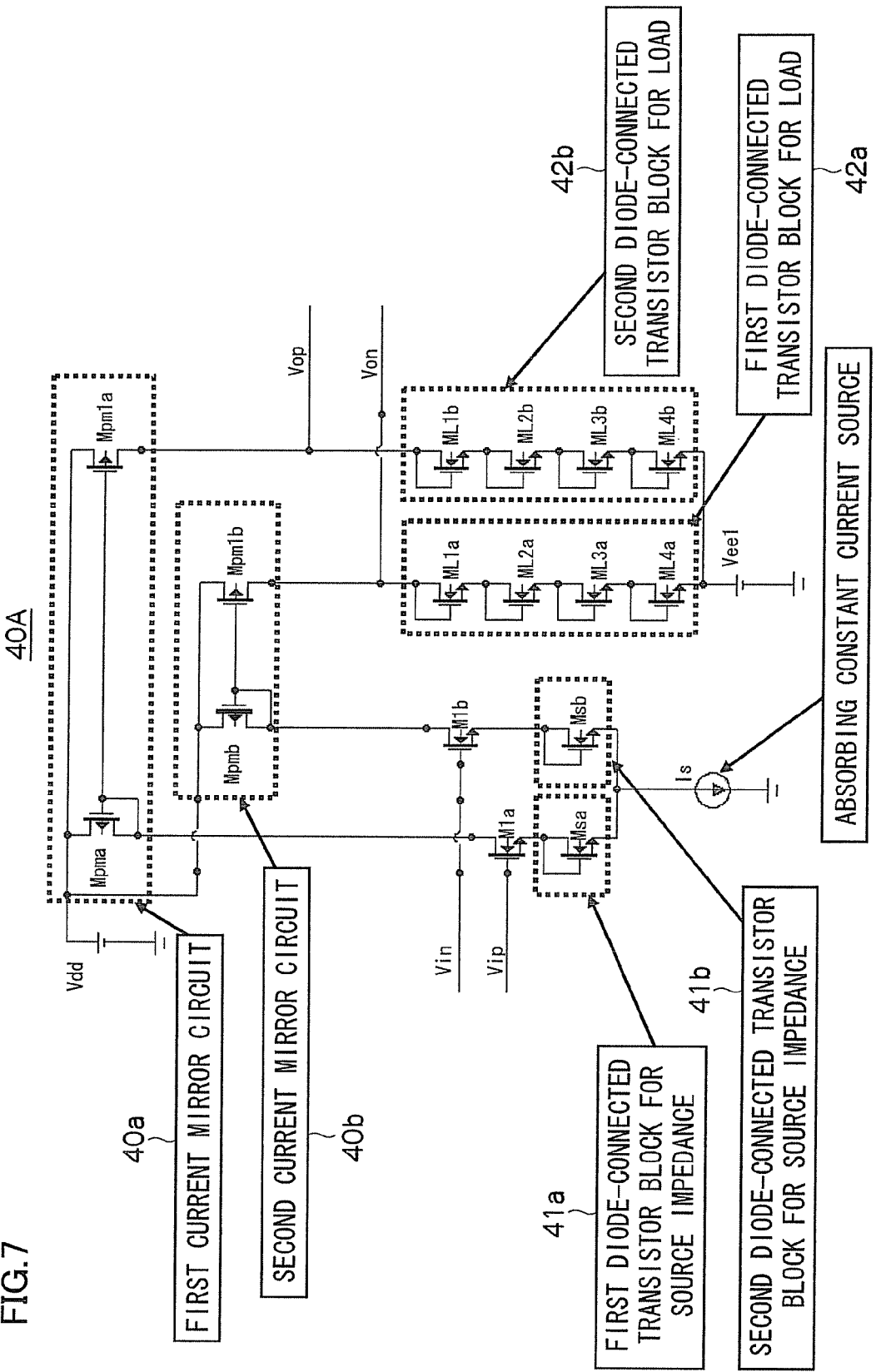
FIG. 7 is a circuit diagram illustrating a configuration of a differential amplifier circuit according to a fifth embodiment.

FIG. 7 is a circuit diagram illustrating a configuration of the differential amplifier circuit according to the fifth embodiment, and the same or corresponding reference numerals are given to the same or corresponding portions in the described drawings.

A differential amplifier circuit 40A according to the fifth embodiment has the following differences from the differential amplifier circuit 40 according to the fourth embodiment.

In FIG. 7, a grounded-source amplifier circuit 40A according to the fifth embodiment is configured such that the connection of each drain of the first and second amplifier MOS transistors M1a and M1b in the differential amplifier circuit 40 of the fourth embodiment with the positive and negative output terminals Vop and Von of the differential amplifier circuit and with the first and second diode-connected transistor blocks for load 42a, 42b are cancelled, first and second current mirror circuits 43a and 43b of P-channel for connecting a common terminal to the positive power supply Vdd are added, the drain of the first amplifier MOS transistor M1a is connected to the input of the first current mirror circuit 43a, the second diode-connected transistor block for load 42b is connected between the output of the first current mirror circuit 43a and the second negative power supply Vee1, an output connection end of the first current mirror circuit 43a of the second diode-connected transistor block for load 42b is made as the positive output terminal Vop of the differential amplifier circuit 40A, the drain of the second amplifier MOS transistor M1b is connected to the input of the second current mirror circuit 43b, the first diode-connected transistor block for load 42a is connected between the output of the second current mirror circuit 43b and the second negative power supply Vee1, and an output connection end of the second current mirror circuit 43b of the first diode-connected transistor block for load 42a is made as the negative output terminal Von of the differential amplifier circuit 40A.

As is obvious from the above, a relation between the differential amplifier circuit 40A according to the fifth embodiment and the differential amplifier circuit 40 of the fourth embodiment is similar to the relation between the grounded-source amplifier circuit 30A according to the second embodiment and the grounded-source amplifier circuit 30 of the first embodiment, and since the operation can be understood from the explanation on the grounded-source amplifier circuit 30A according to the second embodiment and the differential amplifier circuit 40 of the fourth embodiment, the operation explanation will be omitted.

However, the gain of the differential amplifier circuit 40A according to the fifth embodiment will be simply supplemented. In the differential amplifier circuit 40A according to the fifth embodiment, a current amplification is possible by means of the first and second current mirror circuits 43a and 43b, and supposing that the current multiplication is k, RML becomes $1/\sqrt{k}$, and with the current multiplication k, the gain A becomes $\sqrt{k}$ times, and an expression (19), not the above-mentioned expression (18), holds true, but similarly to the case of the expression (18), the gain A is not affected by the threshold voltage Vt of each MOS transistor or the bias current but corresponds to the ratio between the gate size and the number of each MOS transistor.

$$A = \sqrt{k} \times n \times \sqrt{(LL/WL)} / (\sqrt{(Ls1/Ws1)} + m \times \sqrt{(Ls/Ws)}) \tag{19}$$

With the differential amplifier circuit 40A according to the fifth embodiment, too, the effect similar to that of the differential amplifier circuit 40 according to the fourth embodiment can be exerted.

(F) Sixth Embodiment

Subsequently, a sixth embodiment of the amplifier circuit according to the present invention will be described referring to the attached drawings.

Figure 8:
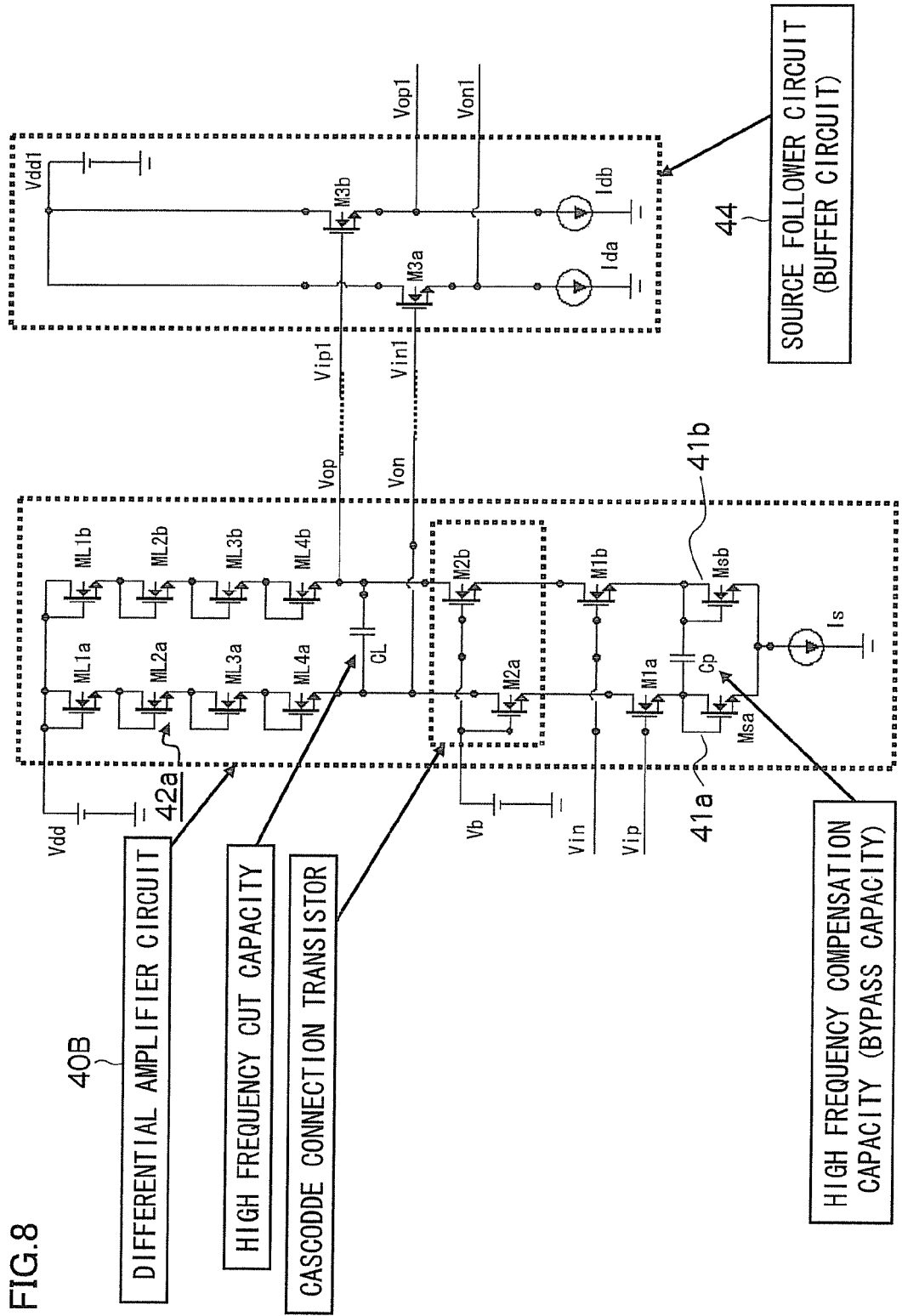
FIG. 8 is a circuit diagram illustrating a configuration of an amplifier circuit according to a sixth embodiment.

FIG. 8 is a circuit diagram illustrating a configuration of the amplifier circuit according to the sixth embodiment, and the same or corresponding reference numerals are given to the same or corresponding portions in the described drawings.

In FIG. 8, in the amplifier circuit of the sixth embodiment, a source follower circuit 44 is added to a differential amplifier circuit 40B. The source follower circuit 44 may be added to the differential amplifier circuit 40 of the fourth embodiment or the differential amplifier circuit 40A of the fifth embodiment.

The differential amplifier circuit 40B of the sixth embodiment has the following difference from the differential amplifier circuit 40 of the fourth embodiment.

The differential amplifier circuit 40B of the sixth embodiment is configured such that connections between the drains of the first and second amplifier MOS transistors M1a and M1b in the differential amplifier circuit 40 of the fourth embodiment and the negative-phase output terminal Von and the positive-phase output terminal Vop are cancelled, the negative-phase output terminal Von is connected to the drain of a first cascode MOS transistor M2a, the gate of the first cascode MOS transistor M2a is connected to the cascode gate bias power supply Vb, the source of the first cascode MOS transistor M2a is connected to the drain of the first amplifier MOS transistor M1a, the positive-phase output terminal Vop is connected to the drain of a second cascode MOS transistor M2b, the gate of the second cascode MOS transistor M2b is connected to a cascode gate bias power supply Vb, the source of the second cascode MOS transistor M2b is connected to the drain of the second amplifier MOS transistor M1b, the high frequency compensation capacity Cp is connected between the sources of the first and second amplifier MOS transistors M1a and M1b, and the high frequency cut capacity CL is connected between the negative-phase output terminal Von and the positive-phase output terminal Vop.

If the high frequency compensation is not required, the high frequency compensation capacity Cp may be omitted, and if the high frequency cut is not required, the high frequency cut capacity CL may be omitted. To the above-mentioned differential amplifier circuit 40 of the fourth embodiment or the differential amplifier circuit 40A of the fifth embodiment, the frequency compensation capacity Cp or the high frequency cut capacity CL may be added.

The high frequency compensation capacity Cp may be connected between the terminals of any of the diode-connected transistors in the first and second diode-connected transistor blocks for source impedance 41a and 41b instead of the above-mentioned position of the connection point, and similarly, the high frequency cut capacity CL may be connected between the terminals of any of the diode-connected transistors in the first and second diode-connected transistor blocks for load 42a and 42b. Depending on the connection position and capacity value of the capacity, the high frequency compensation characteristics and high frequency cut characteristics are changed.

The functions of the high frequency compensation capacity Cp and the high frequency cut capacity CL are the same as those of the above-mentioned fourth embodiment.

In the differential amplifier circuit, too, the source follower circuit or rectifier circuit may be added to the positive-output Vop terminal and the negative output Von terminal, and FIG. 8 shows an example in which the source follower circuit 44 is connected.

A positive-phase input terminal Vip1 of the source follower circuit 44 is connected to the positive-phase output terminal Vop of the differential amplifier circuit 40B, and a negative-phase input terminal Vin1 of the source follower circuit 44 is connected to the negative-phase output terminal Von of the differential amplifier circuit 40B.

The source follower circuit 44 has two source follower circuits for positive phase and for negative phase.

The source follower circuit 44 is configured such that drains of source follower MOS transistors M3b, M3a connecting a gate to one of the positive-phase input terminal Vip1 and the negative-phase input terminal Vin1 of the source follower circuit 44 are connected to a second positive power supply Vdd1, source follower load constant current sources Ida, Idb are connected between the source and ground of the source follower MOS transistors M3b, M3a, the source of the source follower MOS transistor M3b is made as the positive-phase output Vop1 of the source follower circuit 44, and the source of the source follower MOS transistor M3a is made as the negative-phase output Von1 of the source follower circuit 44. Similarly to the third embodiment, a voltage holding capacity may be connected in parallel with each of the source follower load constant current sources Ida, Idb.

The source follower circuit 44 of the sixth embodiment also operates as a voltage buffer circuit with high input impedance and low output impedance and has the level-shift circuit function for shifting a direct current potential similarly to the source follower/rectifier circuit 34 in the third embodiment.

According to the sixth embodiment, the effect similar to that of the fourth embodiment in differential amplifier operation and the effect similar to that of third embodiment in function of high frequency compensation capacity Cp, high frequency cut capacity CL, and the source follower circuit 44.

(G) Seventh Embodiment

Subsequently, a seventh embodiment of the amplifier circuit according to the present invention will be described referring to the attached drawings.

(G-1) Configuration of the Seventh Embodiment

Figure 9:
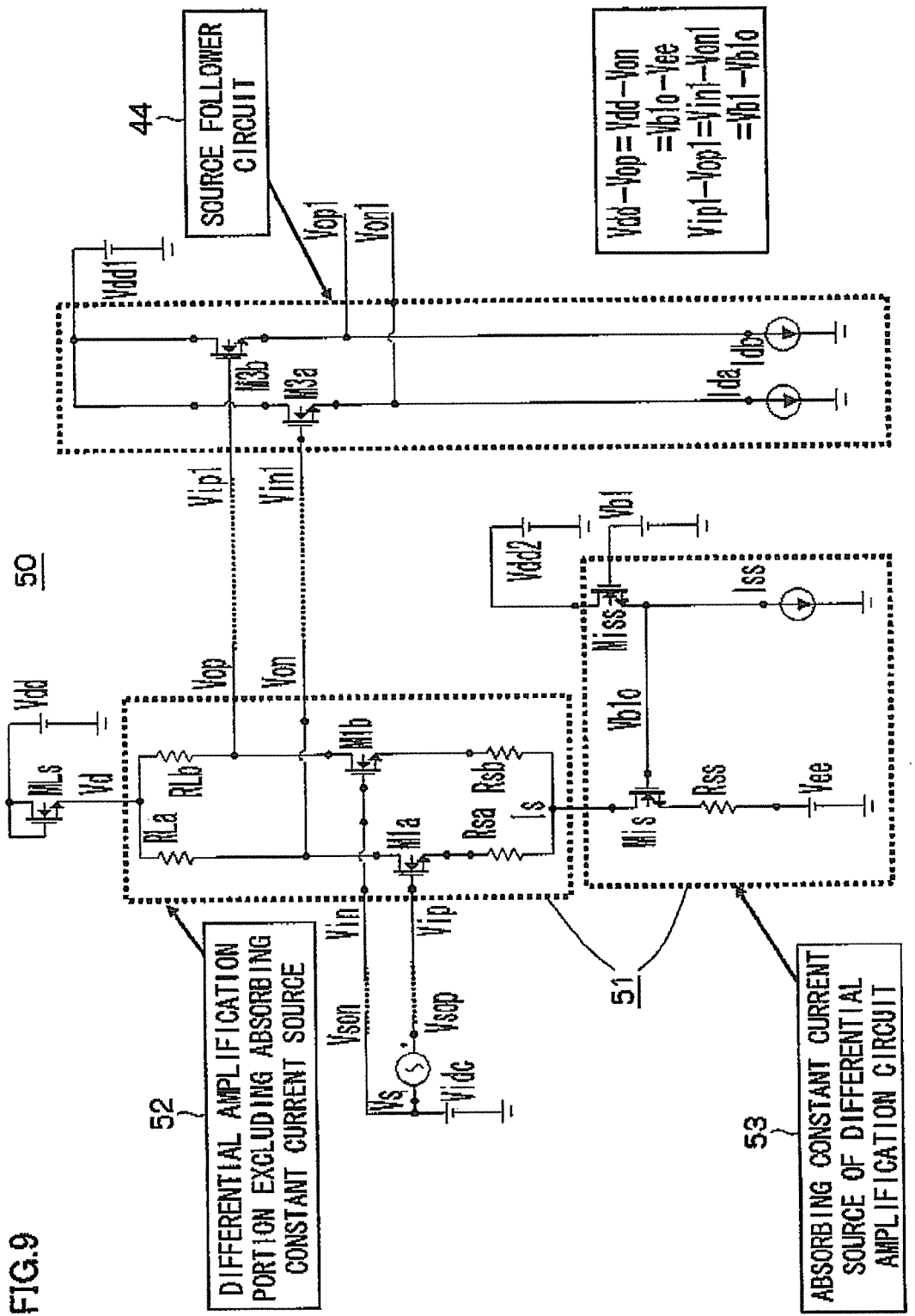
FIG. 9 is a circuit diagram illustrating a configuration of an amplifier circuit according to a seventh embodiment.

FIG. 9 is a circuit diagram illustrating a configuration of the amplifier circuit according to a seventh embodiment, and the same or corresponding reference numerals are given to the same or corresponding portions in the described drawings.

In FIG. 9, in an amplifier circuit 50 of the seventh embodiment, the source follower circuit 44 is added to a differential amplifier circuit 51 having a differential amplification portion 52 and an absorbing constant current source 53.

In the following the description on the source follower circuit 44 will be omitted, and the differential amplifier circuit 51 will be described.

The differential amplifier circuit 51 has the differential amplification portion 52, the absorbing constant current source 53, and a power-supply level shift diode-connected transistor MLs. The differential amplification portion 52 corresponds to a portion excluding the absorbing constant power source 53 from the differential amplifier circuit configuration. The absorbing constant current source 53 and the power-supply level shift diode-connected transistor MLs of the seventh embodiment have a function of an output direct current bias voltage compensation for a fluctuation in the threshold voltage Vt of the transistor in the amplifier circuit 50 including the MOS transistors M3a, M3b in the source follower circuit 44.

In the differential amplification portion 52, a first source resistance for negative feedback Rsa is connected between the source of the first differential amplifier MOS transistor M1a having the gate as the positive-phase input terminal Vip of the differential amplifier circuit 51 and the absorbing constant current source terminal Is, a first load resistance RLa is connected between the drain of the first differential amplifier MOS transistor M1a and the positive power supply terminal Vd, a second source resistance for negative feedback Rsb is connected between the source of the second differential amplifier MOS transistor M1b having the gate as the negative-phase input terminal Vin of the differential amplifier circuit 50 and the absorbing constant current source terminal Is, a second load resistance RLb is connected between the drain of the second differential amplifier MOS transistor M1b and the positive power supply terminal Vd, a connection end of the first differential amplifier MOS transistor M1a (drain) of the first load resistance RLa is made as the negative-phase output terminal Von of the differential amplifier circuit 50, and a connection end of the second differential amplifier MOS transistor M1b (drain) of the second load resistance RLb is made as the positive-phase output terminal Vop of the differential amplifier circuit 51.

Also, between the positive power supply Vdd and the positive power supply terminal Vd of the differential amplification portion 52, a power-supply level shift diode-connected MOS transistor MLs connecting the gate and drain is connected so as to be in a forward direction bias.

The absorbing constant current source 53 is configured such that a constant current setting resistance Rss is connected between a source of a constant current source output MOS transistor Mis connecting the drain to the absorbing constant current source terminal Is of the differential amplification portion 52 and the negative power supply Vee, the gate of the constant current source output MOS transistor Mis and the source of a constant current source level shift MOS transistor Miss are connected to a constant current source level shift transistor bias constant current source Iss, a constant current source circuit gate bias power supply Vb1 is connected to a gate of the constant current source level shift MOS transistor Miss, and a third positive power supply Vdd2 is connected to the drain of the constant current source level shift MOS transistor Miss.

(G-2) Operation of the Seventh Embodiment

Since the differential amplification operation in the amplifier circuit and the source follower circuit operation in the seventh embodiment can be understood from the above-mentioned explanation, the description will be omitted.

Setting is made so that the forward-direction bias voltage of the power-supply level shift diode-connected MOS transistor MLs connected between the positive power supply Vdd and the positive power supply terminal Vd of the differential amplification portion 52 becomes equal to a voltage between the gate and source of the constant current source output MOS transistor Mis connecting the drain to the absorbing constant current source terminal Is of the differential amplification portion 52, and an inter-terminal voltage at no-signal of the first and second load resistances RLa and RLb connected between each drain of the first and second differential amplifier MOS transistors M1a and M1b and the positive power supply terminal Vd become equal to the inter-terminal voltage of the constant current setting resistance Rss connected between the source of the constant current source output MOS transistor Mis and the negative power supply Vee.

Specifically, since the same current flows through the power-supply level shift diode-connected MOS transistor MLs and the constant current source output MOS transistor Mis, it is made as a MOS transistor of the same gate width, the same gate length, and the same threshold voltage Vt, and since a current half of the current flowing through the constant current setting resistance Rss flows through the first and second load resistances RLa and RLb, it is made as RLa=RLb=2×Rss.

By means of the above setting, the potential difference between the positive power supply Vdd and the positive and negative output terminals Vop and Von of the differential amplification portion 52 becomes equal to the potential difference between a source potential Vb1o of the constant current source level shift MOS transistor Miss and the negative power supply Vee regardless of the fluctuation of the threshold voltage Vt of the transistor as shown in an expression (20). In the following, a relation in the expression (20) will be referred to as a condition 1.

$$Vdd-Vop=Vdd-Von=Vb1o-Vee \quad (20) \text{ (condition 1)}$$

Moreover, if the gate lengths of the constant current source level shift MOS transistor Miss and the first and second source follower MOS transistors M3a and M3b are set equal, and the gate width ratio between the first and second source follower MOS transistors M3a and M3b and the constant current source level shift MOS transistor Miss and the current ratio between the output currents Ida and Idb of first and second source follower load constant current sources Ida and Idb and the output current Iss of the constant current source level shift transistor bias constant current source Iss are set equal, as shown in an expression (21), the voltage between the gate and source of the first and second source follower MOS transistors M3a and M3b and the voltage between the gate and source of the constant current source level shift MOS transistor Miss becomes equal.

$$Vip1-Vop1=Vin1-Von1=Vb1-Vb1o \qquad (21)$$

Since Vip1=Vop, Vin1=Von, the expression (21) can be rewritten as an expression (22). In the following, a relation in the expression (22) will be referred to as a condition 2.

$$Vop-Vop1=Von-Von1=Vb1-Vb1o \qquad (22)\text{ (condition 2)}$$

By adding each side of the above-mentioned expressions (20) and (22) together, respectively, an expression (23) is obtained, and if it is Vo1=Vop1=Von1, the expression (23) can be deformed into an expression (24).

$$Vdd-Vop1=Vdd-Von1=Vb1-Vee \qquad (23)$$

$$Vo1=Vdd-Vb1+Vee \qquad (24)$$

That is, regardless of the fluctuation in the threshold voltage Vt of the transistor, the potential difference between the positive power supply Vdd and the positive and negative output terminals Vop1 and Von1 of the source follower circuit 44 can be made equal to the potential difference between the constant current source circuit gate bias power supply Vb1 and the negative power supply Vee all the time.

Since the bias voltage compensation (condition 1) between the differential amplification portion 52 and the absorbing constant current source 53 and the compensation (condition 2) for the level shift voltage of the two source follower circuits in the source follower circuit 44 can be made independently of each other, the differential amplification portion 52, the absorbing constant current source 53, and the MOS transistor of the source follower circuit 44 can be made with an optimal size (performance).

When the amplifier circuit of the seventh embodiment is connected in a large number in parallel between the power supply lines as schematically shown in FIG. 6, the positive power supply current of the positive power supply Vdd and the negative power supply current of the negative power supply Vee are in a proportional relation, and the power supply current does not flow through the constant current source circuit gate bias power supply Vb1. Therefore, the voltage of the power supply line of the constant current source circuit gate bias power supply Vb1 is uniform anywhere.

On the other hand, since each power supply current flows through the positive power supply Vdd line and the negative power supply Vee line, the farther the voltage of the positive power supply line is separated from a power supply end, the lower the potential falls due to a voltage drop by the power supply line current and the power supply line resistance, and the farther the voltage of the negative power supply line is separated from the power supply end, the higher the potential rises due to a voltage drop by the power supply line current and the power supply line resistance (the direction of the current is opposite between the positive power supply and the negative power supply), and by setting so that the ratio of the resistance of the unit length of the positive power supply line and the resistance of the unit length of the negative power supply line and the current ratio flowing through these positive and negative power supply lines become a reciprocal ratio, a voltage ΔVdd by which the voltage of the positive power supply line drops and the voltage ΔVee by which the voltage of the negative power supply line rises become equal. If this relation of ΔVdd=ΔVee is applied to the above-mentioned expression (24), an expression (25) is acquired, and it is known that the output bias Vo1 of the differential amplifier circuit becomes constant regardless of the distance from the power supply end, that is, the output bias Vo1 of the differential amplifier circuit becomes constant regardless of the fluctuation in the threshold voltage Vt of the transistor and the distance from the power supply end.

$$Vo1=Vdd-\Delta Vdd-Vb1+Vee+\Delta Vee=Vdd-Vb1+Vee \qquad (25)$$

(G-3) Effect of the Seventh Embodiment

According to the amplifier circuit 50 of the seventh embodiment, the following effects (a) to (c) can be exerted.

(a) Even if the threshold voltage Vt of the MOS transistor is fluctuated, a differential amplifier circuit whose rectification output direct current bias voltage at no-input is constant all the time can be obtained.

(b) If the differential amplifier circuits are connected in multi stages in parallel between the power supply lines, the power supply voltage of the amplifier far from the power supply terminal is lowered due to the voltage drop by the power supply line current and the power supply line resistance, but a differential amplifier circuit in which the output direct current bias voltage at no-input to the power supply voltage drop does not fluctuate to the power supply voltage drop can be obtained.

(c) Since the bias voltage compensation (the condition 1) between the differential amplification portion 52 and the absorbing constant current source 53 and the compensation (the condition 2) for the level shift voltage of the two source follower circuits in the source follower circuit 44 can be made independently for the fluctuation of the threshold voltage Vt of the MOS transistor, the differential amplification portion 52, the absorbing constant current source 53, and the MOS transistor of the source follower circuit 44 can be made with an optimal size (performance).

(H) Eighth Embodiment

Subsequently, an eighth embodiment of the amplifier according to the present invention will be described referring to the attached drawings.

Figure 10:
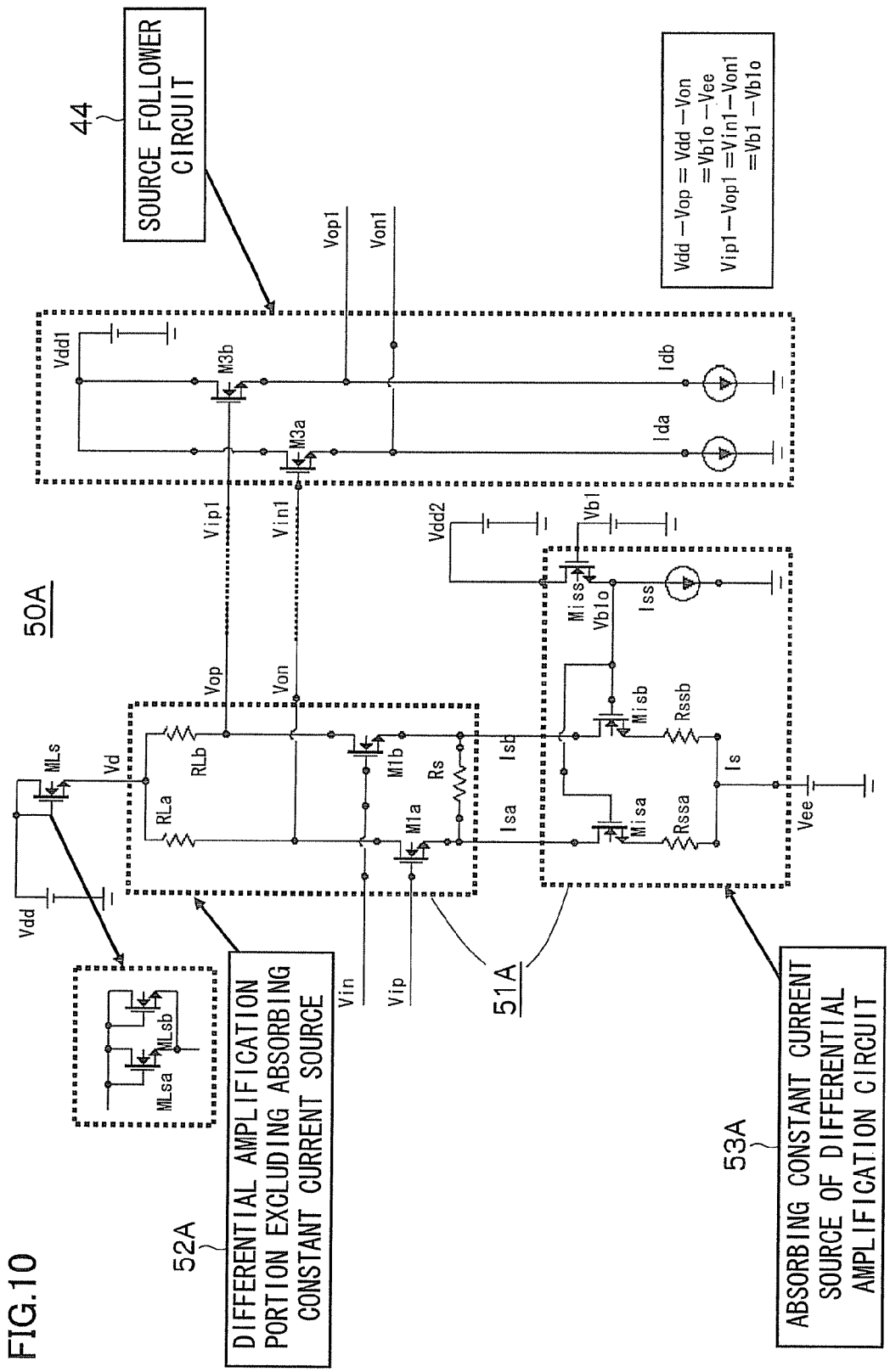
FIG. 10 is a circuit diagram illustrating a configuration of an amplifier circuit according to an eighth embodiment.

FIG. 10 is a circuit diagram illustrating a configuration of the amplifier circuit according to the eighth embodiment, and the same or corresponding reference numerals are given to the same or corresponding portions in the described drawings.

An amplifier circuit 50A according to the eighth embodiment has the following difference from the amplifier circuit of the seventh embodiment.

In the amplifier circuit 50A according to the eighth embodiment, the first source resistance for negative feedback Rsa of the differential amplification portion 52 in the amplifier circuit 50 of the seventh embodiment is removed, the source of the first differential amplifier MOS transistor M1a is made as a first absorbing constant current source terminal Isa, the second source resistance for negative feedback Rsb of the differential amplification portion 52 is removed, the source of the second differential amplifier MOS transistor M1b is made as a second absorbing constant current source terminal Isb, and the source resistance Rs is connected between the source of the first and second differential amplifier MOS transistors M1a and M1b so as to constitute a differential amplification portion 52A.

Also, in the amplifier circuit 50A according to the eighth embodiment, the constant current source output MOS transistor Mis and the constant current setting resistance Rss in the amplifier circuit 50 of the seventh embodiment are removed, a first constant current setting resistance Rssa is connected between the source of a first constant current source output MOS transistor Misa connecting the drain to the first absorbing constant current source terminal Isa and the negative power supply Vee, a second constant current setting resistance Rssb is connected between a second constant current source output MOS transistor Misb connecting the drain to the second absorbing constant current source terminal Isb and the negative power supply Vee, and each gate of the first and second constant current source output MOS transistors Misa and Misb and the source of the constant current source level shift MOS transistor Miss are connected to the constant current source level shift transistor bias constant current source Iss so as to constitute an absorbing constant current source 53A.

In the amplifier circuit 50A according to the eighth embodiment, settings are made so that the forward-direction bias voltage of the power supply level shift diode-connected MOS transistor MLs becomes equal to the voltage between each gate and source of the first and second constant current source output MOS transistors Misa and Misb, and the inter-terminal voltage at no-signal of the first and second load resistances RLa and RLb becomes equal to the inter-terminal voltage of the first and second constant current setting resistances Rssa and Rssb.

Specifically, since the current half of the current flowing through the power supply level shift diode-connected MOS transistor MLs flows through the first and second constant current source output MOS transistors Misa and Misb, by setting the gate width of the power supply level shift diode-connected MOS transistor MLs twice the gate width of the first and second constant current source output MOS transistors Misa and Misb, by having the MOS transistors with the same gate length and the same threshold voltage Vt, and by having an equal current flow to the first and second load resistances RLa and RLb and the first and second constant current setting resistances Rssa and Rssb, RLa=RLb=Rssa=Rssb is obtained.

With the above settings, the potential difference between the positive power supply Vdd and the positive and negative output terminals Vop and Von of the differential amplification portion becomes equal to the potential difference between the source potential Vb1o of the constant current source level shift MOS transistor Miss and the negative power supply Vee all the time regardless of the fluctuation in the threshold voltage Vt of the transistor, and the above-mentioned condition 1 holds true.

For the amplifier circuit 50A according to the eighth embodiment, similarly to the amplifier circuit 50 according to the seventh embodiment, the condition 2 holds true.

If the above-mentioned condition 1 and the condition 2 hold true at the same time, similarly to the amplifier circuit 50 according to the seventh embodiment, the potential difference between the positive power supply Vdd and the positive and negative output terminals Vop1 and Von1 of the first and second source follower circuits can be made equal to the potential difference between the constant current source circuit gate bias power supply Vb1 and the negative power supply Vee all the time regardless of the fluctuation of the threshold voltage Vt of the transistor.

The amplifier circuit 50A of the eighth embodiment can also exert the effect similar to that of the above-mentioned amplifier circuit 50 of the seventh embodiment.

(I) Ninth Embodiment

Subsequently, a ninth embodiment of the amplifier circuit of the present invention will be described referring to the attached drawings.

Figure 11:
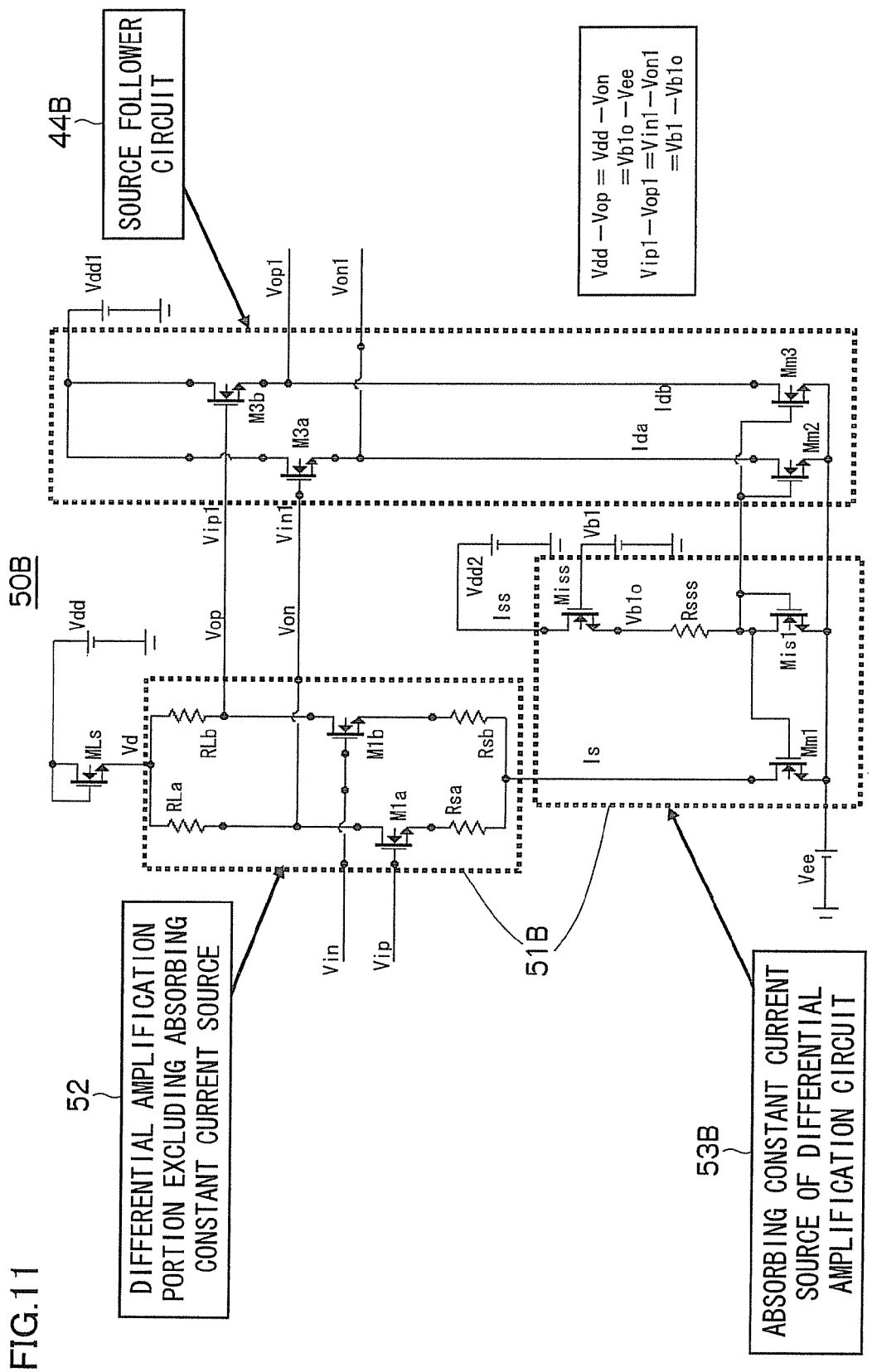
FIG. 11 is a circuit diagram illustrating a configuration of an amplifier circuit according to a ninth embodiment.

FIG. 11 is a circuit diagram illustrating a configuration of the amplifier circuit according to the ninth embodiment, and the same or corresponding reference numerals are given to the same or corresponding portions in the described drawings.

An amplifier circuit 50B according to the ninth embodiment has the following difference from the amplifier circuit 50 of the seventh embodiment.

In the amplifier circuit 50B according to the ninth embodiment, the constant current source output MOS transistor Mis, the constant current setting resistance Rss, and the constant current source level shift transistor bias constant current source Iss in the amplifier circuit 50 of the seventh embodiment and the first and second source follower load constant current sources Ida and Idb of the source follower circuit 44 are removed.

In the amplifier circuit 50B according to the ninth embodiment, one end of a second reference constant current setting resistance Rsss is connected to the source of the constant current source level shift MOS transistor Miss, to the other end of the second reference constant current setting resistance Rsss, (1) constant current setting diode-connected MOS transistor Mis1 connecting a gate and a drain to become input terminals of the current mirror circuit and connecting a source to become a common terminal of the current mirror circuit to the negative power supply Vee, (2) a first current mirror current output MOS transistor Mm1 connecting a drain to the absorbing constant current source terminal Is of the differential amplification portion 53, connecting a gate to the input terminal of the current mirror circuit, and connecting a source to the common terminal of the current mirror circuit, (3) a second current mirror current output MOS transistor Mm2 connecting a drain to the source of the first source follower MOS transistor M3a, connecting a gate to the input terminal of the current mirror circuit, and connecting a source to the common terminal of the current mirror circuit, and (4) a third current mirror current output MOS transistor Mm3 connecting a drain to the source of the second source follower MOS transistor M3b, connecting a gate to the input terminal of the current mirror circuit, and connecting a source to the common terminal of the current mirror circuit are connected.

In the amplifier circuit 50B according to the ninth embodiment, the forward-direction bias voltage of the power supply level shift diode-connected MOS transistor MLs is set equal to the forward-direction bias voltage of the constant current setting diode-connected MOS transistor Mis1 of the current mirror circuit, and the inter-terminal voltage at no-signal of the first and second load resistances RLa and RLb is set equal to the inter-terminal voltage of the second reference constant current setting resistance Rsss.

Alternatively, the voltage between the gate and source of the first and second source follower MOS transistors M3a and M3b is set equal to the forward-direction bias voltage of the constant current setting diode-connected MOS transistor Mis1 of the current mirror circuit, the forward-direction bias voltage of the power supply level shift diode-connected MOS transistor MLs is set equal to the voltage between the gate and the source of the constant current source level shift MOS transistor Miss, and the inter-terminal voltage at no-signal of the first and second load resistances RLa and RLb is set equal to the inter-terminal voltage of the second reference constant current setting resistance Rsss.

Specifically, the gate length and the threshold voltage Vt of the transistor are made the same, the gate width is made large in proportion to a current value to be flown, and the resistance value is set in reciprocal ratio to the current ratio to be flown.

From the above, similarly to the amplifier circuit 50 according to the seventh embodiment, the potential difference between the positive power supply Vdd and the positive and negative output terminals Vop1 and Von1 of the source follower circuit 44B can be made equal to the potential difference between the constant current source circuit gate bias power supply Vb1 and the negative power supply Vee all the time regardless of the fluctuation in the threshold voltage Vt of the transistor.

(J) Tenth Embodiment

Subsequently, a tenth embodiment of the amplifier circuit according to the present invention will be described referring to the attached drawings. The amplifier circuit of the tenth embodiment is a differential amplifier circuit with full-wave rectifier circuit.

(J-1) Configuration of the Tenth Embodiment

Figure 12:
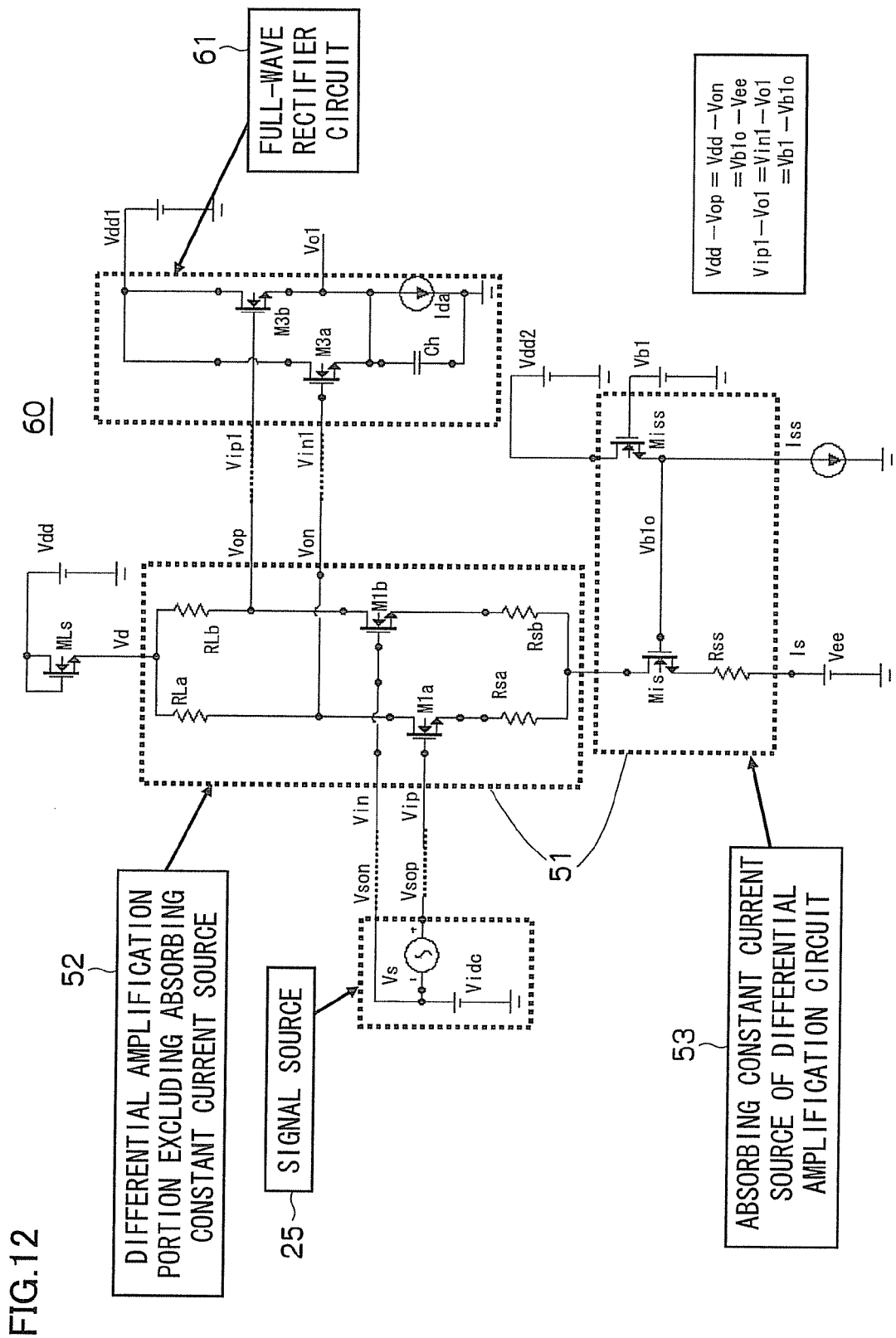
FIG. 12 is a circuit diagram illustrating a configuration of an amplifier circuit according to a tenth embodiment.

FIG. 12 is a circuit diagram illustrating a configuration of the amplifier circuit according to the tenth embodiment, and the same or corresponding reference numerals are given to the same or corresponding portions in the described drawings.

An amplifier circuit 60 according to the tenth embodiment is a differential amplifier circuit with full-wave rectifier circuit in which the source follower circuit 44 in the amplifier circuit 50 of the seventh embodiment is replaced by a full-wave rectifier circuit 61. That is, the source follower circuit 44 connected to the positive and negative outputs Vop and Von of the differential amplification portion 52 is replaced by the full-wave rectifier circuit 61 inputted from the first and second input terminals Vin1 and Vip1.

In the full-wave rectifier circuit 61, the second source follower load constant current source Idb of the source follower circuit 44 is removed, the sources of the first and second source follower MOS transistors M3a and M3b are connected to have a full-wave rectification output terminal vo1, and the voltage holding capacity Ch is added and connected between the full-wave rectification output terminal Vo1 and the ground.

(J-2) Operation of the Tenth Embodiment

In the amplifier circuit 60 according to the tenth embodiment, the differential amplifier circuit operation and the compensation operation of the direct current bias potential to the fluctuation of the threshold voltage Vt of the MOS transistor (at no-input of the full-wave rectification output Vo1) is similar to those of the above-mentioned amplifier circuit 50 of the seventh embodiment, and the detailed description will be omitted.

The full-wave rectifier circuit 61 in the tenth embodiment combines the source follower/rectifier circuit corresponding to the first input terminal Vin1 (See the above-mentioned FIG. 4) and the source follower/rectifier circuit corresponding to the second input terminal Vip1. That is, the outputs of the two source/rectifier circuits are coupled, the two source follower load constant current sources Ida and Idb are combined into one and made into Ida, and two voltage holding capacities Cha and Chb are combined into one and made into a voltage holding capacity Ch, in which the higher potential of the two input voltages Vi1p and Vi1n is made effective, while the lower potential side is ignored, and since the two input voltages Vi1p and Vi1n are differential signals, it makes a full-wave rectification operation.

Similarly to the seventh embodiment, since the bias voltage compensation (the condition 1) between the differential amplification portion 52 and the absorbing constant current source 53 and the compensation (the condition 2) for the level shift voltage of the source follower MOS transistor of the full-wave rectifier circuit 61 for the fluctuation of the threshold voltage Vt of the MOS transistor can be executed independently, the differential amplification portion 52, the absorbing constant current source 53, and the MOS transistor of the full-wave rectifier circuit 61 can be made with an optimal size (performance).

Figure 13:
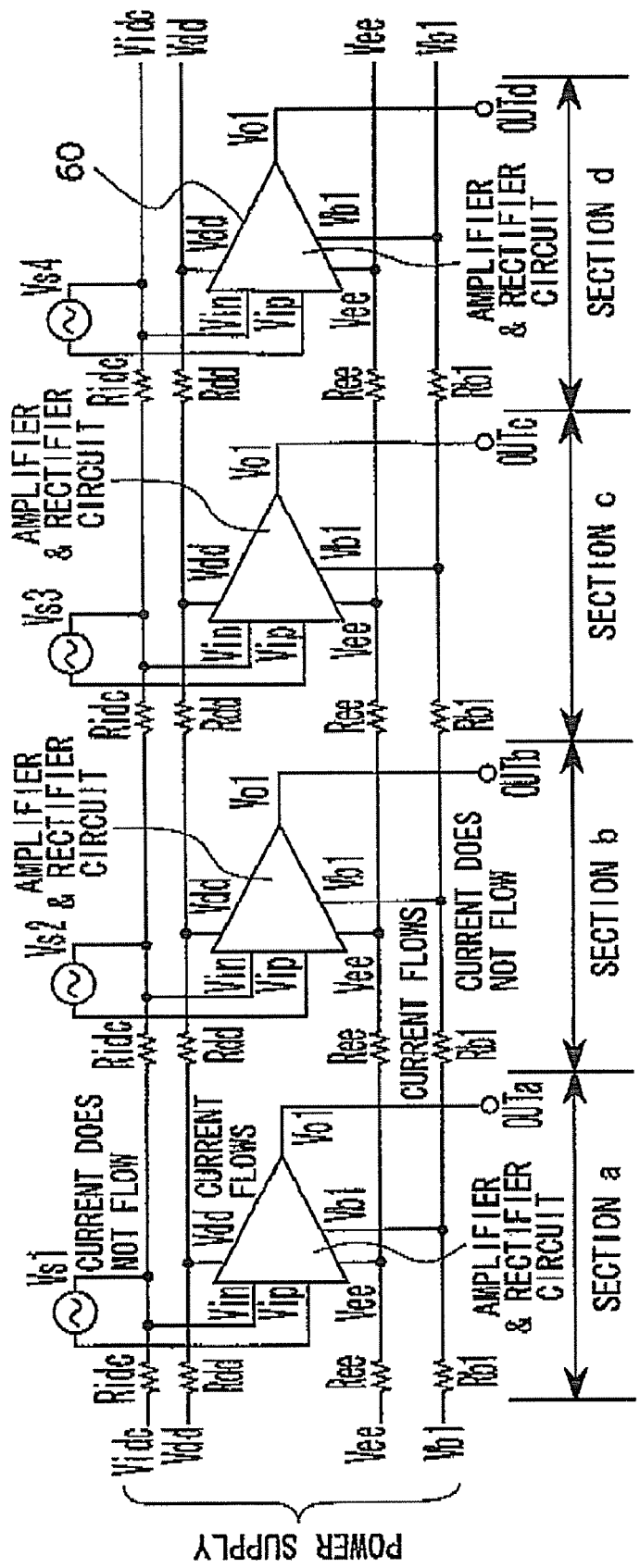
FIG. 13 is a block diagram illustrating a case in which the amplifier circuit of the tenth embodiment is connected in multiple stages.

Also, as schematically shown in FIG. 13, if the amplifier circuits 60 of the tenth embodiment are connected in multi stages in parallel between the power supply lines, the power supply voltage of the amplifier circuit 60 far from the power supply terminal is lowered due to the voltage drop by the power supply line current and the power supply line resistance, but similar to the description in the seventh embodiment, differential amplification operation and full-wave rectification operation in which the direct current bias potential at no-input of the full-wave rectification output Vo1 is compensated for the power supply voltage drop and does not fluctuate are obtained.

(J-3) Effect of the Tenth Embodiment

According to the amplifier circuit 60 of the tenth embodiment, the following effects (a) to (c) can be exerted.

(a) Even if the threshold voltage Vt of the MOS transistor of the differential amplifier circuit 51 is fluctuated, the full-wave rectification operation can be added to the differential amplification operation in which the rectification output direct current bias voltage at no-input is constant all the time.

(b) If the amplifier circuits 60 of the tenth embodiment are connected in multi stages in parallel between the power supply lines, the power supply voltage of the amplifier circuit far from the power supply terminal is lowered due to the voltage drop by the power supply line current and the power supply line resistance, but the full-wave rectification operation can be added to the differential amplification operation in which the output direct current bias voltage at no-input to the power supply voltage drop does not fluctuate to the power supply voltage drop.

(c) Since the bias voltage compensation (the condition 1) between the differential amplification portion 52 and the absorbing constant current source 53 and the compensation (the condition 2) for the level shift voltage of the source follower MOS transistor of the full-wave rectifier circuit 61 can be executed independently for the fluctuation of the threshold voltage Vt of the MOS transistor, the differential amplification portion 52, the absorbing constant current source 53, and the MOS transistor of the full-wave rectifier circuit 61 can be made with an optimal size (performance).

(J-4) Variation of the Tenth Embodiment

The amplifier circuit 60 of the tenth embodiment has the source follower circuit 44 in the amplifier circuit 50 of the seventh embodiment replaced by the full-wave rectifier circuit 61, but the source follower circuits 44, 44B in the amplifier circuits 50A, 50B of the eighth and ninth embodiments may be replaced by the full-wave rectifier circuit.

Figure 14:
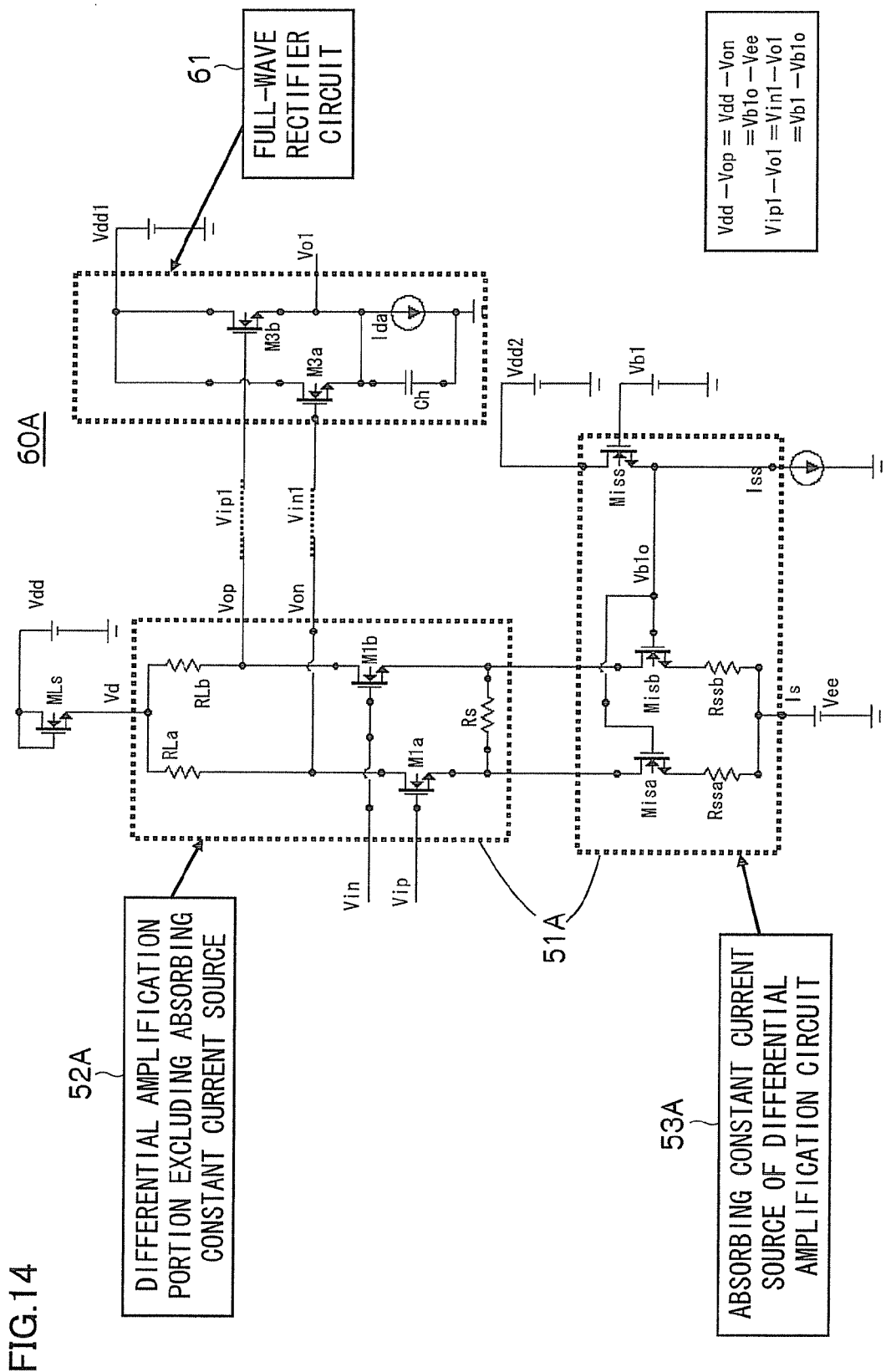
FIG. 14 is a circuit diagram illustrating a configuration of the amplifier circuit according to a variation embodiment (1) of the tenth embodiment.
Figure 15:
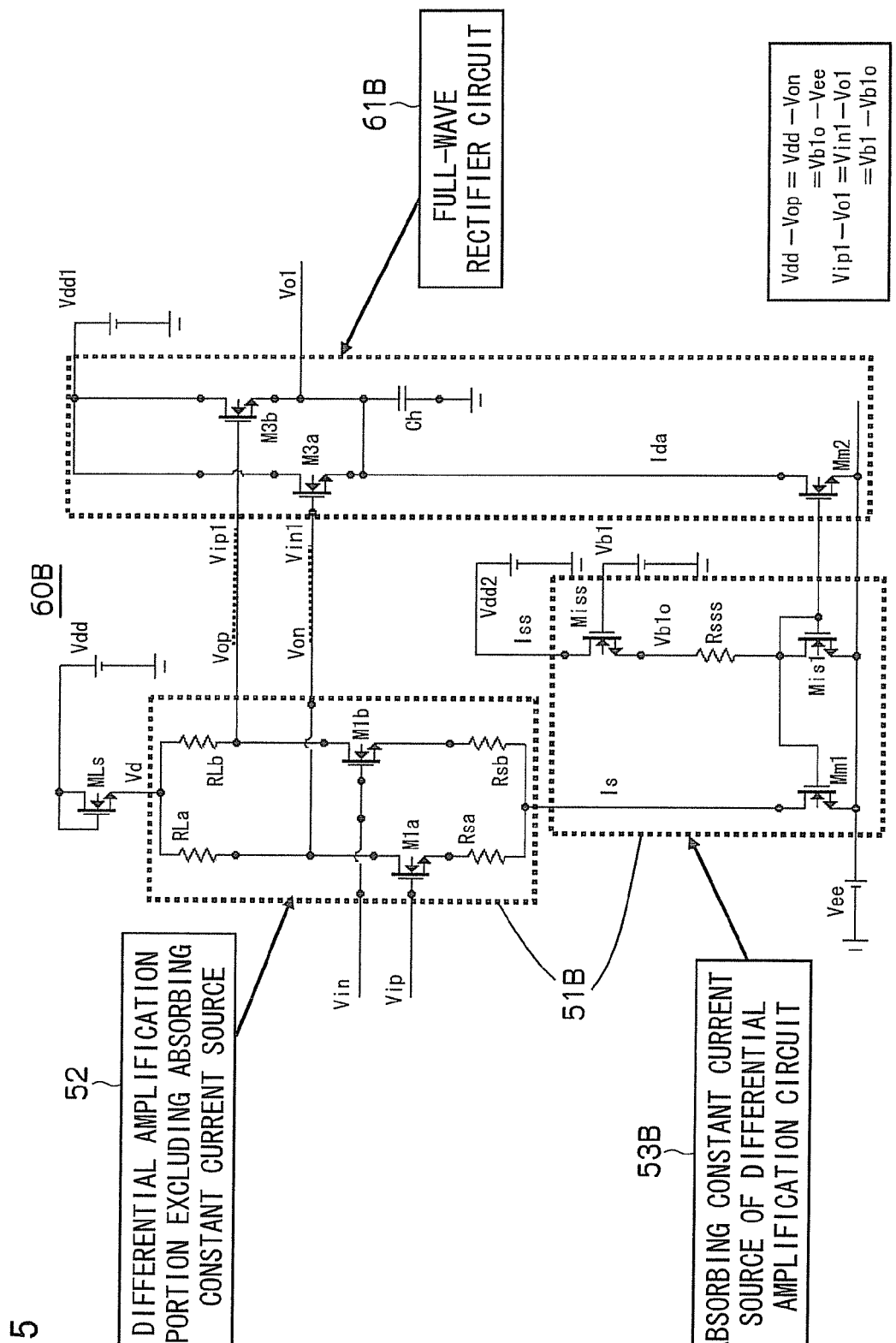
FIG. 15 is a circuit diagram illustrating a configuration of the amplifier circuit according to a variation embodiment (2) of the tenth embodiment.

Though detailed description will be omitted, FIG. 14 shows a case in which the source follower circuit 44 in the amplifier circuit 50A of the eighth embodiment is replaced by the full-wave rectifier circuit 61, and FIG. 15 shows a case in which the source follower circuit 44B in the amplifier circuit 50B of the ninth embodiment is replaced by the full-wave rectifier circuit 61B.

(K) Eleventh Embodiment

Subsequently, an eleventh embodiment of the amplifier circuit according to the present invention will be described referring to the attached drawings. The amplifier circuit of the eleventh embodiment is a differential amplifier circuit with peak-hold circuit. The peak-hold circuit to be added is attached with a reset.

(K-1) Configuration of the Eleventh Embodiment

Figure 16:
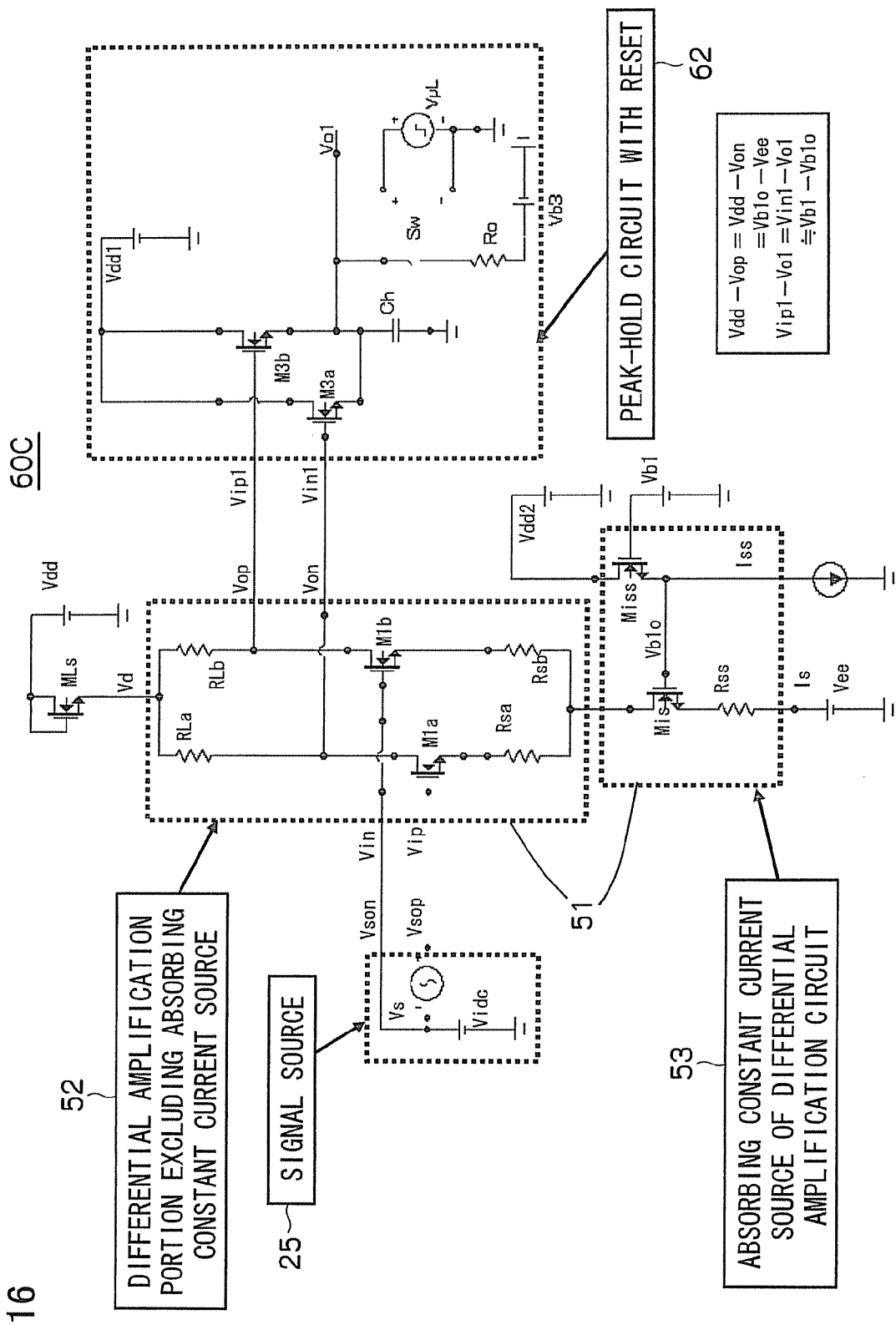
FIG. 16 is a circuit diagram illustrating a configuration of an amplifier circuit according to an eleventh embodiment.

FIG. 16 is a circuit diagram illustrating a configuration of the amplifier circuit according to the eleventh embodiment, and the same or corresponding reference numerals are given to the same or corresponding portions in the described drawings.

An amplifier circuit 60C according to the eleventh embodiment is a differential amplifier circuit with peak-hold circuit in which the source follower circuit 44 in the amplifier circuit 50 of the seventh embodiment is replaced by a peak-hold circuit 62. That is, the source follower circuit 44 connected to the positive and negative outputs Vop and Von of the differential amplification portion 52 is replaced by the peak-hold circuit 62 inputted from the first and second input terminals Vin1 and Vip1.

In the amplifier circuit 60C according to the eleventh embodiment, the first and second source follower load constant current sources Ida and Idb of the source follower circuit 44 in the amplifier circuit 50 of the seventh embodiment are removed, the sources of the first and second source follower MOS transistors M3a and M3b are connected so as to have a peak-hold output terminal Vo1, the voltage holding capacity Ch is added and connected between the peak-hold output terminal Vo1 and the ground, and a series circuit of a switch circuit Sw intermittently connecting a terminal of the voltage holding capacity Ch connected to the peak-hold output terminal Vo1 to a peak-hold reset bias power supply Vb3 by a pulse signal from a switch driven pulse signal source VpL and a resistance Ro limiting a current of the switch circuit Sw is added and connected.

That is, in the amplifier circuit 60C according to the eleventh embodiment, the constant current Ida flown by the source follower load constant current source Ida (See FIG. 12) is set to 0 (deleted) and instead, the switch circuit Sw is provided which intermittently connects the terminal of the voltage holding capacity Ch connected to the peak-hold output terminal Vo1 to the peak-hold reset bias power supply Vb3 by the pulse signal from the switch driven pulse signal source VpL.

The peak-hold circuit 62 with reset shown in FIG. 16 is schematically shown and a specific circuit is not limited to the configuration shown in FIG. 16.

In the amplifier circuit 60C according to the eleventh embodiment, since a voltage between the gate and the source of the first and second source follower MOS transistors M3a and M3b starts a rectification operation substantially from the threshold voltage Vt of the MOS transistor, the voltage between the gate and the source of the constant current source level shift MOS transistor Miss needs to be substantially at the threshold voltage Vt of the MOS transistor, and the output current Iss of the constant current source level shift transistor bias constant current source Iss is made as a small current as possible and the gate width of the constant current source level shift MOS transistor Miss is made as large as possible.

(K-2) Operation of the Eleventh Embodiment

In the amplifier circuit 60C according to the eleventh embodiment, the differential amplifier circuit operation and the compensation operation of the direct current bias potential to the fluctuation of the threshold voltage Vt of the MOS transistor (at no-input of the peak-hold output Vo1) is similar to those of the above-mentioned amplifier circuit 50 of the seventh embodiment, and the detailed description will be omitted.

In the eleventh embodiment, since the source follower circuit 44 in the amplifier circuit 50 of the seventh embodiment is replaced by the peak-hold circuit 62, the peak-hold operation with reset is executed to the output of the differential amplification portion 52. When the switch circuit Sw is off, peaks of the outputs Vop and Von of the differential amplifier portion 52 are held (peaks are detected), while when the switch circuit Sw is on, the peak detected output is reset to an output voltage value of the peak-hold reset bias power supply Vb3. The resistance Ro is to limit the reset current flowing through the switch circuit Sw to an appropriate value when the switch circuit Sw is turned on.

Similarly to the seventh embodiment, since the bias voltage compensation (the condition 1) between the differential amplification portion 52 and the absorbing constant current source 53 and the compensation (the condition 2) for the level shift voltage of the source follower MOS transistor of the peak-hold circuit 62 for the fluctuation of the threshold voltage Vt of the MOS transistor can be executed independently, the differential amplification portion 52, the absorbing constant current source 53, and the MOS transistor of the peak-hold circuit 62 can be made with an optimal size (performance).

Also, as schematically shown in the above-mentioned FIG. 13, if the amplifier circuits 60C of the eleventh embodiment are connected in multi stages in parallel between the power supply lines, the power supply voltage of the amplifier circuit 60 far from the power supply terminal is lowered due to the voltage drop by the power supply line current and the power supply line resistance, but similarly to the description in the third embodiment, differential amplification operation and peak-hold operation in which the direct current bias potential at no-input of the peak-hold output Vo1 is compensated for the power supply voltage drop and does not fluctuate are obtained.

(K-3) Effect of the Eleventh Embodiment

According to the amplifier circuit 60C of the eleventh embodiment, the following effects (a) to (c) can be exerted.

(a) Even if the threshold voltage Vt of the MOS transistor of the differential amplifier circuit 51 is fluctuated, the peak-hold operation can be added to the differential amplification operation in which the peak-hold output direct current bias voltage at no-input is constant all the time.

(b) If the amplifier circuits 60C of the eleventh embodiment are connected in multi stages in parallel between the power supply lines, the power supply voltage of the amplifier circuit far from the power supply terminal is lowered due to the voltage drop by the power supply line current and the power supply line resistance, but the peak-hold operation can be added to the differential amplification operation in which the output direct current bias voltage at no-input to the power supply voltage drop does not fluctuate.

(c) Since the bias voltage compensation (the condition 1) between the differential amplification portion 52 and the absorbing constant current source 53 and the compensation (the condition 2) for the level shift voltage of the source follower MOS transistor of the peak-hold circuit 62 can be executed independently for the fluctuation of the threshold voltage Vt of the MOS transistor, the differential amplification portion 52, the absorbing constant current source 53, and the MOS transistor of the peak-hold circuit 62 can be made with an optimal size (performance).

(K-4) Variation of the Eleventh Embodiment

The amplifier circuit 60C of the eleventh embodiment has the source follower circuit 44 in the amplifier circuit 50 in the seventh embodiment replaced by the peak-hold circuit 62, but the source follower circuits 44, 44B in the amplifier circuits 50A, 50B of the eighth and ninth embodiments may be replaced by the peak-hold circuit 62, though not shown.

(L) Twelfth Embodiment

Subsequently, a twelfth embodiment of the amplifier circuit according to the present invention will be described referring to the attached drawings. In the amplifier circuit according to the twelfth embodiment, the resistance in the amplifier circuit according to the seventh embodiment is replaced by the diode-connected transistor block.

(L-1) Configuration of the Twelfth Embodiment

Figure 17:
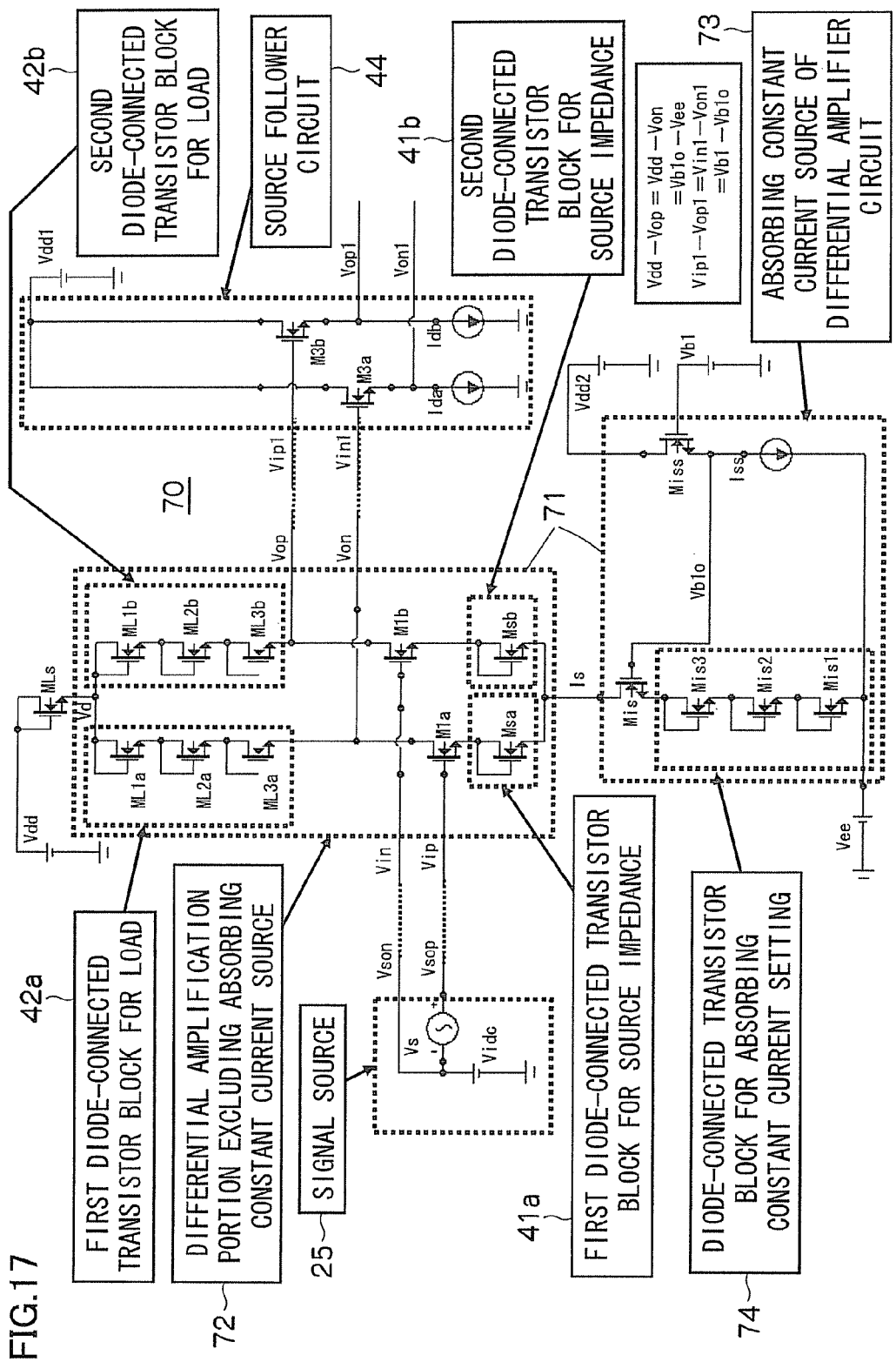
FIG. 17 is a circuit diagram illustrating a configuration of an amplifier circuit according to a twelfth embodiment.

FIG. 17 is a circuit diagram illustrating a configuration of the amplifier circuit according to the twelfth embodiment, and the same or corresponding reference numerals are given to the same or corresponding portions in the described drawings.

In FIG. 17, in an amplifier circuit 70 of the twelfth embodiment, the source follower circuit 44 is added to a differential amplifier circuit 71 having a differential amplification portion 72 and an absorbing constant current source 73.

In the following, the description on the source follower circuit 44 will be omitted, and the differential amplifier circuit 71 will be described.

The differential amplifier circuit 71 has, similarly to the differential amplifier circuit 51 of the seventh embodiment shown in FIG. 9, the differential amplification portion 72, the absorbing constant current source 73, and the power supply level shift diode-connected transistor MLs.

The differential amplification portion 72 has such a configuration that the first and second source resistances for negative feedback Rsa and Rsb in the differential amplification portion 52 of the seventh embodiment are replaced by the first and second diode-connected transistor blocks for source impedance 41a and 41b constituted by series-parallel connection of the limited number (including 0 piece) of the diode-connected transistors for connecting the gate and drain so as to make between the drain and source into a diode, and the first and second load resistances RLa and RLb in the differential amplification portion 52 of the seventh embodiment are replaced by the first and second diode-connected transistor blocks for load 42a and 42b constituted by series-parallel connection of the limited number of the diode-connected transistors for connecting the gate and drain so as to make between the drain and the source into a diode.

The absorbing constant current source 73 has such a configuration that the constant current setting resistance Rss in the absorbing constant current source 53 of the seventh embodiment is replaced by a diode-connected transistor block for absorbing constant current setting 74 constituted by series-parallel connection of the limited number of the diode-connected transistors for connecting the gate and drain so as to make between the drain and the source into a diode.

(L-2) Operation of the Twelfth Embodiment

In the following, characteristic operations of the amplifier circuit 70 according to the twelfth embodiment will be briefly referred to.

The voltage gain is determined by the gate size of the MOS transistor and the number of diode-connected transistors similarly to the above-mentioned fourth (to sixth) embodiments and does not fluctuate to the fluctuation of the threshold voltage Vt of the MOS transistor, and similarly to the seventh (to ninth) embodiments, by aligning the voltage drops between corresponding elements, similarly to the seventh (to ninth) embodiments, even if the threshold voltage Vt of the MOS transistor is fluctuated, a differential amplifier circuit in which the rectification output direct current bias voltage at no-input is constant all the time is obtained.

In the above operations, similarly to the fourth (to sixth) embodiments and the seventh (to ninth) embodiments, if the amplifier circuits 70 of the twelfth embodiment are connected in multi stages in parallel between the power supply lines (See FIG. 6), the power supply voltage of the amplifier circuit far from the power supply terminal is lowered due to the voltage drop by the power supply line current and the power supply line resistance, but an amplifier circuit in which the voltage gain and the output direct current bias voltage do not fluctuate at no-input to the power supply voltage drop is obtained and as a result, the uniform voltage gains are obtained for all the amplifier circuits 70 in the multi stages.

(L-3) Effect of the Twelfth Embodiment

According to the amplifier circuit 70 of the twelfth embodiment, the following effects (a) to (i) can be exerted. A part of the effects below are exerted by the reasons described in the above-mentioned embodiments.

(a) The gain is not affected by the threshold voltage Vt of each MOS transistor or the bias current, and a differential amplification operation determined by a ratio between the gate size and the number of transistors of each MOS transistor can be realized.

(b) In the case of a reverse-phase output amplifier using an op amp, the negative feedback resistance for determining gain lowers the input impedance as the amplifier circuit, but in the amplifier circuit of this embodiment, since the input impedance is the gate input impedance of the MOS transistor, the input impedance as the amplifier circuit can be kept at a high impedance.

(c) Though the diode impedance is used, the linearity is ensured and waveform distortion does not occur within an operation range that can be regarded that each MOS transistor is in the saturated operation.

(d) If the structures of the MOS transistors for load and for source impedance are aligned, a ratio between the load impedance and the source-side impedance is not changed from a low frequency to a high frequency, and a flat gain characteristic can be obtained from the low frequency to the high frequency.

(e) Since a loop negative feedback circuit from output to input such as an op amp circuit is not needed, there is no fear of oscillation.

(f) Since the loop negative feedback circuit from output to input is not needed, a bias voltage of an input portion and a bias voltage of an output portion can be set to free values.

(g) Since the circuit can be constituted by a single N-type (or P-type) transistor and a resistance element is not used therein, a transistor producing process and a resistance producing process of either of the P-type (or N-type) are not needed when it is made into IC, and manufacturing costs and delivery periods can be reduced.

(h) Similarly to the fourth (to sixth) embodiments, by aligning the voltage drops between the corresponding elements, even if the threshold voltage Vt of the MOS transistor is fluctuated, a differential amplifier circuit in which the rectification output direct current bias voltage at no-input is constant all the time is obtained.

(i) If the amplifier circuits of this embodiment are connected in multi stages in parallel between the power supply lines, the power supply voltage of the amplifier far from the power supply terminal is lowered due to the voltage drop by the power supply line current and the power supply line resistance, but an amplifier circuit in which the voltage gain and the output direct current bias voltage do not fluctuate at no-input to the power supply voltage drop is obtained.

(L-4) Variation of the Twelfth Embodiment

Figure 18:
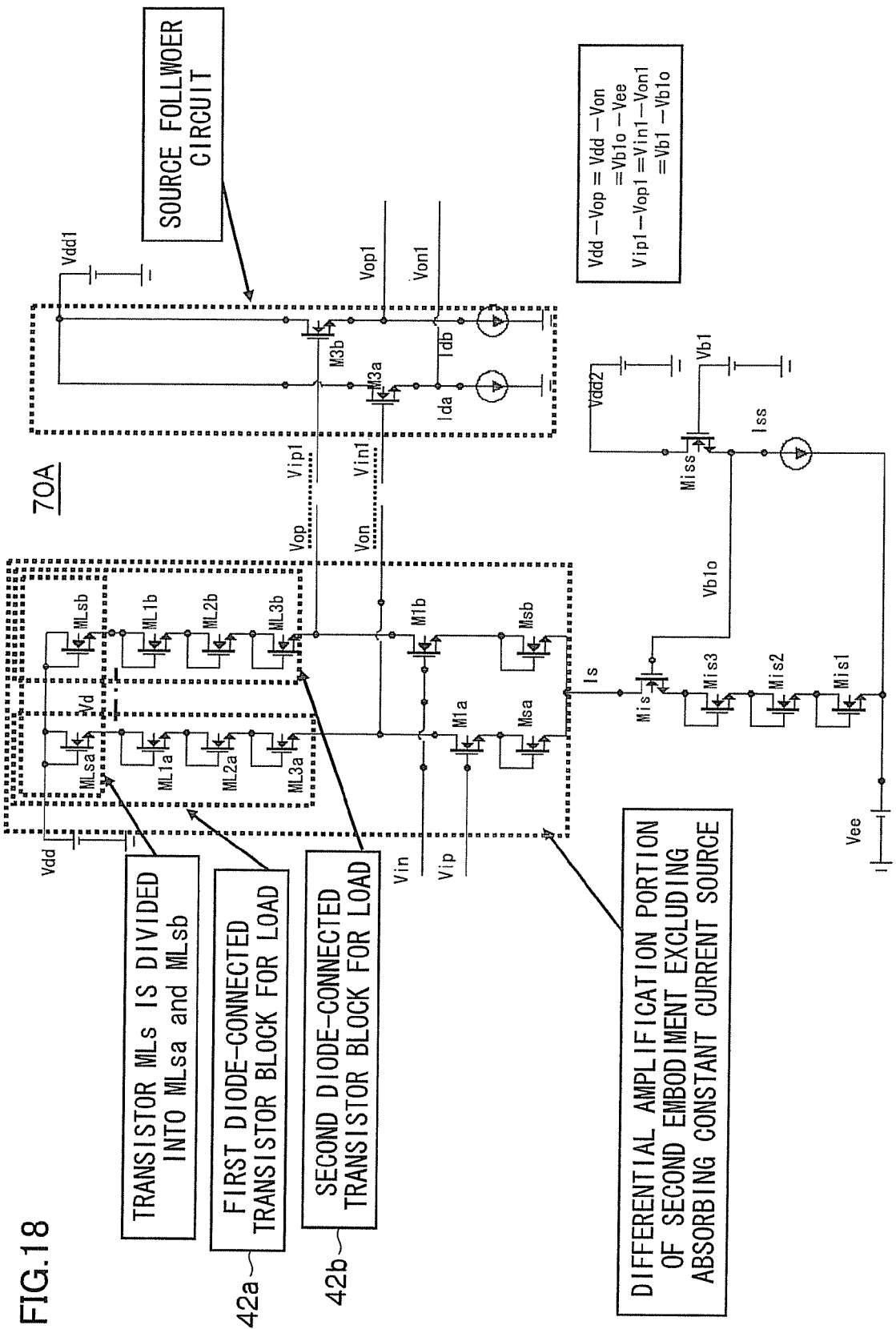
FIG. 18 is a circuit diagram illustrating a configuration of the amplifier circuit according to a variation embodiment (1) of the twelfth embodiment.

FIG. 18 is a circuit diagram illustrating an amplifier 70A obtained by partially varying the amplifier circuit 70 of the twelfth embodiment.

In the amplifier circuit 70A, the power supply level shift diode-connected MOS transistor MLs connecting the gate and the drain connected to between the positive power supply Vdd and the positive power supply terminal Vd of the differential amplification portion 72 in the amplifier circuit 70 of the twelfth embodiment is divided into first and second power supply level shift diode-connected MOS transistors MLsa and MLsb, each of which is made as a load element and added to each of the first and second diode-connected transistor blocks for load 42a and 42b.

With this amplifier circuit 70A, too, the effect similar to that of the amplifier circuit 70 of the twelfth embodiment can be exerted.

Figure 19:
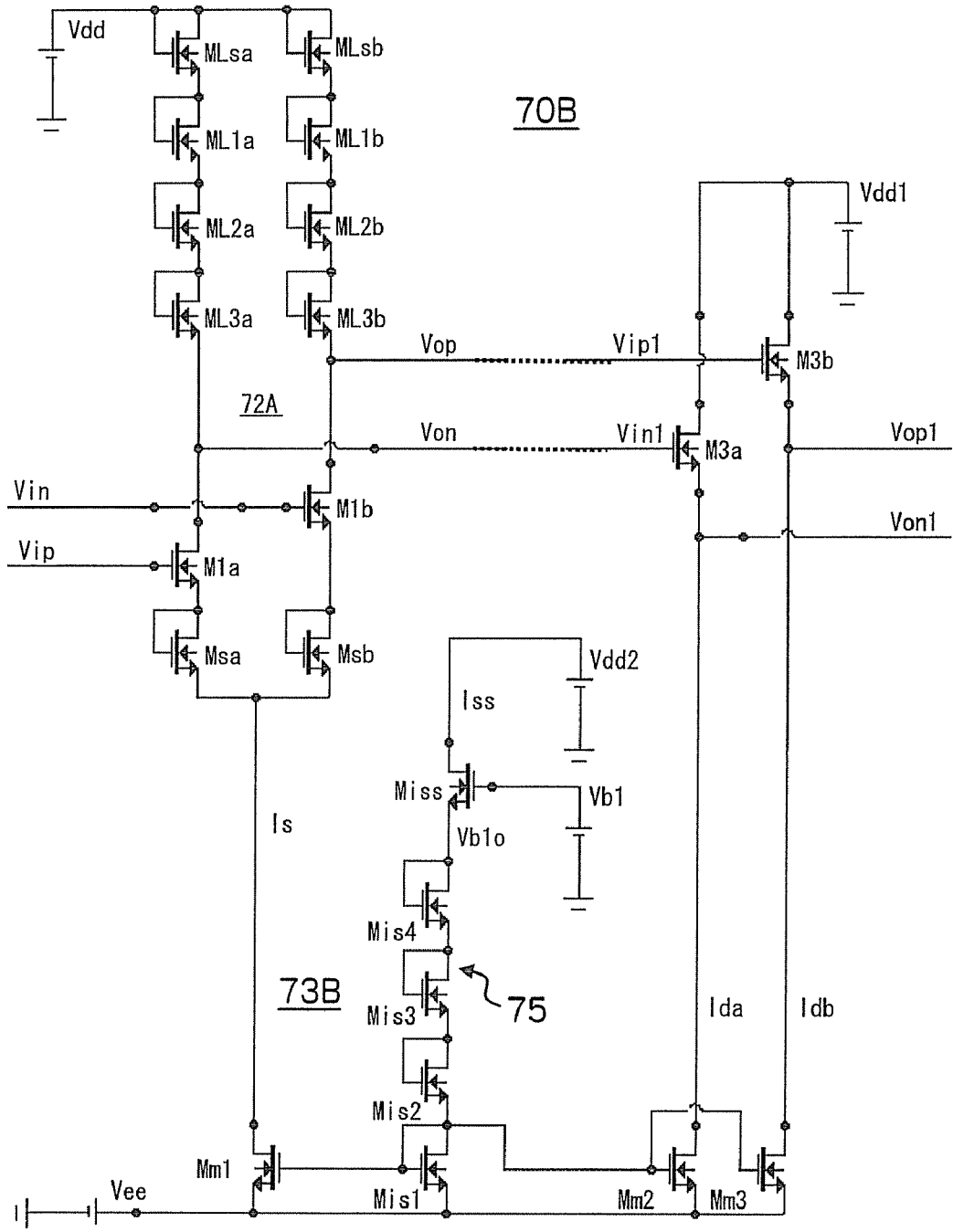
FIG. 19 is a circuit diagram illustrating a configuration of the amplifier circuit according to a variation embodiment (2) of the twelfth embodiment.

FIG. 19 is a circuit diagram illustrating an amplifier circuit 70B obtained by partially varying the amplifier circuit 70 of the twelfth embodiment.

In the amplifier circuit 70B, similarly to the amplifier circuit 70A, the power supply level shift diode-connected MOS transistor MLs in the amplifier circuit 70 of the twelfth embodiment is divided into the first and second power supply level shift diode-connected MOS transistors MLsa and MLsb.

Also, the amplifier circuit 70B is configured such that, in the amplifier circuit 70A, (1) the constant current source output MOS transistor Mis, a diode-connected transistor block for absorbing constant current setting 74 constituted by series-parallel connection of the limited number of the diode-connected transistors Mis1 to Mis3, the constant current source level shift transistor bias constant current source Iss, and the first and second source follower load constant current sources Ida and Idb of the source follower circuit 44 are removed, and instead; (2) to the source of the constant power source level shift MOS transistor Miss, one end of a diode-connected transistor block for reference constant current setting 75 constituted by series-parallel connection of the limited number of the diode-connected transistors Mis2 to Mis4 connecting the gate and drain so as to make between the drain and source into diode; (3) to the other end of the diode-connected transistor block for reference constant current setting 75, (3-1) the constant current setting diode-connected MOS transistor Mis1 connecting the gate and drain to become the input terminal of the current mirror circuit and connecting the source to become the common terminal of the current mirror circuit to the negative power supply Vee, (3-2) the first current mirror output MOS transistor Mm1 connecting the drain to the absorbing constant current source terminal Is of the differential amplification portion 72A, connecting the gate to the input terminal of the current mirror circuit, and connecting the source to the common terminal of the current mirror circuit, (3-3) the second current mirror current output MOS transistor Mm2 connecting the drain to the source of the first source follower MOS transistor M3a, connecting the gate to the input terminal of the current mirror circuit, and connecting the source to the common terminal of the current mirror circuit, and (3-4) the third current mirror current output MOS transistor Mm3 connecting the drain to the source of the second source follower MOS transistor M3b, connecting the gate to the input terminal of the current mirror circuit, and connecting the source to the common terminal of the current mirror circuit are connected.

The diode-connected transistor block 75 for reference constant current setting corresponds to the reference constant current setting resistance Rsss in the ninth embodiment shown in FIG. 11.

Therefore, the working effects of an absorbing constant current source 73B and the source follower circuit 44B in the amplifier circuit 70B are similar to those in the ninth embodiment.

(M) Thirteenth Embodiment

Subsequently a thirteenth embodiment of the amplifier according to the present invention will be described referring to the attached drawings.

Figure 20:
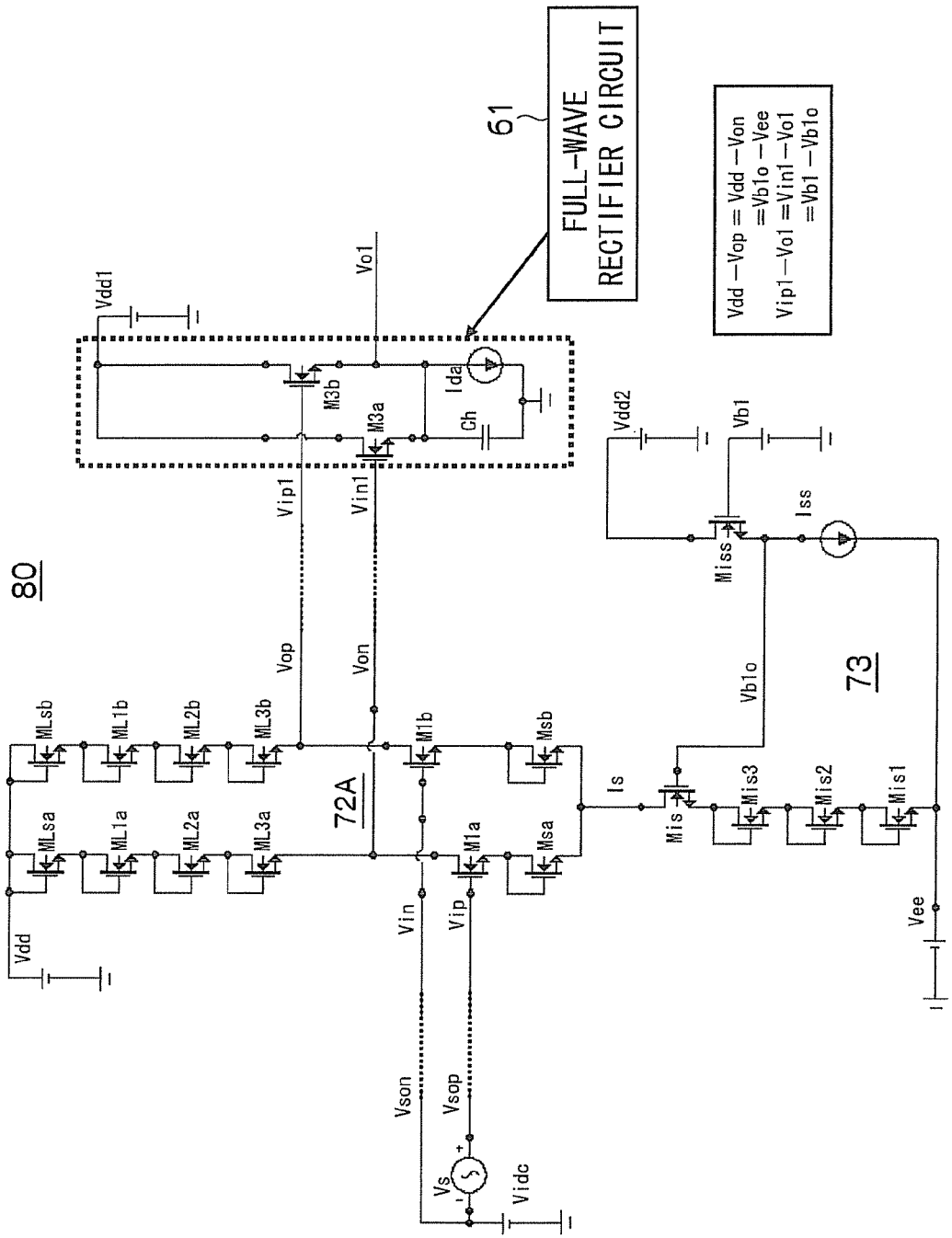
FIG. 20 is a circuit diagram illustrating a configuration of an amplifier circuit according to a thirteenth embodiment.

FIG. 20 is a circuit diagram illustrating a configuration of the amplifier circuit according to the thirteenth embodiment, and the same or corresponding reference numerals are given to the same or corresponding portions in the described drawings.

An amplifier circuit 80 according to the thirteenth embodiment has the source follower 44 of the amplifier circuit 70A in the first variation of the twelfth embodiment shown in FIG. 18 replaced by the full-wave rectifier circuit 61.

The full-wave rectifier circuit 61 has the configuration similar to that of the full-wave rectifier circuit 61 in the amplifier circuit 60 of the tenth embodiment shown in FIG. 12 and exerts the same working effects.

The operation in which even if the threshold voltage Vt of the MOS transistor is fluctuated, the voltage gain and the rectification output direct current bias voltage at no-input become constant all the time is similar to that in the twelfth embodiment and its variation, and by replacing the source follower circuit 44 connected to the positive and negative outputs Vop and Von of the differential amplification portion 72A by the full-wave rectifier circuit 61 from the first and second input terminals Vin1 and Vip1, a mere differential amplification operation is changed to the operation of the differential amplifier circuit with full-wave rectifier circuit.

If the amplifier circuits are connected in multi stages in parallel between the power supply lines similarly to the twelfth embodiment and its variation (See FIG. 13), the power supply voltage of the amplifier circuit far from the power supply terminal is lowered due to the voltage drop by the power supply line current and the power supply line resistance, but a differential amplifier circuit with full-wave rectifier circuit in which the voltage gain and the output direct current bias voltage do not fluctuate at no-input to the power supply voltage drop is obtained.

The amplifier circuit 80 according to the thirteenth embodiment can exert the effect similar to that of the twelfth embodiment, and the output can be made a full-wave rectification output.

The amplifier 80 according to the thirteenth embodiment has the source follower circuit 44 of the amplifier circuit 70A in the first variation of the twelfth embodiment shown in FIG. 18 replaced by the full-wave rectifier circuit 61 but may be replaced by another circuit.

Figure 21:
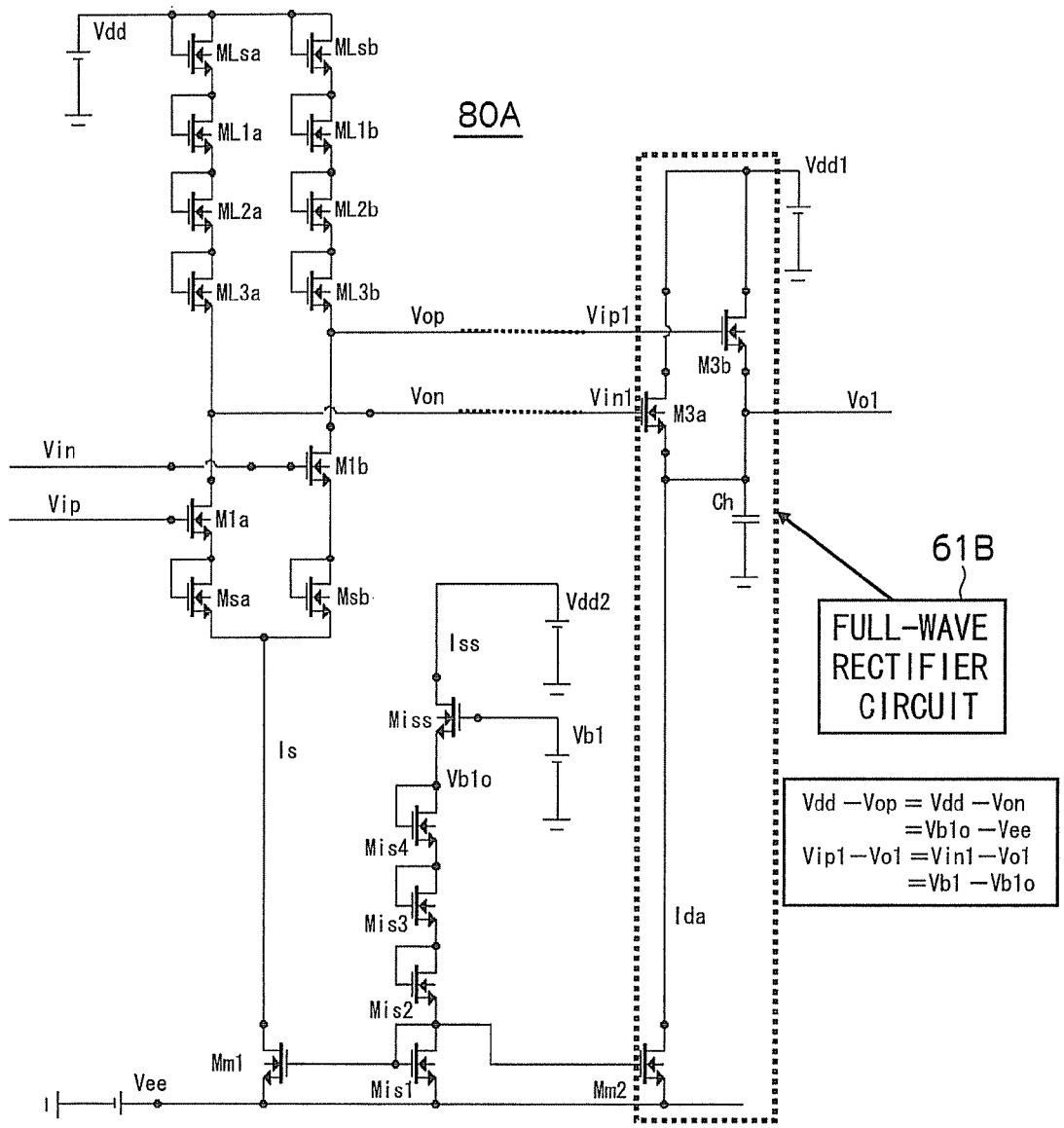
FIG. 21 is a circuit diagram illustrating a configuration of the amplifier circuit according to a variation embodiment (1) of the thirteenth embodiment.
Figure 22:
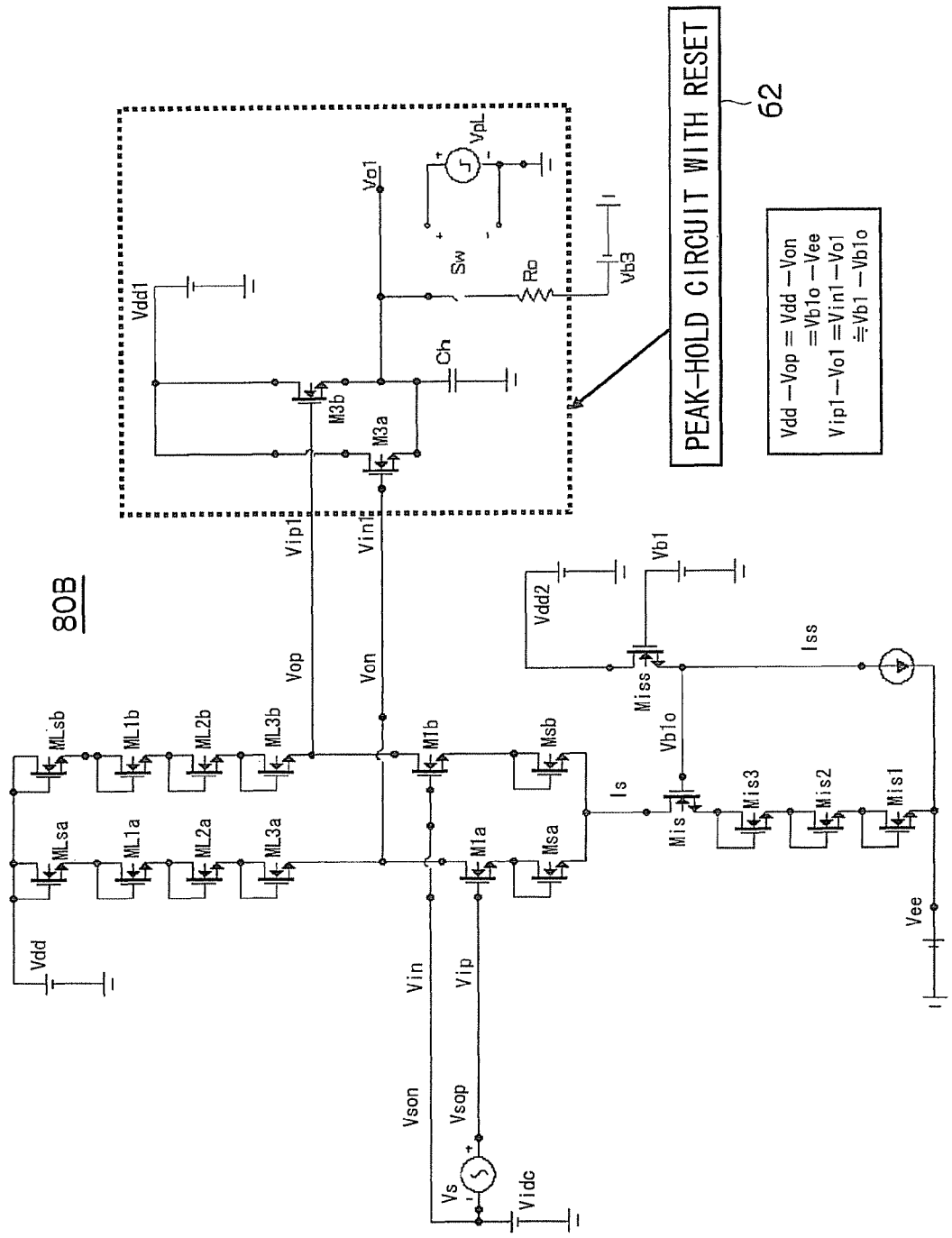
FIG. 22 is a circuit diagram illustrating a configuration of the amplifier circuit according to a variation embodiment (2) of the thirteenth embodiment.

FIG. 21 is an amplifier circuit 80A (a first variation of the thirteenth embodiment) in which the source follower circuit 44B in the amplifier circuit 70B in the second variation of the twelfth embodiment is replaced by the full-wave rectifier circuit 61B, and FIG. 22 shows an amplifier circuit 80B (a second variation of the thirteenth embodiment) in which the source follower circuit 44 of the amplifier circuit 70A in the first variation of the twelfth embodiment is replaced by the peak-hold circuit 62 with reset.

The operations and working effects of the amplifier circuit 80A shown in FIG. 21 and the amplifier circuit 80B shown in FIG. 22 can be easily understood from the description of the above-mentioned embodiments, the description will be omitted.

(N) Other Embodiments

Various variations are mentioned in the description of each of the above embodiments, but variations exemplified below can be further cited.

(N-1) The amplifier circuit in which an additional circuit such as the source follower circuit, and full-wave rectifier circuit or peak-hold circuit with reset is added to the differential amplifier circuit may only be necessary to satisfy the following conditions and not limited to the above-mentioned embodiments or variations of the above-mentioned embodiments.

In the amplifier circuit to which the additional circuit is added, it is important that the above-mentioned expressions (23) to (25) hold true to the fluctuation of the threshold voltage Vt of the MOS transistor as well as the positive and negative power supply voltages Vdd and Vee, and the premise is that the condition 1 and the condition 2 shown in the expressions (20) and (22) hold true. The expressions (23) to (25) and (20) and (22) will be cited below again.

$$Vdd - Vop1 = Vdd - Von1 = Vb1 - Vee \quad (23)$$

$$Vo1 = Vdd - Vb1 + Vee \quad (24)$$

$$Vo1 = Vdd - \Delta Vdd - Vb1 + Vee + \Delta Vee \quad (25)$$
$$= Vdd - Vb1 + Vee$$

(condition 1)

$$Vdd - Vop = Vdd - Von = Vb1o - Vee \quad (20)$$

(condition 2)

$$Vop - Vop1 = Von - Von1 = Vb1 - Vb1o \quad (22)$$

As long as the circuit configuration satisfies the above condition 1 and the condition 2, it is not limited to the above-mentioned embodiments and their variations.

Figure 23:
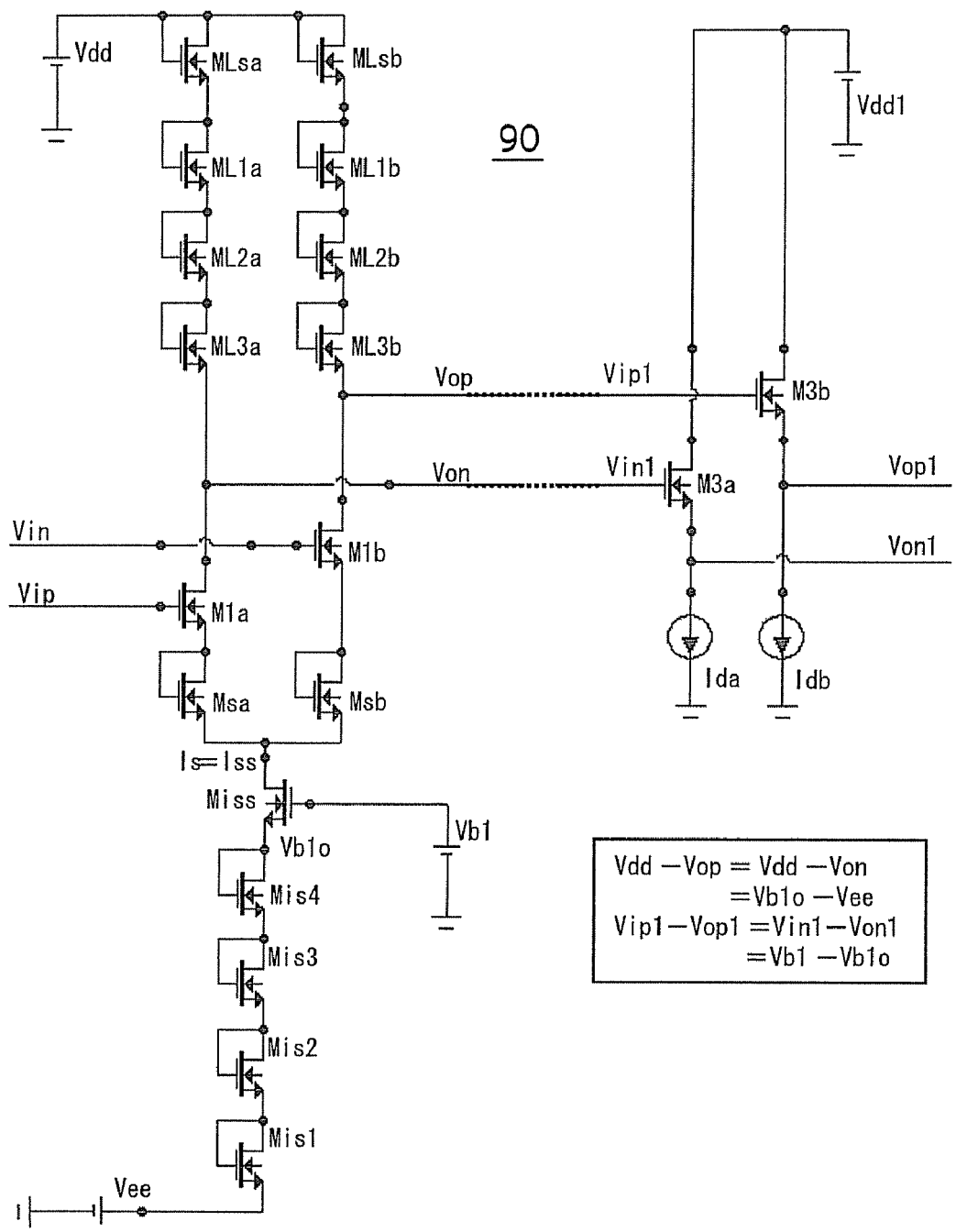
FIG. 23 is a circuit diagram illustrating a configuration of an amplifier circuit according to a fourteenth embodiment.

For example, as an amplifier circuit 90 of a fourteenth embodiment shown in FIG. 23, it may be so configured that a value of the constant current source level shift transistor bias constant current Iss and a value of the absorbing constant current Is of the differential amplification portion are made the same value, and a role of the constant current source output MOS transistor Mis is played by the constant current source level shift transistor Miss, it is only necessary that a voltage between each gate and source of the first and second source follower MOS transistors M3a and M3b becomes equal not to the voltage between the gate and source of the constant current source level shift transistor Miss but to the diode voltage of any of the diode-connected transistor block for constant current setting (Mis1 to Mis4 in FIG. 23), and the sum of the diode voltages of the remaining diode-connected transistors for constant current setting and the voltage between the gate and source of the constant current source level shift transistor Miss is equal to the sum of the diode voltages of the diode-connected transistor block for load (MLsa to ML3a or MLsb to ML3b in FIG. 23).

Also, it may be so configured that the voltage between the gate and source of the constant current source level shift transistor Miss is equal to the voltage between each gate and source of the first and second source follower MOS transistor M3a and M3b and the diode voltage sum of the diode-connected transistor block for constant current setting (Mis1 to Mis4 in FIG. 23) is equal to the diode voltage sum of the diode-connected transistor block for load (MLsa to ML3a or MLsb to ML3b in FIG. 23).

Figure 24:
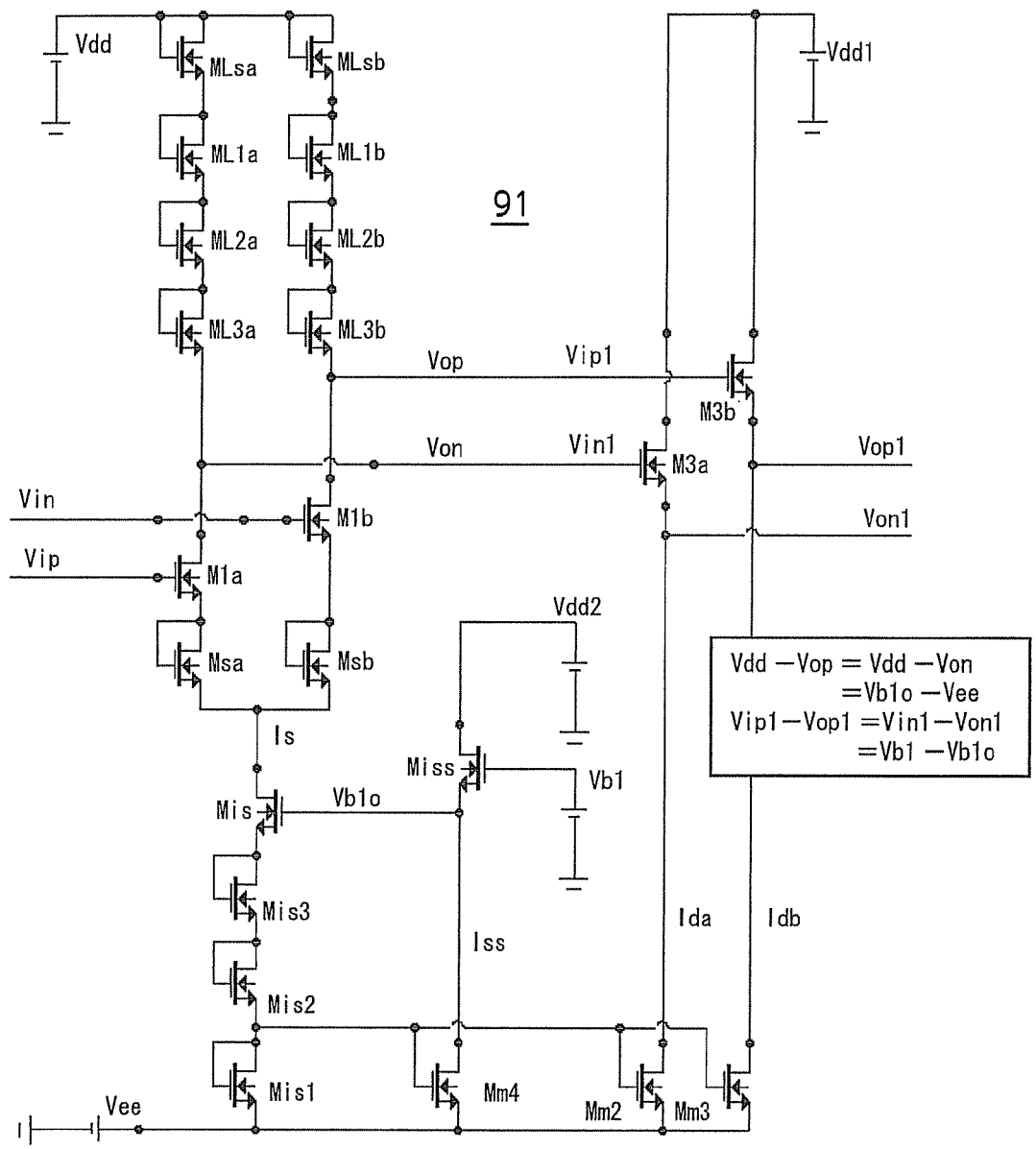
FIG. 24 is a circuit diagram illustrating a configuration of an amplifier circuit according to a fifteenth embodiment.

Also, for example, as an amplifier circuit 91 of a fifteenth embodiment shown in FIG. 24, it may be so configured to the contrary that from the constant current Is of a generating circuit of the absorbing constant current Is into the differential amplification portion, the constant current source level shift transistor bias constant current Iss and the source follower load constant currents Ida and Idb of the first and second source follower MOS transistors M3a and M3b may be generated using the current mirror circuit.

Moreover, if an output portion is not configured as a source follower output circuit but a full-wave rectifier circuit or peak-hold circuit with reset, since the source follower load current Ida of the first and second source follower MOS transistor M3a and M3b becomes a micro current, and the constant current Iss of the constant current source level shift MOS transistor miss also becomes a micro current. In this case, as in an amplifier circuit 92 of a sixteenth embodiment shown in FIG. 25, a second reference constant current generating circuit for generating a second reference constant current Isss in the middle of the relatively large absorbing constant current Is of the differential amplification portion and the constant current Iss of the constant current source level shift MOS transistor miss, which is a micro current, may be added so that using the current mirror circuit, from the second reference current Isss, the absorbing constant current Is of the differential amplification portion, the constant current Iss of the constant current source level shift MOS transistor Miss, and the source follower load current Ida of the first and second source follower MOS transistors M3a and M3b are generated.

Figure 25:
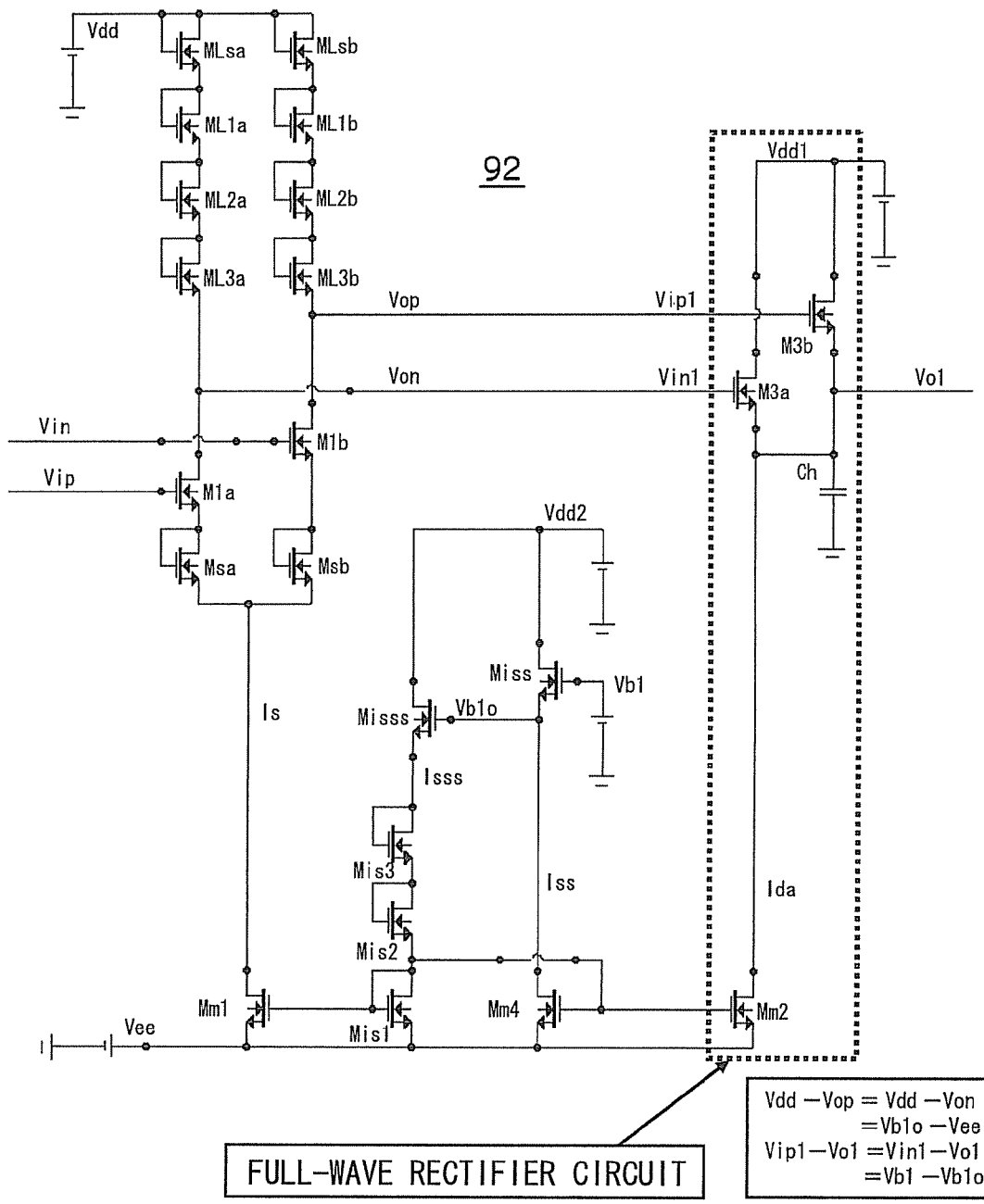
FIG. 25 is a circuit diagram illustrating a configuration of an amplifier circuit according to a sixteenth embodiment.
Figure 26:
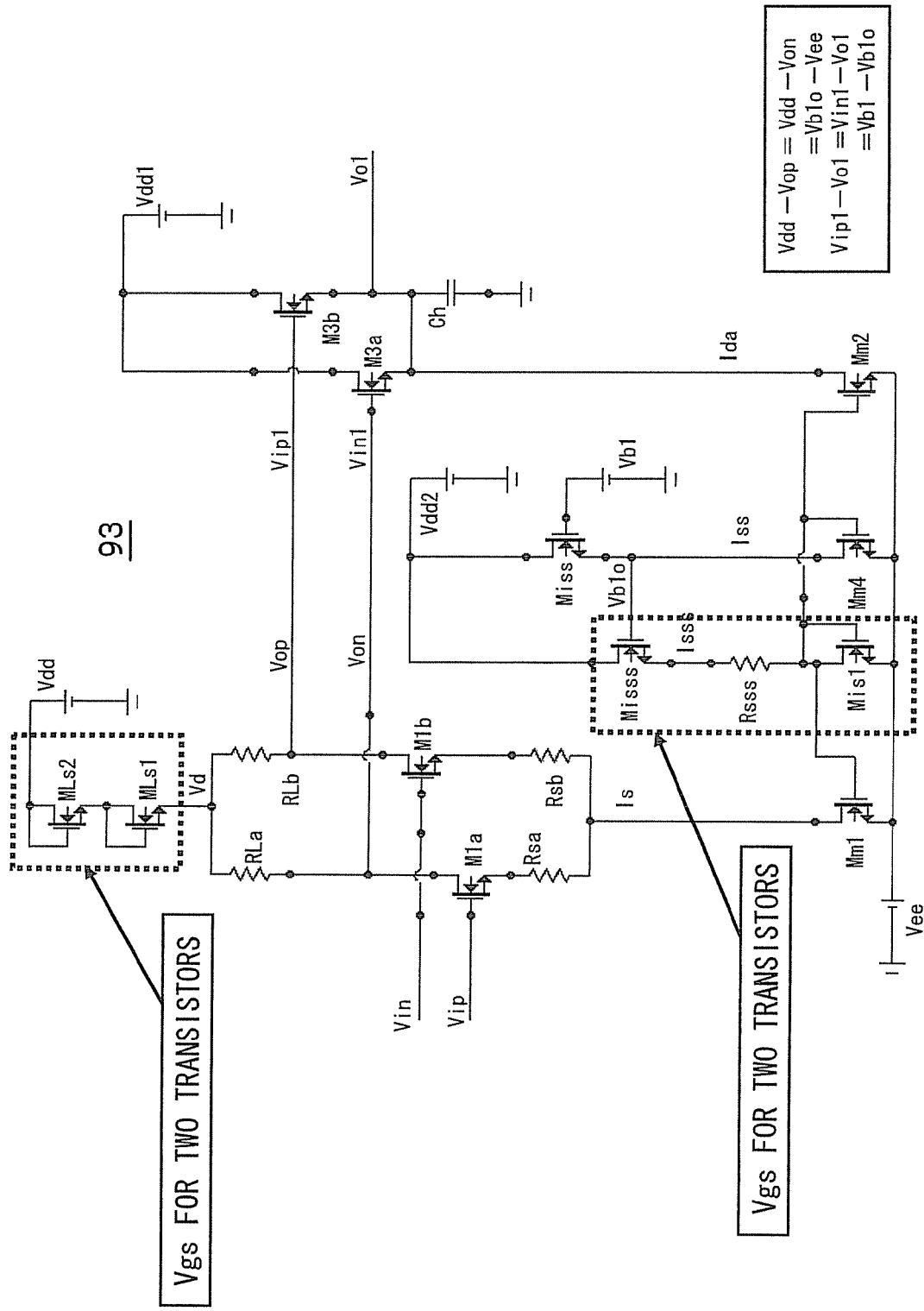
FIG. 26 is a circuit diagram illustrating a configuration of an amplifier circuit according to a seventeenth embodiment.

The idea of the amplification circuit 92 of the sixteenth embodiment shown in FIG. 25 can be also applied to a case in which a resistance and a MOS transistor are mixed as in the fourth to ninth embodiments, and FIG. 26 shows an amplifier circuit 93 of a seventeenth embodiment to which the idea is applied. In the amplifier circuit 93, the voltage drop of the second reference constant current setting resistance Rsss on the absorbing constant current source side of the differential amplifier circuit and the voltage drop of the resistances RLa and RLb on the load side are conformed to, and between the source potential Vb1o of the constant current source level shift MOS transistor Miss on the absorbing constant current source side of the differential amplifier circuit and the negative power supply Vee, two MOS transistors of a second constant current source level shift MOS transistor Misss and a current mirror current reference MOS transistor Mis1 are connected, and accordingly, two MOS transistors of the power supply level shift diode-connected MOS transistors on the load side MLs1 and MLs2 are connected.

In the condition 1 and the condition 2, the bias voltage between the drain and source of the corresponding transistor are also preferably conformed to.

(N-2) The signal source giving a signal to the amplifier circuit of the present invention is not limited to those in each of the above embodiments, either, but a signal source as exemplified below may be applied. For example, when a signal picked up by the sensor electrode on the above-mentioned sensor substrate is supplied to the amplifier circuit of the present invention, it may be configured such that the signal can be regarded as a signal from the signal source whose equivalent circuit is shown below and supplied to the amplifier circuit of the present invention.

Figure 27:
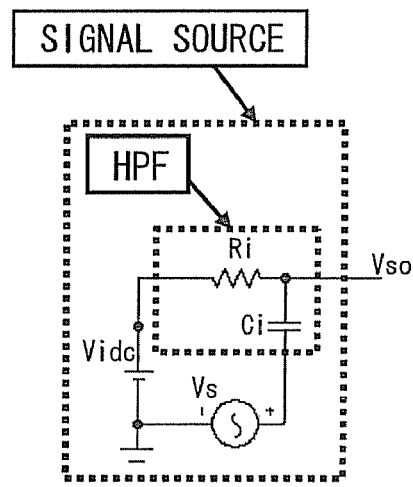
FIG. 27 is a circuit diagram illustrating another configuration (1) of a signal source.

A signal source shown in FIG. 27 is configured such that the input direct current bias power supply Vidc having an input bias resistance Ri connected to the output and the input alternating current signal source Vs having an input DC decoupling capacity Ci connected to the output are connected in parallel between the ground and the signal source output Vso. A high-pass filter is configured by the resistance Ri and the capacity Ci.

Figure 28:
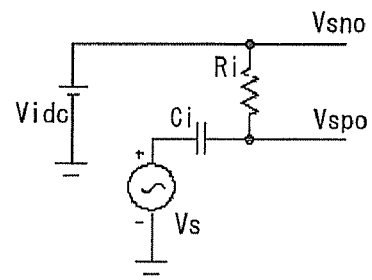
FIG. 28 is a circuit diagram illustrating another configuration (2) of the signal source.

A signal source shown in FIG. 28 is an unbalanced-type differential signal source having an output of the signal source shown in FIG. 27 as a positive output Vspo and an output of the input direct current bias power supply Vidc as a negative output Vsno of the signal source.

Figure 29:
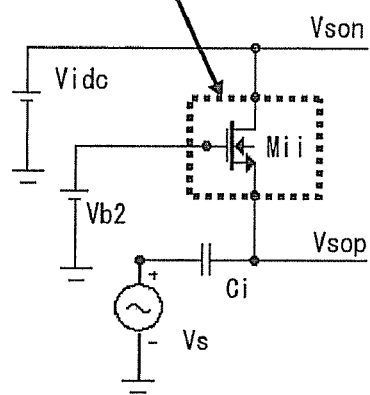
FIG. 29 is a circuit diagram illustrating another configuration (3) of the signal source.
Figure 30:
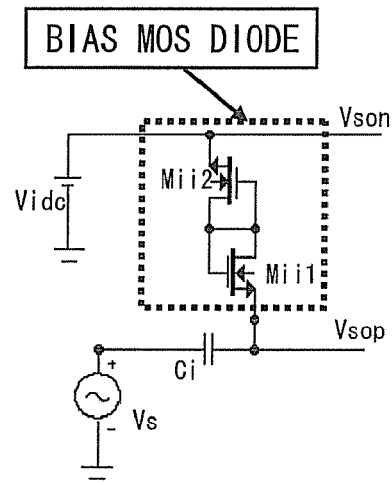
FIG. 30 is a circuit diagram illustrating another configuration (4) of the signal source.
Figure 31:
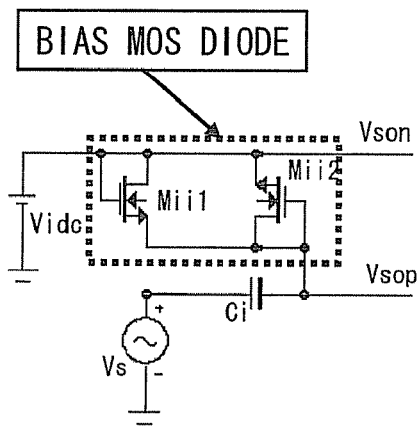
FIG. 31 is a circuit diagram illustrating another configuration (5) of the signal source.
Figure 32:
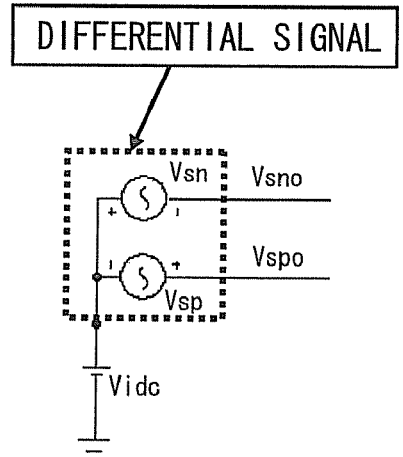
FIG. 32 is a circuit diagram illustrating another configuration (6) of the signal source.
Figure 33:
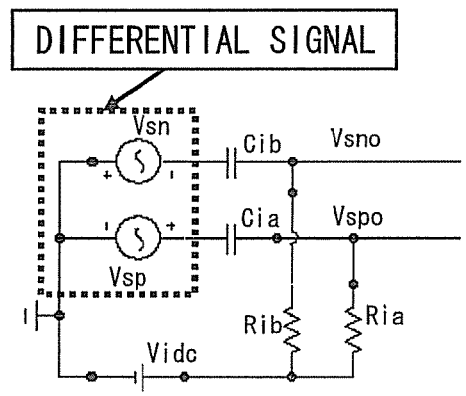
FIG. 33 is a circuit diagram illustrating another configuration (7) of the signal source.
Figure 34:
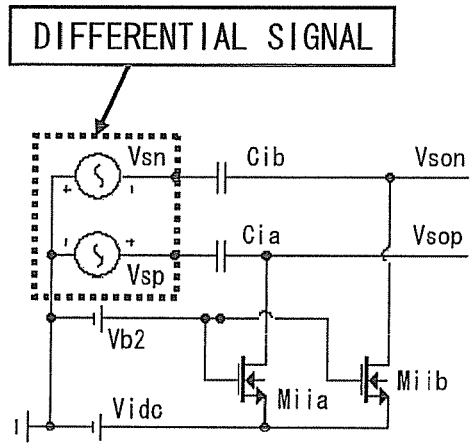
FIG. 34 is a circuit diagram illustrating another configuration (8) of the signal source.
Figure 35:
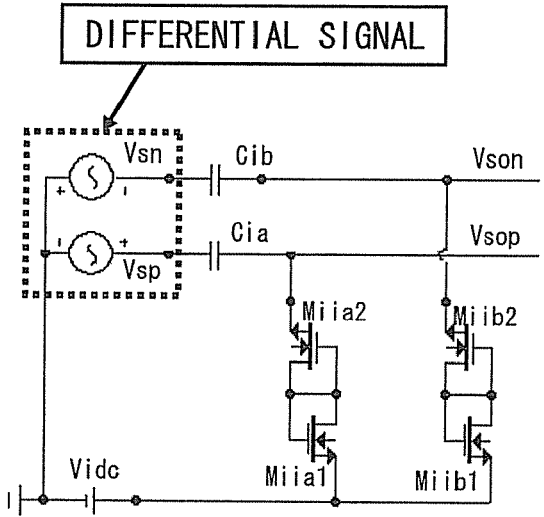
FIG. 35 is a circuit diagram illustrating another configuration (9) of the signal source.
Figure 36:
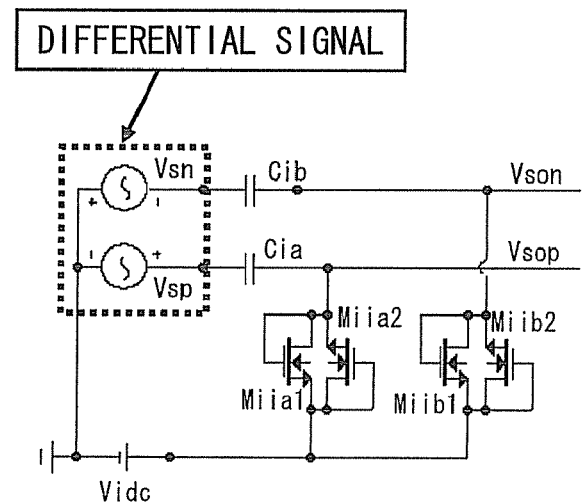
FIG. 36 is a circuit diagram illustrating another configuration (10) of the signal source.

The input bias resistance Ri in the signal source shown in FIGS. 27 and 28 may be a diode-connected MOS transistor for input bias MOS resistance or input bias resistance. FIG. 29 shows a case in which the input bias resistance Ri of the signal source shown in FIG. 28 is replaced by the input bias MOS resistance. FIG. 30 is a case in which the input bias resistance Ri of the signal source shown in FIG. 28 is configured as a series circuit of the diode-connected MOS transistor for input bias resistance, and FIG. 31 is a case in which the input bias resistance Ri of the signal source shown in FIG. 28 is configured as a parallel circuit of the diode-connected MOS transistor for input bias resistance.

The amplifier circuit in each of the above embodiments having the differential amplification portion is shown as the one that amplifies a signal from an unbalanced-type differential signal source in which an alternating current signal source is a one-phase signal, but application may be made such that a signal from a balanced-type differential signal source in which an alternating current signal source has positive-phase output and a negative-phase output is amplified.

FIGS. 32 to 36 show a configuration of balanced-type differential signal sources corresponding to the above-mentioned various unbalanced-type differential signal sources.

(N-3) Each of the above embodiments was described as a current mirror circuit, but it is needless to say that a current mirror circuit of another configuration may be applied.

Figure 37:
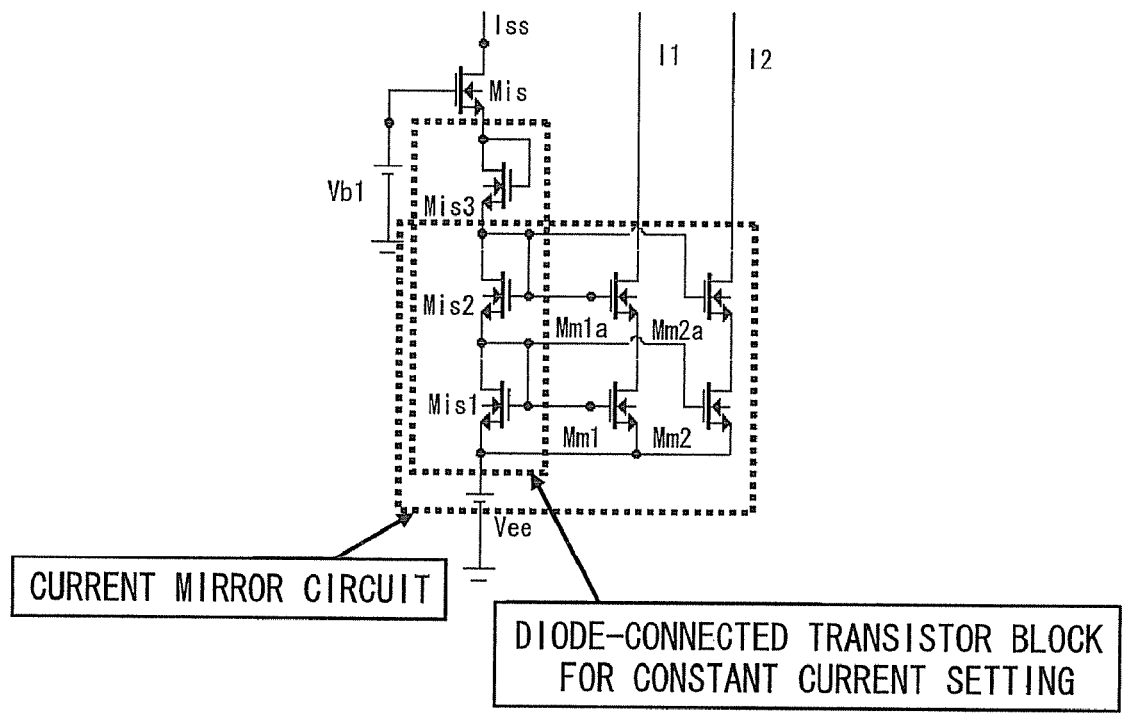
FIG. 37 is a circuit diagram illustrating another configuration of a current mirror circuit.

For example, the one with a configuration as shown in FIG. 37 may be applied. FIG. 37 is a current mirror circuit obtained by adding the cascode connection MOS transistors Mis2, Mm1a and Mm2a to a current mirror circuit in which between a source of the constant current source output MOS transistor Mis and the negative power supply Vee, the diode-connected transistor block for constant current setting constituted by a plurality of MOS transistors Mis1 to Mis3 (not limited to three pieces) made into a diode by connecting the drain and the gate is connected, the generated constant current Iss is made to flow through the current mirror current reference transistor Mis1 made into a diode by connecting the gate and the drain, and which is constituted by the current mirror current output MOS transistors Mm1 to Mm2 connecting a gate to a gate of the current mirror current reference transistor Mis1 and connecting a source to a source of the current mirror current reference transistor Mis1 so as to output a constant current from a drain, and not limited to these configurations.

Figure 38:
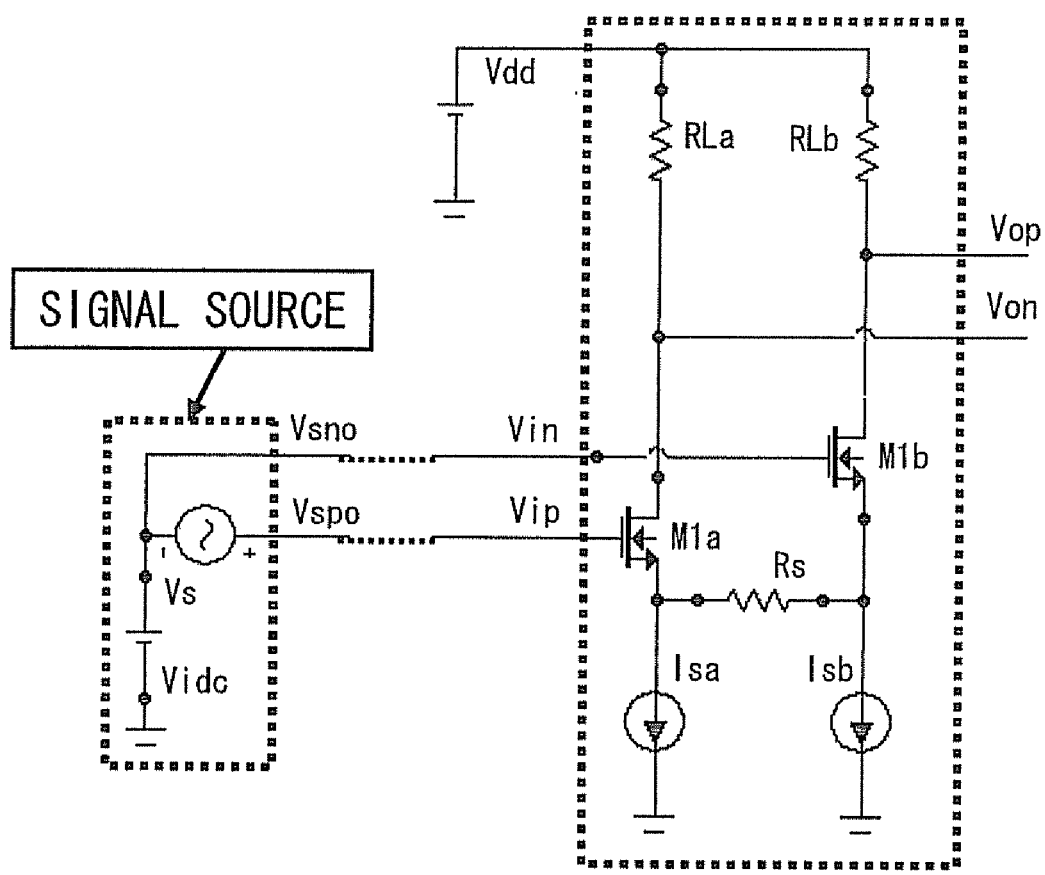
FIG. 38 is a circuit diagram illustrating another configuration of an absorbing constant current source.
Figure 39:
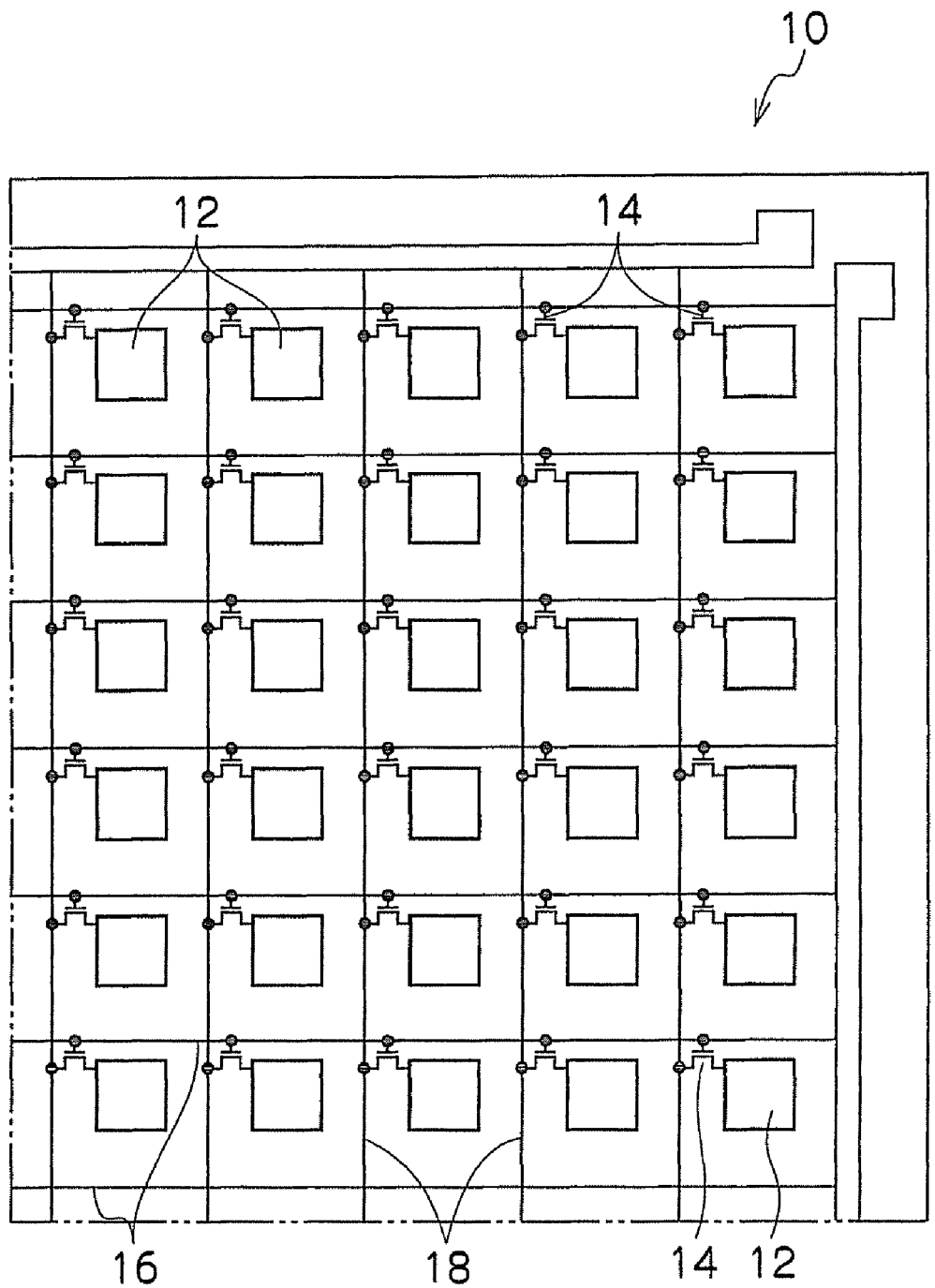
FIG. 39 is an explanatory diagram of a substrate for display.

(N-4) Each of the above embodiments was shown as the one in which there is only one absorbing constant current source absorbing the constant current from the first and second differential amplifier MOS transistors M1a and M1b side, but it may have two constant current sources as shown in FIG. 38.

In FIG. 38, the source resistance Rs corresponding to a value of the sum of the conventional first and second source resistances for negative feedback Rsa and Rsa is connected between the sources of the first and second differential amplifier MOS transistors M1a and M1b, and a single absorbing current source is divided into two part, each of which is made first and second absorbing constant current sources Isa and Isb through which an absorbing constant current of a half of the conventional constant current value Is flows and connected to each source of the first and second differential amplifier MOS transistors M1a and M1b, respectively.

If the two-stage product configuration as shown in FIG. 38 is applied, the above-mentioned condition 1 and the condition 2 need to be satisfied too.

The absorbing constant current source shown in each of the above embodiments may be replaced by an absorbing constant current source shown in other embodiments if replaceable.

As a circuit performing an operation approximate to the absorbing constant current source, there is a circuit in which a high resistance is connected between connection ends of the first and second source resistance for negative feedback Rsa and Rsb and the negative power supply Vee, and it may be also applied.

(N-5) Various power supplies in the amplifier circuit in each of the above embodiments, any of them may be an 0V (ground-connected), and if they have the same voltage, they may share a single power supply.

(N-6) It is so configured that the PN polarity of each MOS transistor in the amplifier circuit of each of the above embodiments may be reversed so that they operate similarly even if a power-supply voltage relation is reversed.

(N-7) To the configurations of various embodiments not including the first and second cascode connection transistors M2a and Msb, the high frequency compensation capacity Cp or the high frequency cut capacity CL, the first and second cascode connection transistors M2a and Msb, the high frequency compensation capacity Cp or the high frequency cut capacity CL may be added.

(N-8) To the amplifier circuit of each of the above embodiments having two outputs of the positive phase and the negative phase, either of Vop terminal or the Von terminal or either of the Vop11 or the Von1 terminal may be deleted so as to have a one-phase output.

In this case, the element on the unnecessary side such as the first or second diode-connected transistor block for load or either of the two source follower circuit portions in the source follower circuit may be omitted.

With the one-phase output, the number of circuit elements is reduced, and a chip area can be made small when being made into IC.

(N-9) By omitting either of the first and second source follower MOS transistors M3a and M3b of the full-wave rectifier circuit or the peak-hold circuit with reset in each of the above embodiments, an amplifier circuit may be obtained to which a half-wave rectifier circuit or a half-wave peak-hold circuit with reset is added.

(N-10) Other than those described above, the technical idea of each of the above embodiments may be combined for application if they can be combined.

(N-11) In each of the above embodiments, the case using a MOS-type field effect transistor (FET) as a transistor was shown, but other unipolar transistors such as MES-type or MIS-type field effect transistor may be used.

(N-12) In the above description, the case in which the amplifier circuit of the present invention is applied to a sensor circuit on a sensor substrate used in an inspection of a substrate for display was shown, but the applications of the amplifier circuit of the present invention are not limited to that.

What is claimed is:

1. An amplifier circuit comprising
an amplifier unipolar transistor having a gate as an input terminal of the amplifier circuit;
a diode-connected transistor block for negative feedback source impedance constituted by series-parallel connection of the limited number (including 0 piece) of the diode-connected unipolar transistors for connecting a gate and a drain so as to make between the drain and source into a diode and connected to the source side of the amplifier unipolar transistor;
a diode-connected transistor block for load constituted by the series-parallel connection of the limited number of the diode-connected unipolar transistors connecting a gate and a drain so as to make between the drain and source into a diode and connected to the drain side of the amplifier unipolar transistor; and
a voltage output terminal connected to a drain-side end of the amplifier unipolar transistor of the diode-connected transistor block for load, wherein
a voltage gain is determined by a ratio of impedance of the sum of source impedance of the amplifier unipolar transistor and the impedance of the diode-connected transistor block for negative feedback source impedance to the impedance of the diode-connected transistor block for load.

2. The amplifier circuit according to claim 1, wherein
the diode-connected transistor block for negative feedback source impedance is connected between a source of the amplifier unipolar transistor and a first second polar power supply, which is one of a positive power supply or a negative power supply;
the diode-connected transistor block for load is connected between a drain of the amplifier unipolar transistor and a first first polar power supply, which is the other of the positive power supply or the negative power supply; and
a drain connection end of the amplifier unipolar transistor in the diode-connected transistor block for load is made a voltage output terminal.

3. The amplifier circuit according to claim 1, further comprising
a current mirror circuit for connecting a common terminal to a first polar power supply, which is one of a positive power supply or a negative power supply, wherein
a drain of the amplifier unipolar transistor is connected to an input of the current mirror circuit;
the diode-connected transistor block for load is connected between an output of the current mirror circuit and a second polar power supply, which is the other of the positive power supply or the negative power supply; and
the current mirror circuit connection end of the diode-connected transistor block for load is made a voltage output terminal.

4. The amplifier circuit according to claim 1, further comprising
a cascode connection unipolar transistor for connecting a gate to a cascode gate bias power supply, wherein
the voltage output terminal is connected to a drain of the cascode connection unipolar transistor and a source of the cascode connection unipolar transistor is connected to the drain of the amplifier unipolar transistor.

5. The amplifier circuit according to claim 1, wherein
a high frequency compensation capacity (including capacity 0) is connected between a terminal of any of the diode-connected transistor in the diode-connected transistor block for negative feedback source impedance and a ground; and
a high frequency cut capacity (including capacity 0) is connected between a terminal of any of the diode-connected transistor in the diode-connected transistor block for load and the ground.

6. The amplifier circuit according to claim 1, wherein
a source follower/rectifier circuit functioning as a source follower circuit and a rectifier circuit is connected to the voltage output terminal.

7. The amplifier circuit according to claim 1, wherein
a peak-hold circuit with reset is connected to the voltage output terminal.

* * * * *